(12) United States Patent
Costantino et al.

(10) Patent No.: US 11,611,070 B2
(45) Date of Patent: *Mar. 21, 2023

(54) HIGHLY EFFICIENT MANUFACTURING OF SILICON-CARBON COMPOSITES MATERIALS COMPRISING ULTRA LOW Z

(71) Applicant: Group14 Technologies, Inc., Woodinville, WA (US)

(72) Inventors: Henry R. Costantino, Woodinville, WA (US); Abirami Dhanabalan, Bothell, WA (US); Avery J. Sakshaug, Snohomish, WA (US); Christopher Timmons, Monroe, WA (US); Rajankumar Patel, Pasco, WA (US)

(73) Assignee: GROUP14 TECHNOLOGIES, INC., Woodinville, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/715,840

(22) Filed: Apr. 7, 2022

(65) Prior Publication Data

US 2022/0246914 A1 Aug. 4, 2022

Related U.S. Application Data

(63) Continuation of application No. 17/405,870, filed on Aug. 18, 2021, now Pat. No. 11,335,903, which is a
(Continued)

(51) Int. Cl.
*H01M 4/36* (2006.01)
*H01M 4/38* (2006.01)
(Continued)

(52) U.S. Cl.
CPC ............ *H01M 4/364* (2013.01); *C23C 16/24* (2013.01); *H01M 4/386* (2013.01); *H01M 4/587* (2013.01);
(Continued)

(58) Field of Classification Search
None
See application file for complete search history.

(56) References Cited

U.S. PATENT DOCUMENTS 3,518,123 A 6/1970 Katsoulis et al.
3,582,288 A 6/1971 Taylor et al.
(Continued)

FOREIGN PATENT DOCUMENTS

CA 2176452 A1 11/1997
CN 1762900 A 4/2006
(Continued)

OTHER PUBLICATIONS

"A Basic Guide to Particle Characterization," Malvern Instruments Worldwide—White Paper, Retrieved from the Internet: URL:http://golik.co.il/Data/ABasicGuidtoParticleCharacterization(2)1962085150.pdf, XP55089322A, 2012, (26 Pages).
(Continued)

*Primary Examiner* — Guinever S Gregorio
(74) *Attorney, Agent, or Firm* — Seed IP Law Group LLP

(57) ABSTRACT

Silicon-carbon composite materials and related processes are disclosed that overcome the challenges for providing amorphous nano-sized silicon entrained within porous carbon. Compared to other, inferior materials and processes described in the prior art, the materials and processes disclosed herein find superior utility in various applications, including energy storage devices such as lithium ion batteries.

33 Claims, 8 Drawing Sheets

Relationship between Z and average Coulombic efficiency for various silicon-carbon composite materials.

Data for Various Silicon-Carbon Composite Materials

Related U.S. Application Data continuation-in-part of application No. 16/996,694, filed on Aug. 18, 2020, now Pat. No. 11,174,167.

(60) Provisional application No. 63/078,806, filed on Sep. 15, 2020, provisional application No. 63/075,566, filed on Sep. 8, 2020.

(51) Int. Cl.
  *H01M 4/587* (2010.01)
  *C23C 16/24* (2006.01)
  *H01M 10/0525* (2010.01)
  *H01M 4/02* (2006.01)

(52) U.S. Cl.
  CPC .. *H01M 10/0525* (2013.01); *H01M 2004/021* (2013.01); *H01M 2004/027* (2013.01)

(56) References Cited

U.S. PATENT DOCUMENTS

| | | |
|---|---|---|
| 3,619,428 A | 11/1971 | David |
| 3,876,505 A | 4/1975 | Stoneburner |
| 3,892,580 A | 7/1975 | Messing |
| 3,977,901 A | 8/1976 | Buzzelli |
| 4,082,694 A | 4/1978 | Wennerberg et al. |
| 4,159,913 A | 7/1979 | Birchall et al. |
| 4,198,382 A | 4/1980 | Matsui |
| 4,543,341 A | 9/1985 | Barringer et al. |
| 4,580,404 A | 4/1986 | Pez et al. |
| 4,769,197 A | 9/1988 | Kromrey |
| 4,843,015 A | 6/1989 | Grubbs, Jr. et al. |
| 4,862,328 A | 8/1989 | Morimoto et al. |
| 4,873,218 A | 10/1989 | Pekala |
| 4,954,469 A | 9/1990 | Robinson |
| 4,997,804 A | 3/1991 | Pekala |
| 4,999,330 A | 3/1991 | Bose et al. |
| 5,061,416 A | 10/1991 | Willkens et al. |
| 5,093,216 A | 3/1992 | Azuma et al. |
| 5,260,855 A | 11/1993 | Kaschmitter et al. |
| 5,294,498 A | 3/1994 | Omaru et al. |
| 5,416,056 A | 5/1995 | Baker |
| 5,420,168 A | 5/1995 | Mayer et al. |
| 5,465,603 A | 11/1995 | Anthony et al. |
| 5,508,341 A | 4/1996 | Mayer et al. |
| 5,529,971 A | 6/1996 | Kaschmitter et al. |
| 5,614,460 A | 3/1997 | Schwarz et al. |
| 5,626,637 A | 5/1997 | Baker |
| 5,626,977 A | 5/1997 | Mayer et al. |
| 5,670,571 A | 9/1997 | Gabrielson et al. |
| 5,674,642 A | 10/1997 | Le et al. |
| 5,710,092 A | 1/1998 | Baker |
| 5,726,118 A | 3/1998 | Ivey et al. |
| 5,744,258 A | 4/1998 | Bai et al. |
| 5,789,338 A | 8/1998 | Kaschmitter et al. |
| 5,834,138 A | 11/1998 | Yamada et al. |
| 5,858,486 A | 1/1999 | Metter et al. |
| 5,882,621 A | 3/1999 | Doddapaneni et al. |
| 5,891,822 A | 4/1999 | Oyama et al. |
| 5,908,896 A | 6/1999 | Mayer et al. |
| 5,945,084 A | 8/1999 | Droege |
| 5,965,483 A | 10/1999 | Baker et al. |
| 6,006,797 A | 12/1999 | Bülow et al. |
| 6,064,560 A | 5/2000 | Hirahara et al. |
| 6,069,107 A | 5/2000 | Kuznetsov et al. |
| 6,072,693 A | 6/2000 | Tsushima et al. |
| 6,096,456 A | 8/2000 | Takeuchi et al. |
| 6,117,585 A | 9/2000 | Anani et al. |
| 6,147,213 A | 11/2000 | Poli et al. |
| 6,153,562 A | 11/2000 | Villar et al. |
| 6,205,016 B1 | 3/2001 | Niu |
| 6,225,257 B1 | 5/2001 | Putyera et al. |
| 6,242,127 B1 | 6/2001 | Paik et al. |
| 6,268,081 B1 | 7/2001 | Clough |
| 6,309,446 B1 | 10/2001 | Nakanoya et al. |
| 6,310,762 B1 | 10/2001 | Okamura et al. |
| 6,339,528 B1 | 1/2002 | Lee et al. |
| 6,509,119 B1 | 1/2003 | Kobayashi et al. |
| 6,574,092 B2 | 6/2003 | Sato et al. |
| 6,592,838 B1 | 7/2003 | Nomoto et al. |
| 6,631,072 B1 | 10/2003 | Paul et al. |
| 6,631,073 B1 | 10/2003 | Sakata et al. |
| 6,697,249 B2 | 2/2004 | Maletin et al. |
| 6,764,667 B1 | 7/2004 | Steiner, III |
| 6,815,105 B2 | 11/2004 | Cooper et al. |
| 6,865,068 B1 | 3/2005 | Murakami et al. |
| 7,245,478 B2 | 7/2007 | Zhong et al. |
| 7,419,649 B2 | 9/2008 | Lundquist et al. |
| 7,582,902 B2 | 9/2009 | Tano et al. |
| 7,626,804 B2 | 12/2009 | Yoshio et al. |
| 7,722,991 B2 | 5/2010 | Zhang et al. |
| 7,723,262 B2 | 5/2010 | Feaver et al. |
| 7,754,178 B2 | 7/2010 | Tano et al. |
| 7,785,495 B2 | 8/2010 | Kikuchi et al. |
| 7,816,413 B2 | 10/2010 | Feaver et al. |
| 7,835,136 B2 | 11/2010 | Feaver et al. |
| 8,158,556 B2 | 4/2012 | Feaver et al. |
| 8,293,818 B2 | 10/2012 | Costantino et al. |
| 8,329,252 B2 | 12/2012 | Markavov et al. |
| 8,361,659 B2 | 1/2013 | Richard |
| 8,366,979 B2 | 2/2013 | Dai et al. |
| 8,404,384 B2 | 3/2013 | Feaver et al. |
| 8,411,415 B2 | 4/2013 | Yoshinaga et al. |
| 8,467,170 B2 | 6/2013 | Feaver et al. |
| 8,480,930 B2 | 7/2013 | Suh et al. |
| 8,482,900 B2 | 7/2013 | Gadkaree et al. |
| 8,580,870 B2 | 11/2013 | Costantino et al. |
| 8,654,507 B2 | 2/2014 | Costantino et al. |
| 8,691,177 B2 | 4/2014 | Pfeifer et al. |
| 8,709,971 B2 | 4/2014 | Feaver et al. |
| 8,734,991 B2 | 5/2014 | Takano et al. |
| 8,797,717 B2 | 8/2014 | Feaver et al. |
| 8,906,978 B2 | 12/2014 | Costantino et al. |
| 8,916,296 B2 | 12/2014 | Feaver et al. |
| 8,999,202 B2 | 4/2015 | Mulik et al. |
| 9,005,812 B2 | 4/2015 | Ma et al. |
| 9,067,848 B2 | 6/2015 | Stadie et al. |
| 9,112,230 B2 | 8/2015 | Feaver et al. |
| 9,133,295 B2 | 9/2015 | Qureshi et al. |
| 9,133,337 B2 | 9/2015 | Ludvik et al. |
| 9,136,064 B2 | 9/2015 | Gadkaree et al. |
| 9,186,174 B2 | 11/2015 | Krishnan |
| 9,269,502 B2 | 2/2016 | Chang et al. |
| 9,287,556 B2 | 3/2016 | Neumann et al. |
| 9,409,777 B2 | 8/2016 | Geramita et al. |
| 9,412,523 B2 | 8/2016 | Costantino et al. |
| 9,464,162 B2 | 10/2016 | Kron et al. |
| 9,580,321 B2 | 2/2017 | Feaver et al. |
| 9,666,860 B2 | 5/2017 | Lam et al. |
| 9,680,159 B2 | 6/2017 | Feaver et al. |
| 9,704,685 B2 | 7/2017 | Lozano et al. |
| 9,714,172 B2 | 7/2017 | Geramita et al. |
| 9,985,289 B2 | 5/2018 | Costantino et al. |
| 10,008,338 B2 | 6/2018 | Stadermann et al. |
| 10,049,824 B2 | 8/2018 | Tsukada et al. |
| 10,141,122 B2 | 11/2018 | Feaver et al. |
| 10,147,950 B2 | 12/2018 | Sakshaug et al. |
| 10,173,900 B2 | 1/2019 | Ludvik et al. |
| 10,195,583 B2 | 2/2019 | Costantino et al. |
| 10,273,328 B2 | 4/2019 | Kron et al. |
| 10,287,170 B2 | 5/2019 | Feaver et al. |
| 10,361,428 B2 | 7/2019 | Kim et al. |
| 10,454,094 B2 | 10/2019 | Xia et al. |
| 10,454,103 B2 | 10/2019 | Sakshaug et al. |
| 10,490,358 B2 | 11/2019 | Feaver et al. |
| 10,508,335 B1 | 12/2019 | Yilmaz et al. |
| 10,522,836 B2 | 12/2019 | Thompkins et al. |
| 10,590,277 B2 | 3/2020 | Costantino et al. |
| 10,600,581 B2 | 3/2020 | Feaver et al. |
| 10,608,254 B2 | 3/2020 | Sakshaug et al. |
| 10,658,659 B1 | 5/2020 | Mason et al. |
| 10,711,140 B2 | 7/2020 | Costantino et al. |
| 10,714,744 B2 | 7/2020 | Sakshaug et al. |
| 10,756,347 B2 | 8/2020 | Sakshaug et al. |

(56) References Cited

U.S. PATENT DOCUMENTS

| | | |
|---|---|---|
| 10,763,501 B2 | 9/2020 | Feaver et al. |
| 10,784,512 B2 | 9/2020 | Sakshaug et al. |
| 10,814,304 B2 | 10/2020 | Costantino et al. |
| 10,923,722 B2 | 2/2021 | Sakshaug et al. |
| 10,938,027 B2 | 3/2021 | Mason et al. |
| 10,964,940 B1 | 3/2021 | Mason et al. |
| 11,011,748 B2 | 5/2021 | Mason et al. |
| 11,165,054 B2 | 11/2021 | Mason et al. |
| 11,174,167 B1 | 11/2021 | Dhanabalan et al. |
| 11,335,903 B2 | 5/2022 | Costantino et al. |
| 11,401,363 B2 | 8/2022 | Geramita et al. |
| 11,437,621 B2 | 9/2022 | Sakshaug et al. |
| 2001/0002086 A1 | 5/2001 | Webb |
| 2002/0031706 A1 | 3/2002 | Dasgupta et al. |
| 2002/0031710 A1 | 3/2002 | Kezuka et al. |
| 2002/0036885 A1 | 3/2002 | Lee et al. |
| 2002/0075627 A1 | 6/2002 | Shinozaki et al. |
| 2002/0104474 A1 | 8/2002 | Wakamatsu et al. |
| 2002/0114126 A1 | 8/2002 | Hirahara et al. |
| 2002/0122985 A1 | 9/2002 | Sato et al. |
| 2002/0168314 A1 | 11/2002 | Roemmler |
| 2002/0172637 A1 | 11/2002 | Chesneau et al. |
| 2003/0012722 A1 | 1/2003 | Liu |
| 2003/0013606 A1 | 1/2003 | Hampden-Smith et al. |
| 2003/0013804 A1 | 1/2003 | Phillips et al. |
| 2003/0064564 A1 | 4/2003 | Lin |
| 2003/0108785 A1 | 6/2003 | Wu et al. |
| 2003/0170548 A1 | 9/2003 | Otsuki et al. |
| 2004/0010090 A1 | 1/2004 | Chino et al. |
| 2004/0106040 A1 | 6/2004 | Fukuoka et al. |
| 2004/0132845 A1 | 7/2004 | Rhine et al. |
| 2004/0141963 A1 | 7/2004 | Umekawa |
| 2004/0180264 A1 | 9/2004 | Honbo et al. |
| 2004/0182711 A1 | 9/2004 | Liang et al. |
| 2004/0201567 A1 | 10/2004 | Yu et al. |
| 2004/0241237 A1 | 12/2004 | Pirard et al. |
| 2004/0248730 A1 | 12/2004 | Kim et al. |
| 2004/0248790 A1 | 12/2004 | Hinuma et al. |
| 2005/0014643 A1 | 1/2005 | Lini et al. |
| 2005/0041370 A1 | 2/2005 | Wilk et al. |
| 2005/0058589 A1 | 3/2005 | Lundquist et al. |
| 2005/0058907 A1 | 3/2005 | Kurihara et al. |
| 2005/0079349 A1 | 4/2005 | Hampden-Smith et al. |
| 2005/0079359 A1 | 4/2005 | Fujita et al. |
| 2005/0135993 A1 | 6/2005 | Xu et al. |
| 2005/0153130 A1 | 7/2005 | Long et al. |
| 2005/0196336 A1 | 9/2005 | Chatterjee et al. |
| 2005/0221981 A1 | 10/2005 | Wagh et al. |
| 2005/0233195 A1 | 10/2005 | Arnold et al. |
| 2005/0250011 A1 | 11/2005 | Mitchell et al. |
| 2005/0253220 A1 | 11/2005 | Lin et al. |
| 2005/0266990 A1 | 12/2005 | Iwasaki et al. |
| 2005/0282062 A1 | 12/2005 | Manako et al. |
| 2006/0008408 A1 | 1/2006 | Ho Yoon et al. |
| 2006/0057355 A1 | 3/2006 | Suzuki et al. |
| 2006/0078682 A1 | 4/2006 | McDaniel et al. |
| 2006/0079587 A1 | 4/2006 | Albert et al. |
| 2006/0093915 A1 | 5/2006 | Lundquist et al. |
| 2006/0223965 A1 | 10/2006 | Trifu |
| 2006/0240979 A1 | 10/2006 | Hirahara et al. |
| 2007/0002523 A1 | 1/2007 | Ando |
| 2007/0008677 A1 | 1/2007 | Zhong et al. |
| 2007/0048605 A1 | 3/2007 | Pez et al. |
| 2007/0104981 A1 | 5/2007 | Lam et al. |
| 2007/0142222 A1 | 6/2007 | Erkey et al. |
| 2007/0166602 A1 | 7/2007 | Burchardt |
| 2008/0011986 A1 | 1/2008 | Yamakawa et al. |
| 2008/0044726 A1 | 2/2008 | Feng et al. |
| 2008/0107804 A1 | 5/2008 | Kondo |
| 2008/0112876 A1 | 5/2008 | Dailey |
| 2008/0132632 A1 | 6/2008 | Schiraldi et al. |
| 2008/0145757 A1 | 6/2008 | Mah et al. |
| 2008/0145761 A1 | 6/2008 | Petrat et al. |
| 2008/0201925 A1 | 8/2008 | Zhong et al. |
| 2008/0204973 A1 | 8/2008 | Zhong et al. |
| 2008/0206638 A1 | 8/2008 | Takahashi et al. |
| 2008/0241640 A1 | 10/2008 | Rajeshwar et al. |
| 2008/0268297 A1 | 10/2008 | Quayle et al. |
| 2008/0293911 A1 | 11/2008 | Qureshi et al. |
| 2008/0297981 A1 | 12/2008 | Endo et al. |
| 2008/0299456 A1 | 12/2008 | Shiga et al. |
| 2009/0035344 A1 | 2/2009 | Thomas et al. |
| 2009/0053594 A1 | 2/2009 | Johnson et al. |
| 2009/0097189 A1 | 4/2009 | Tasaki et al. |
| 2009/0104509 A1 | 4/2009 | Kwak et al. |
| 2009/0104530 A1 | 4/2009 | Shizuka et al. |
| 2009/0114544 A1 | 5/2009 | Rousseau et al. |
| 2009/0117466 A1 | 5/2009 | Zhamu et al. |
| 2009/0145482 A1 | 6/2009 | Mitzi et al. |
| 2009/0185327 A1 | 7/2009 | Seymour |
| 2009/0213529 A1 | 8/2009 | Gogotsi et al. |
| 2009/0253248 A1 | 10/2009 | Sun et al. |
| 2009/0286160 A1 | 11/2009 | Kozono et al. |
| 2009/0305131 A1 | 12/2009 | Kumar et al. |
| 2010/0008021 A1 | 1/2010 | Hu et al. |
| 2010/0047671 A1 | 2/2010 | Chiang et al. |
| 2010/0051881 A1 | 3/2010 | Ahn et al. |
| 2010/0092370 A1 | 4/2010 | Zhang et al. |
| 2010/0097741 A1 | 4/2010 | Zhong et al. |
| 2010/0098615 A1 | 4/2010 | Tennison et al. |
| 2010/0110613 A1 | 5/2010 | Zhong et al. |
| 2010/0163791 A1 | 7/2010 | Fukui et al. |
| 2010/0215563 A1 | 8/2010 | Yambayashi |
| 2010/0279172 A1 | 11/2010 | Hwang et al. |
| 2010/0288970 A1 | 11/2010 | Watanabe et al. |
| 2010/0310941 A1 | 12/2010 | Kumta et al. |
| 2010/0316907 A1 | 12/2010 | Yamamoto et al. |
| 2011/0053765 A1 | 3/2011 | Feaver et al. |
| 2011/0111284 A1 | 5/2011 | Maeshima et al. |
| 2011/0159375 A1 | 6/2011 | Feaver et al. |
| 2011/0177393 A1 | 7/2011 | Park et al. |
| 2011/0200848 A1 | 8/2011 | Chiang et al. |
| 2011/0261501 A1 | 10/2011 | Gadkaree et al. |
| 2011/0281180 A1 | 11/2011 | Kim et al. |
| 2011/0287189 A1 | 11/2011 | Shembel |
| 2011/0300447 A1 | 12/2011 | Archer |
| 2011/0311873 A1 | 12/2011 | Schultz et al. |
| 2012/0045685 A1 | 2/2012 | Seki et al. |
| 2012/0129049 A1 | 5/2012 | Rayner |
| 2012/0156493 A1 | 6/2012 | Maisels et al. |
| 2012/0156567 A1 | 6/2012 | Ayme-Perrot et al. |
| 2012/0183856 A1 | 7/2012 | Cui et al. |
| 2012/0241691 A1 | 9/2012 | Soneda et al. |
| 2012/0251876 A1 | 10/2012 | Jagannathan |
| 2012/0262127 A1 | 10/2012 | Feaver et al. |
| 2012/0264020 A1 | 10/2012 | Burton et al. |
| 2012/0305651 A1 | 12/2012 | Anderson et al. |
| 2012/0308870 A1 | 12/2012 | Okuda et al. |
| 2012/0321959 A1 | 12/2012 | Yushin et al. |
| 2013/0082213 A1 | 4/2013 | Duncan et al. |
| 2013/0169238 A1 | 7/2013 | Rojeski |
| 2013/0189472 A1 | 7/2013 | Takaoka |
| 2013/0189575 A1 | 7/2013 | Anguchamy et al. |
| 2013/0196158 A1 | 8/2013 | Yoshida et al. |
| 2013/0244862 A1 | 9/2013 | Ivanovici et al. |
| 2013/0252082 A1 | 9/2013 | Thompkins et al. |
| 2013/0295462 A1 | 11/2013 | Atanassova et al. |
| 2013/0337334 A1 | 12/2013 | Tao et al. |
| 2013/0344363 A1 | 12/2013 | Upadhyaya |
| 2013/0344391 A1 | 12/2013 | Yushin et al. |
| 2014/0038042 A1 | 2/2014 | Rios et al. |
| 2014/0057179 A1 | 2/2014 | Yushin et al. |
| 2014/0170482 A1 | 6/2014 | Park et al. |
| 2014/0272592 A1 | 9/2014 | Thompkins et al. |
| 2014/0287317 A1 | 9/2014 | Tiquet et al. |
| 2014/0302396 A1 | 10/2014 | Lu et al. |
| 2014/0335410 A1 | 11/2014 | Loveridge et al. |
| 2015/0037249 A1 | 2/2015 | Fu |
| 2015/0087731 A1 | 3/2015 | Dong et al. |
| 2015/0155546 A1 | 6/2015 | Yushin et al. |
| 2015/0162603 A1 | 6/2015 | Yushin et al. |
| 2015/0207148 A1 | 7/2015 | Kimura et al. |
| 2015/0238917 A1 | 8/2015 | Mulik et al. |
| 2015/0306570 A1 | 10/2015 | Mayes et al. |

(56) References Cited

U.S. PATENT DOCUMENTS

| | | |
|---|---|---|
| 2016/0010250 A1 | 1/2016 | Taninaka et al. |
| 2016/0039970 A1 | 2/2016 | Kron et al. |
| 2016/0043384 A1 | 2/2016 | Zhamu et al. |
| 2016/0104882 A1 | 4/2016 | Yushin et al. |
| 2016/0133394 A1 | 5/2016 | Sakshaug et al. |
| 2016/0344030 A1 | 11/2016 | Sakshaug et al. |
| 2016/0372750 A1 | 12/2016 | Chang et al. |
| 2017/0170477 A1* | 6/2017 | Sakshaug .............. H01M 4/366 |
| 2017/0316888 A1 | 11/2017 | Geramita et al. |
| 2018/0097240 A1 | 4/2018 | Feaver et al. |
| 2018/0294484 A1 | 10/2018 | Fredrick et al. |
| 2019/0088931 A1 | 3/2019 | Abrahamson et al. |
| 2019/0097222 A1 | 3/2019 | Feaver et al. |
| 2019/0103608 A1 | 4/2019 | Costantino et al. |
| 2019/0144287 A1 | 5/2019 | Park et al. |
| 2019/0259546 A1 | 8/2019 | Kron et al. |
| 2020/0020935 A1 | 1/2020 | Costantino et al. |
| 2020/0048098 A1 | 2/2020 | Feaver et al. |
| 2020/0144619 A1 | 5/2020 | Hamilton et al. |
| 2020/0259178 A1 | 8/2020 | Chang et al. |
| 2020/0259181 A1 | 8/2020 | Thompkins et al. |
| 2020/0280070 A1 | 9/2020 | Sakshaug et al. |
| 2020/0290882 A1 | 9/2020 | Fredrick et al. |
| 2020/0373561 A1 | 11/2020 | Mason et al. |
| 2021/0054213 A1 | 2/2021 | Costantino et al. |
| 2021/0057736 A1 | 2/2021 | Feaver et al. |
| 2021/0126251 A1 | 4/2021 | Sakshaug et al. |
| 2021/0175498 A1 | 6/2021 | Feaver et al. |
| 2021/0237029 A1 | 8/2021 | Costantino et al. |
| 2021/0276875 A1 | 9/2021 | Mason et al. |
| 2022/0055905 A1 | 2/2022 | Dhanabalan et al. |
| 2022/0055906 A1 | 2/2022 | Costantino et al. |
| 2022/0059818 A1 | 2/2022 | Dhanabalan et al. |
| 2022/0064008 A1 | 3/2022 | Dhanabalan et al. |
| 2022/0074045 A1 | 3/2022 | Yilmaz et al. |
| 2022/0246910 A1 | 8/2022 | Mason et al. |

FOREIGN PATENT DOCUMENTS

| | | |
|---|---|---|
| CN | 1877888 A | 12/2006 |
| CN | 1986401 A | 6/2007 |
| CN | 101284665 A | 10/2008 |
| CN | 101292389 A | 10/2008 |
| CN | 101318648 A | 12/2008 |
| CN | 101604743 A | 12/2009 |
| CN | 101292389 B | 9/2010 |
| CN | 101969120 A | 2/2011 |
| CN | 102214817 A | 10/2011 |
| CN | 102623680 A | 8/2012 |
| CN | 102820455 A | 12/2012 |
| CN | 103094528 A | 5/2013 |
| CN | 103456929 A | 12/2013 |
| CN | 103746098 A | 4/2014 |
| CN | 104108698 A | 10/2014 |
| CN | 102509781 B | 11/2015 |
| CN | 105680023 A | 6/2016 |
| CN | 106207108 A | 12/2016 |
| DE | 10 2014 211012 A1 | 12/2015 |
| EP | 0 126 191 A2 | 11/1984 |
| EP | 0 649 815 A1 | 4/1995 |
| EP | 0 861 804 A1 | 9/1998 |
| EP | 0 891 943 A1 | 1/1999 |
| EP | 1 049 116 A1 | 11/2000 |
| EP | 1 052 716 A2 | 11/2000 |
| EP | 1 514 859 A2 | 3/2005 |
| EP | 2 117 068 A1 | 11/2009 |
| EP | 2 330 676 A1 | 6/2011 |
| EP | 2 983 186 A1 | 2/2016 |
| JP | 2-300222 A | 12/1990 |
| JP | 3-90615 A | 4/1991 |
| JP | H3-137010 A | 6/1991 |
| JP | 4-59806 A | 2/1992 |
| JP | 4-139174 A | 5/1992 |
| JP | 5-117493 A | 5/1993 |
| JP | 5-156121 A | 6/1993 |
| JP | 5-311512 A | 11/1993 |
| JP | 5-320955 A | 12/1993 |
| JP | 8-59919 A | 3/1996 |
| JP | 8-112539 A | 5/1996 |
| JP | 9-63905 A | 3/1997 |
| JP | 9-275042 A | 10/1997 |
| JP | 10-297912 A | 11/1998 |
| JP | 2001-89119 A | 4/2001 |
| JP | 2001-278609 A | 10/2001 |
| JP | 2003-303588 A | 10/2003 |
| JP | 2004-67498 A | 3/2004 |
| JP | 2004-203715 A | 7/2004 |
| JP | 2004-221332 A | 8/2004 |
| JP | 2004-315283 A | 11/2004 |
| JP | 2005-132696 A | 5/2005 |
| JP | 2005-136397 A | 5/2005 |
| JP | 2005-187320 A | 7/2005 |
| JP | 2006-117475 A | 5/2006 |
| JP | 2006-248848 A | 9/2006 |
| JP | 2006-264993 A | 10/2006 |
| JP | 2007-039289 A | 2/2007 |
| JP | 2007-115749 A | 5/2007 |
| JP | 2008-7387 A | 1/2008 |
| JP | 2008-8539 A | 1/2008 |
| JP | 2008-94925 A | 4/2008 |
| JP | 2009-259803 A | 11/2009 |
| JP | 5339107 B1 | 11/2013 |
| JP | 2015-130287 A | 7/2015 |
| JP | 5796263 B1 | 10/2015 |
| JP | 2016-27222 A | 2/2016 |
| JP | 2016-100225 A | 5/2016 |
| JP | 2016-100226 A | 5/2016 |
| JP | 2016-132608 A | 7/2016 |
| KR | 10-2004-0080010 A | 9/2004 |
| KR | 10-2007-0030881 A | 3/2007 |
| KR | 10-2011-0130628 A | 12/2011 |
| KR | 10-2014-0112451 A | 9/2014 |
| WO | 95/01165 A1 | 1/1995 |
| WO | 02/39468 A2 | 5/2002 |
| WO | 2004/087285 A1 | 10/2004 |
| WO | 2004/099073 A2 | 11/2004 |
| WO | 2005/043653 A1 | 5/2005 |
| WO | 2009/032104 A2 | 3/2009 |
| WO | 2010/138760 A2 | 12/2010 |
| WO | 2011/157013 A1 | 12/2011 |
| WO | 2022/035879 A1 | 2/2022 |
| WO | 2022/040327 A1 | 2/2022 |
| WO | 2022/040328 A1 | 2/2022 |

OTHER PUBLICATIONS

"Chemical Basics of Polymer Insulation Materials: 3.6 Implementation Method of Stepwise Polymerization," in Changming Li (eds.), *HITP Harbin Institute of Technology Press*, 2007, pp. 73 (With English Translation) (4 Pages).

"Determination of density by volumetric displacement—Skeleton density by gas pycnometry," International Standard 1(ISO 12154):2014, (17 pages).

Abánades et al., "Experimental Analysis of Direct Thermal Methane Cracking," *International Journal of Hydrogen Energy 36*(20): 12877-12886, 2011.

Abraham et al., "A Polymer Electrolyte-Based Rechargeable Lithium/Oxygen Battery," *J. Electrochem. Soc. 143*(1):1-5, Jan. 1996.

Alcañiz-Monge et al., "Methane Storage in Activated Carbon Fibres," *Carbon 35*(2):291-297, 1997.

Alias et al., "Silicon/graphite nanocomposite electrodes prepared by low pressure chemical vapor deposition," *Journal of Power Sources 174*:900-904, 2007.

Anderegg, "Grading Aggregates: II—The Application of Mathematical Formulas to Mortars," *Industrial and Engineering Chemistry 23*(9):1058-1064, 1931.

Andreasen et al., "Ueber die Beziehung zwischen Komabstufung und Zwischenraum in Produkten aus losen Körnern (mit einigen Experimenten)," *Kolloid-Zeitschrift 50*(3):217-228, March 1930, with translation of summary. (17 pages).

(56) References Cited

OTHER PUBLICATIONS

Babić et al., "Carbon cryogel as support of platinum nano-sized electrocatalyst for the hydrogen oxidation reaction," *Electrochimica Acta* 51:3820-3826, 2006.
Babić et al., "Characterization of carbon cryogel synthesized by sol-gel polycondensation and freeze-drying," *Carbon* 42:2617-2624, 2004.
Babić et al., "Characterization of carbon cryogels synthesized by sol-gel polycondensation," *J. Serb. Chem. Soc.* 70(1):21-31, 2005.
Barbieri et al., "Capacitance limits of high surface area activated carbons for double layer capacitors," *Carbon* 43:1303-1310, 2005.
Barton et al., "Tailored Porous Materials," *Chem. Mater.* 11:2633-2656, 1999.
Beattie et al., "High-Capacity Lithium-Air Cathodes," *J. Electrochem. Soc.* 156(1):A44-A47, 2009.
Besenhard, "Handbook of battery materials," Weinheim, Wiley—VCH, Weinheim, New York, 398-401, Dec. 31, 1999.
Bock et al., "Structural Investigation of Resorcinol Formaldehyde and Carbon Aerogels Using SAXS and BET," *Journal of Porous Materials* 4:287-294, 1997.
Buiel et al., "Li-insertion in hard carbon anode materials for Li-ion batteries," *Electrochimica Acta* 45:121-130, 1999.
Burchell et al., "Low Pressure Storage of Natural Gas for Vehicular Applications," *The Engineering Society for Advancing Mobility Land Sea Air and Space, Government/Industry Meeting*, Washington D.C., Jun. 19-21, 2000, 7 pages.
Cao et al., "Li-ion capacitors with carbon cathode and hard carbon/stabilized lithium metal powder anode electrodes," *Journal of Power Sources* 213:180-185, Apr. 2012.
Chmiola et al., "Anomalous Increase in Carbon Capacitance at Pore Sizes Less Than 1 Nanometer," *Science* 313:1760-1763, Sep. 22, 2006.
Conway et al., "Partial Molal vols. of Tetraalkylammonium Halides and Assignment of Individual Ionic Contributions," *Trans. Faraday Soc.* 62:2738-2749, 1966.
Coppey et al., "Fluidized Bed Chemical Vapor Deposition of Silicon on Carbon Nanotubes for Li-Ion Batteries," *Journal of Nanoscience and Nanotechnology* 11(9):8392-8395, 2011.
Czakkel et al., "Influence of drying on the morphology of resorcinol-formaldehyde-based carbon gels," *Microporous and Mesoporous Materials* 86:124-133, 2005.
Débart et al., "α-MnO2 Nanowires: A Catalyst for the O2 Electrode in Rechargeable Lithium Batteries," *Agnew. Chem. Int. Ed.* 47:4521-4524, 2008.
Ding et al., "How Conductivities and Viscosities of PC-DEC and PC-EC Solutions of LiBF4, LiPF6, LiBOB, Et4NBF4, and Et4NBF6 Differ and Why," *Journal of The Electrochemical Society* 151(12):A2007-A2015, 2004.
Dinger et al., "Particle Packing III—Discrete versus Continuous Particle Sizes," *Interceram* 41(5):332-334, 1992.
Dinger et al., "Particle Packing IV—Computer Modelling of Particle Packing Phenomena," *Interceram* 42(3):150-152, 1993.
Edward, "Molecular Volumes and the Stokes-Einstein Equation," *Journal of Chemical Education* 47(4):261-270, Apr. 1970.
Eikerling et al., "Optimized Structure of Nanoporous Carbon-Based Double-Layer Capacitors," *Journal of The Electrochemical Society* 152(1):E24-E33, 2005.
Endo et al., "Morphology and organic EDLC applications of chemically activated AR-resin-based carbons," *Carbon* 40:2613-2626, 2002.
Feaver et al., "Activated carbon cryogels for low pressure methane storage," *Carbon* 44:590-593, 2006.
Fotouhi et al., "A Low Cost, Disposable Cable-Shaped Al-Air Battery for Portable Biosensors," *J. Micromech. Microeng.* 26:055011, 2016, (8 pages).
Fraas, "Using vibrations in fluidized beds For processes that do not require a high flow rate of sweep gas, the complex-mode vibration fluidized bed offers lower power needs, attrition rates, and elutriation rates than gas-fluidized beds or rotary kilns," *Mechanical Engineering*:76-79, Jan. 7, 1998.

Furnas, "Grading Aggregates I—Mathematical Relations for Beds of Broken Solids of Maximum Density," *Industrial and Engineering Chemistry* 23(9):1052-1058, 1931.
Gao et al., "Nitrogen-rich graphene from small molecules as high performance anode material," *Nanotechnology* 25:415492, 2014, 8 pages.
Hahn et al., "A dilatometric study of the voltage limitation of carbonaceous electrodes in aprotic EDLC type electrolytes by charge-induced strain," *Carbon* 44:2523-2533, 2006.
Hasegawa et al., "Preparation of carbon gel microspheres containing silicon powder for lithium ion battery anodes," *Carbon* 42:2513-2519, 2004.
Hirscher et al., "Are carbon nanostructures an efficient hydrogen storage medium?" *Journal of Alloys and Compounds* 356-357:433-431, 2003.
Hogness et al. "The Thermal Decomposition of Silane," *J. Am. Chem. Soc.* 58(1): 108-112, 1936.
Hong et al., "Hydrogen evolution inhibition with diethylenetriamine modification of activated carbon for a lead-acid battery," *RSC Adv.* 4:33514-33511, 2014.
Hsieh et al., "Synthesis of mesoporous carbon composite and its electric double-layer formation behavior," *Microporous and Mesoporous Materials* 93:232-239, 2006.
Hu et al., "Effects of electrolytes and electrochemical pretreatments on the capacitive characteristics of activated carbon fabrics for supercapacitors," *Journal of Power Sources* 125:299-308, 2004.
Huang et al., "Nitrogen-containing mesoporous carbons prepared from melamine formaldehyde resins with $CaCl_2$ as a template," *J. Colloid Interface Sci.* 363(1):193-198, 2011.
Indo German Carbons Limited, "Activated Carbon," Apr. 2009, URL=http://www.igcl.com/php/activated_carbon.php, download date Nov. 29, 2018, 3 pages.
Inomata et al., "Natural gas storage in activated carbon pellets without a binder," *Carbon* 40:87-93, 2002.
Job et al., "Carbon aerogels, cryogels and xerogels: Influence of the drying method on the textural properties of porous carbon materials," *Carbon* 43:2481-2494, 2005.
Job et al., "Highly dispersed platinum catalysts prepared by impregnation of texture-tailored carbon xerogels," *Journal of Catalysis* 240:160-171, 2006.
Job et al., "Synthesis of transition metal-doped carbon xerogels by solubilization of metal salts in resorcinol-formaldehyde aqueous solution," *Carbon* 42:3211-3221, 2004.
Katsaros et al., "Preparation and characterisation of gas selective microporous carbobn membranes," *Microporous and Mesoporous Materials* 99:181-189, 2007.
Kim et al., "Correlation between the capacitor performance and pore structure," *Tanso* 221:31-39, 2006 (English Abstract).
Kim et al., "Adsorption of phenol and reactive dyes from aqueous solution on carbon cryogel microspheres with controlled porous structure," *Microporous and Mesoporous Materials* 96:191-196, 2006.
Kocklenberg et al., "Texture control of freeze-dried resorcinol-formaldehyde gels," *Journal of Non-Crystalline Solids* 225:8-13, 1998.
Kowalczyk et al., "Estimation of the pore-size distribution function from the nitrogen adsorption isotherm. Comparison of density functional theory and the method of Do and co-workers," *Carbon* 41:1113-1125, 2003.
Lozano-Castelló et al., "Influence of pore structure and surface chemistry on electric double layer capacitance in non-aqueous electrolyte," *Carbon* 41:1765-1775, 2003.
Lozano-Castelló et al., "Powdered Activated Carbons and Activated Carbon Fibers for Methane Storage: A Comparative Study," *Energy & Fuels* 16:1321-1328, 2002.
McEwen et al., "Nonaqueous Electrolytes and Novel Packaging Concepts for Electrochemical Capacitors," The 7th International Seminar on Double Layer capacitors and Similar Energy Storage Devices, Deerfield Beach, FL Dec. 8-10, 1997, 56 pages.
Miller, "Pulse Power Performance of Electrochemical Capacitors: Technical Status Of Present Commercial Devices," Proceedings of

(56) References Cited

OTHER PUBLICATIONS the 8th International Seminar on Double Layer Capacitors and Similar Energy Storage Devices, Deerfield Beach, Florida, Dec. 7-9, 1998, 9 pages.
Naoi et al., "Second generation 'nanohybrid supercapacitor': Evolution of capacitive energy storage devices," *Energy Environ. Sci.* 5:9363-9373, 2012.
Nishihara et al., "Preparation of resorcinol—formaldehyde carbon cryogel microhoneycombs," *Carbon* 42:899-901, 2004.
Ogasawara et al., "Rechargeable Li2O2 Electrode for Lithium Batteries," *Journal of the American Chemical Society* 128(4):1390-1393, 2006.
Otowa et al., "Production and adsorption characteristics of MAXSORB: High-surface-area active carbon," *Gas Separation and Purification* 7(4):241-245, 1993.
Pääkkö, "Long and entangled native cellulose I nanofibers allow flexible aerogels and hierarchically porous templates for functionalities," *Soft Matter* 4:2492-2499, 2008.
Pekala et al., "Aerogels derived from multifunctional organic monomers," *Journal of Non-Crystalline Solids* 145:90-98, 1992.
Pekala et al., "Structure of Organic Aerogels. 1. Morphology and Scaling," *Macromolecules* 26:5487-5493, 1993.
Pekala, "Organic aerogels from the polycondensation of resorcinol with formaldehyde," *Journal of Materials Science* 24:3221-3227, 1989.
Perrin et al., "Methane Storage within Dry and Wet Active Carbons: A Comparative Study," *Energy & Fuels* 17:1283-1291, 2003.
Pimenta et al., "Studying disorder in graphite-based systems by Raman spectroscopy," *Phys. Chem. Chem. Phys.* 9:1276-1291, 2007.
Pojanavaraphan et al., "Prevulcanized natural rubber latex/clay aerogel nanocomposites," *European Polymer Journal* 44:1968-1977, 2008.
Qu et al., "Studies of activated carbons used in double-layer capacitors," *Journal of Power Sources* 74:99-107, 1998.
Ravikovitch et al., "Unified Approach to Pore Size Characterization of Microporous Carbonaceous Materials from N2, Ar, and CO2 Adsorption Isotherms," *Langmuir* 16:2311-2320, 2000.
Read, "Ether-Based Electrolytes for the Lithium/Oxygen Organic Electrolyte Battery," *J. Electrochem. Soc.* 153(1):A96-A100, 2006.
Read et al., "Oxygen Transport Properties of Organic Electrolytes and Performance of Lithium/Oxygen Battery," *J. Electrochem. Soc.* 150(10):A1351-A1356, 2003.
Read, "Characterization of the Lithium/Oxygen Organic Electrolyte Battery," *J. Electrochemical Soc.* 149(9):A1190-A1195, 2002.
Reichenauer et al., "Microporosity in carbon aerogels," *Journal of Non-Crystalline Solids* 225:210-214, 1998.
Salitra et al., "Carbon Electrodes for Double-Layer Capacitors I. Relations Between Ion and Pore Dimensions," *Journal of The Electrochemical Society* 147(7):2486-2493, 2000.
Setoyama et al., "Simulation Study On The Relationship Between A High Resolution αs-Plot And The Pore Size Distribution For Activated Carbon," *Carbon* 36(10):1459-1467, 1998.
Simon et al., "Materials for electrochemical capacitors," *Nature Materials* 7:845-854, Nov. 2008.
Sivakkumar et al., "Evaluation of Lithium-ion capacitors assembled with pre-lithiated graphite anode and activated carbon cathode," *Electrochimica Acta* 65:280-287, Jan. 2012.
Takeuchi et al., "Removal of single component chlorinated hydrocarbon vapor by activated carbon of very high surface area," *Separation and Purification Technology* 15:79-90, 1999.
Tamon et al., "Influence of freeze-drying conditions on the mesoporosity of organic gels as carbon precursors," *Carbon* 38:1099-1105, 2000.
Tamon et al., "Preparation of mesoporous carbon by freeze drying," *Carbon* 37:2049-2055, 1999.
Tonanon et al., "Influence of surfactants on porous properties of carbon cryogels prepared by sol-gel polycondensation of resorcinol and formaldehyde," *Carbon* 41:2981-2990, 2003.
Toyo Tanso Carbon Products, "Special Graphite and Compound Material Products," Toyo Tanso Co., Ltd. Catalog published 2008.
Toyo Tanso, "Graphite Applications," Toyo Tanso Co., Ltd. Catalog published 1998. (Machine Translation Attached).
Toyo Tanso, "Isotropic Graphite Engineering Data," Toyo Tanso Co., Ltd. Catalog published 1994.
Toyo Tanso, "Isotropic Graphite Technical Data," Toyo Tanso Co., Ltd. Catalog published 1997.
Ue, "Mobility and Ionic Association of Lithium and Quaternary Ammonium Salts in Propylene Carbonate and γ-Butyrolactone," *J. Electrochem. Soc.* 141(12):3336-3342, Dec. 1994.
Webb, "Volume and Density Determinations for Particle Technologists," Micromeritics Instrument Corp., Feb. 16, 2001, Retrieved from http://www.micormeritics.com/pdf/app_articles/density_determinations.pdf (15 pages).
WebElements, "Lead: the essentials," attached as a PDF showing the webpage availability date as of Aug. 14, 2009 (via the Wayback Machine), web URL is http://www.webelements.com/lead/, pp. 1-3.
Wei et al., "A novel electrode material for electric double-layer capacitors," *Journal of Power Sources* 141:386-391, 2005.
Williford et al., "Air electrode design for sustained high power operation of Li/air batteries," *Journal of Power Sources* 194:1164-1170, 2009.
Woo et al., "Silicon Embedded Nanoporous Carbon Composite for the Anode of Li Ion Batteries," *Journal of The Electrochemical Society* 159(8):A1273-A1277, 2012.
Wu et al., "Fabrication and nano-structure control of carbon aerogels via a microemulsion-templated sol-gel polymerization method," *Carbon* 44:675-681, 2006.
Xiang et al., "Beneficial effects of activated carbon additives on the performance of negative lead-acid battery electrode for high-rate partial-state-of-charge operation," *Journal of Power Sources* 241:150-158, 2013.
Xie et al., "Pore size control of Pitch-based activated carbon fibers by pyrolytic deposition of propylene," *Applied Surface Science* 250:152-160, 2005.
Xu et al., "Comparison of sizing small particles using different technologies," *Powder Technology* 132:145-153, 2003.
Xu et al., "Optimization of Nonaqueous Electrolytes for Primary Lithium/Air Batteries Operated in Ambient Environment," *Journal of the Electrochemical Society* 156(10):A113-A119, 2009.
Xu et al., "Synthesis of mesoporous carbon and its adsorption property to biomolecules," *Microporous and Mesoporous Materials* 115:461-468, 2008.
Yamamoto et al., "Porous properties of carbon gel microspheres as adsorbents for gas separation," *Carbon* 42:1671-1676, 2004.
Yamamoto et al., "Control of mesoporosity of carbon gels prepared by sol-gel polycondensation and freeze drying," *Journal of Non-Crystalline Solids* 288:46-55, 2001.
Yamamoto et al., "Preparation and characterization of carbon cryogel microspheres," *Carbon* 40:1345-1351, 2002.
Yang et al., "Preparation of highly microporous and mesoporous carbon from the mesophase pitch and its carbon foams with KOH," *Carbon* 42:1872-1875, 2004.
Zhang et al., "Discharge characteristic of non-aqueous electrolyte Li/O2 battery," *Journal of Power Sources* 195:1235-1240, 2010.
Zhao et al., "Highly-Ordered Mesoporous Carbon Nitride with Ultrahigh Surface Area and Pore Volume as a Superior Dehydrogenation Catalyst," *Chem. Mater.* 26(10):3151-3161, 2014.
Zhang et al., "Highly Reversible and Large Lithium Storage in Mesoporous Si/C Nanocomposite Anodes with Silicon Nanoparticles Embedded in a Carbon Framework," *Adv. Mater.* 26:6749-6755, 2014.

\* cited by examiner

Figure 1. Relationship between Z and average Coulombic efficiency for various silicon-carbon composite materials.
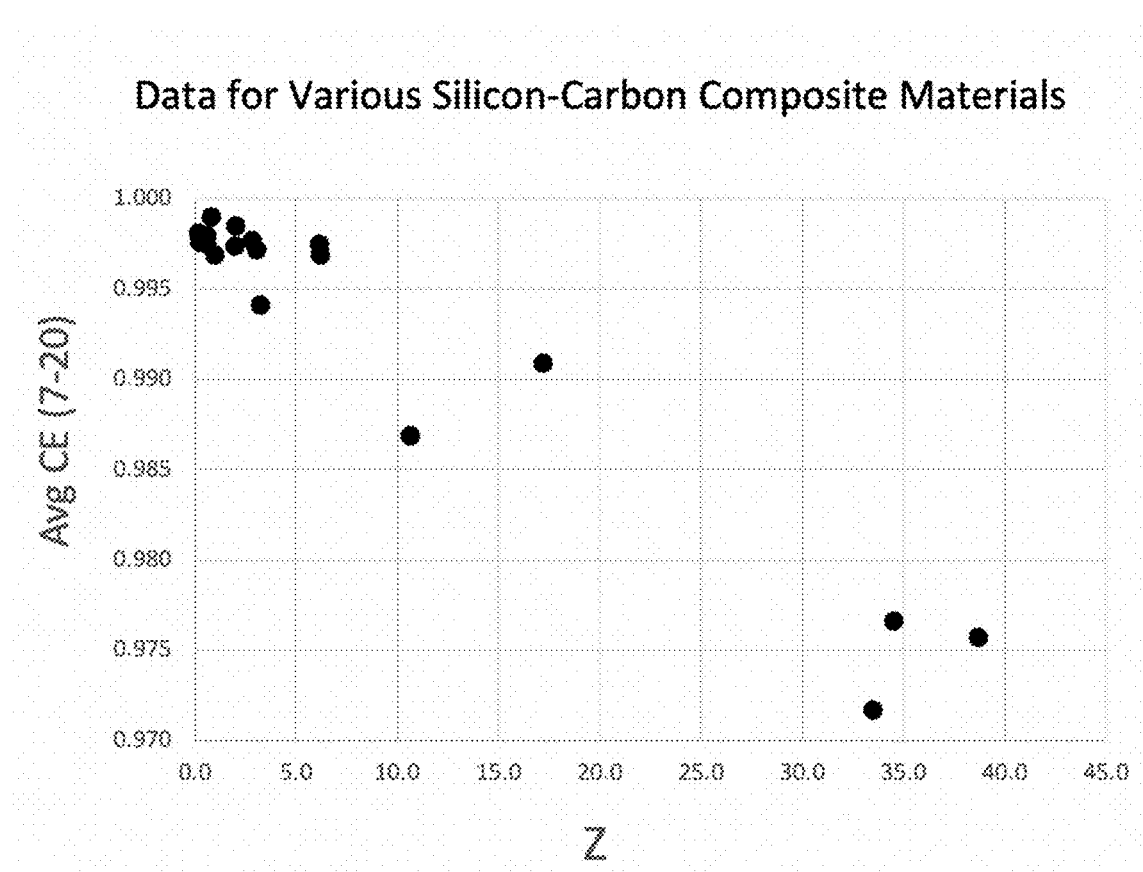

Figure 2. Differential capacity vs voltage plot for Silicon-Carbon Composite 3 from 2nd cycle using a half-cell.
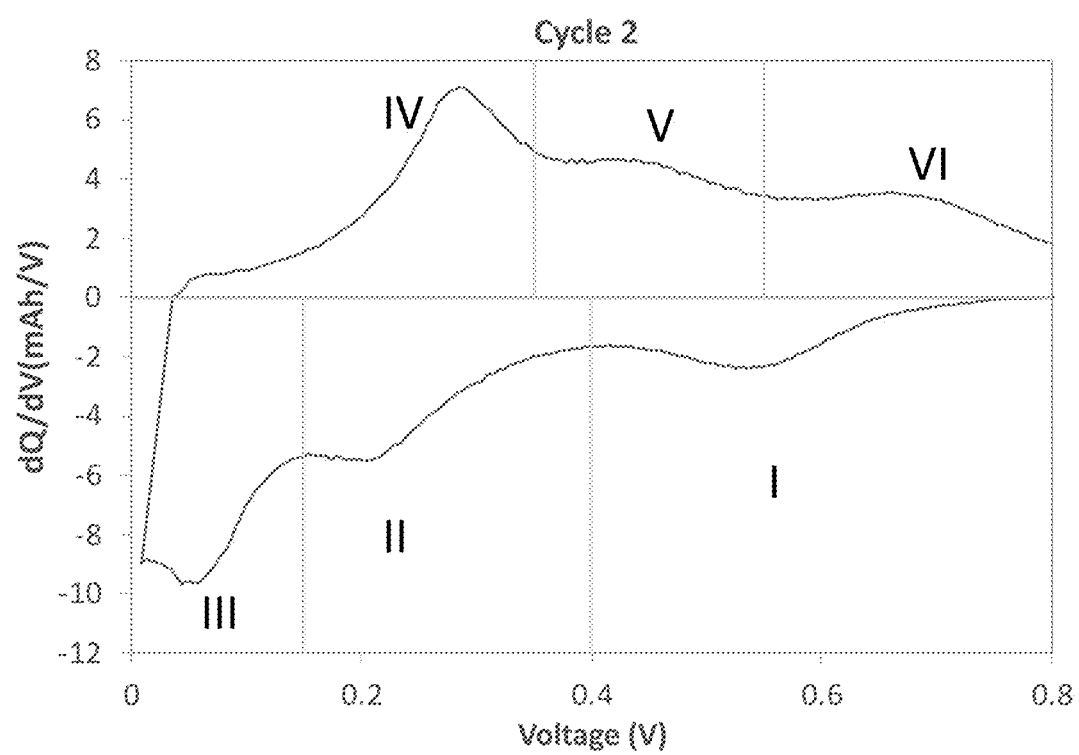

Figure 3. Differential capacity vs voltage plot for Silicon-Carbon Composite 3 from 2nd cycle to 5th cycle using a half-cell.
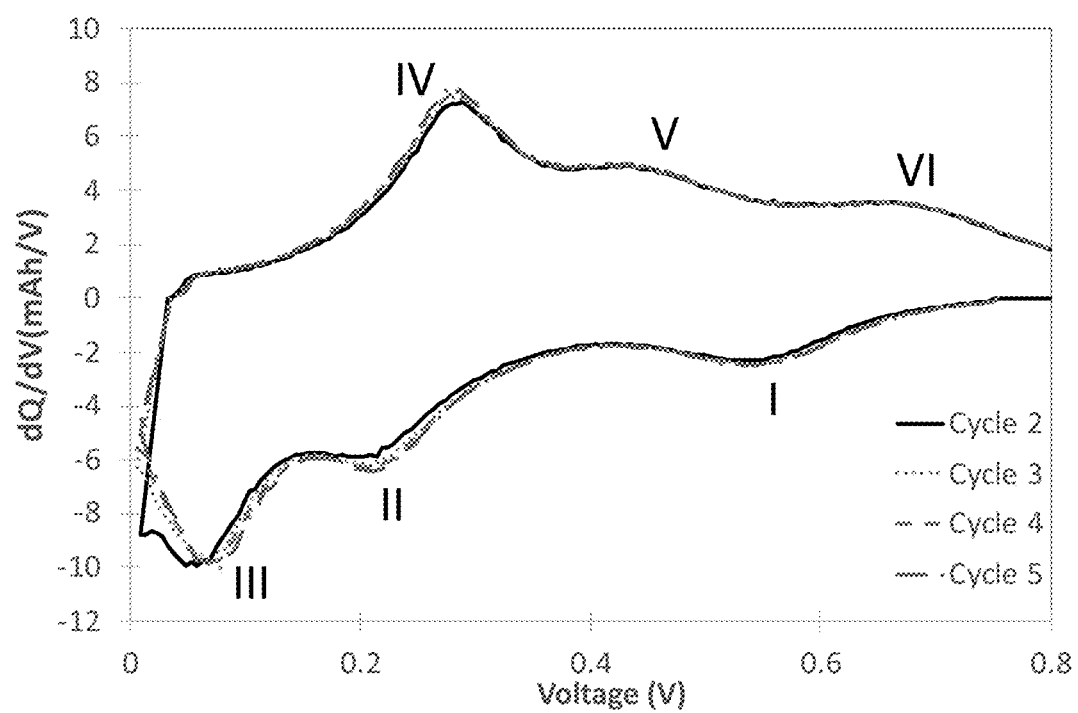

Figure 4. dQ/dV vs V plot for various silicon-carbon composite materials.
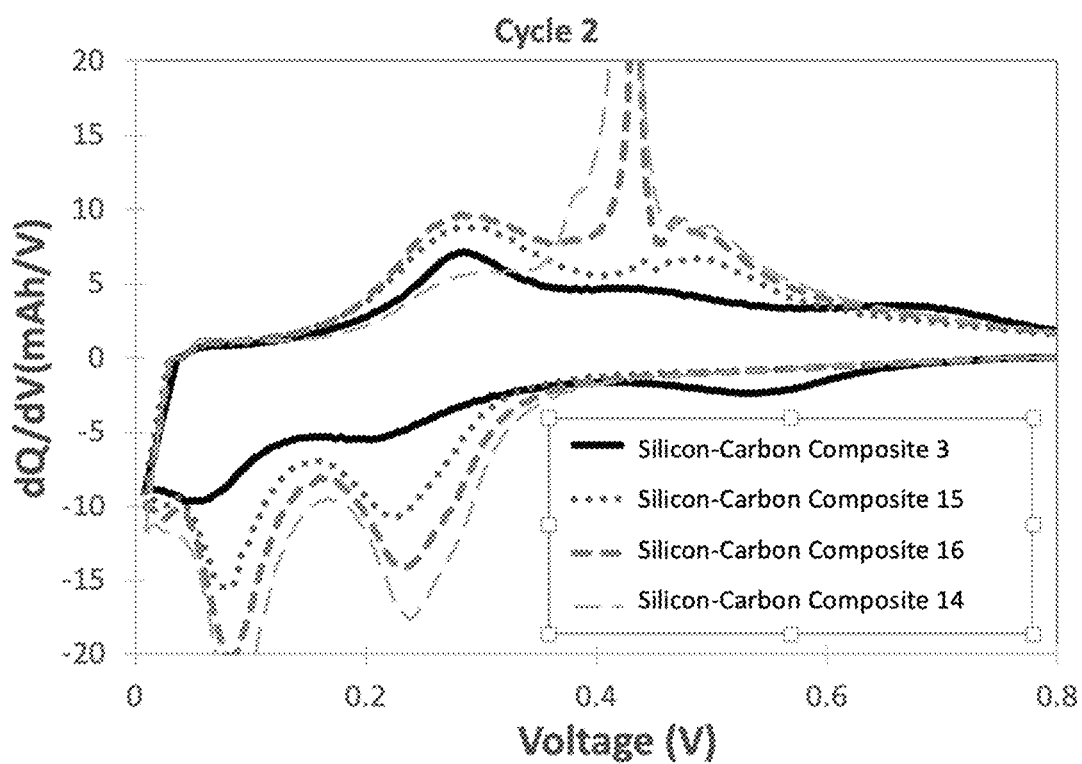

Figure 5. Example of Calculation of φ for Silicon-Carbon Composite 3.
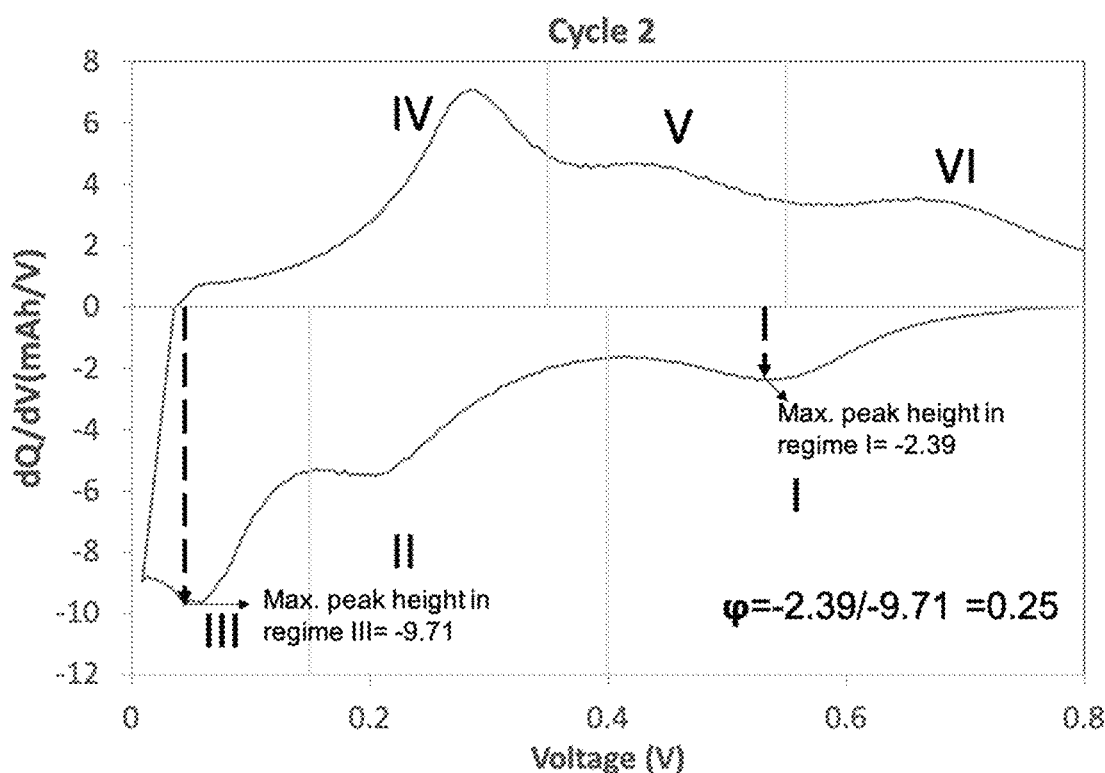

Figure 6. Z vs φ plot for various silicon-carbon composite materials.
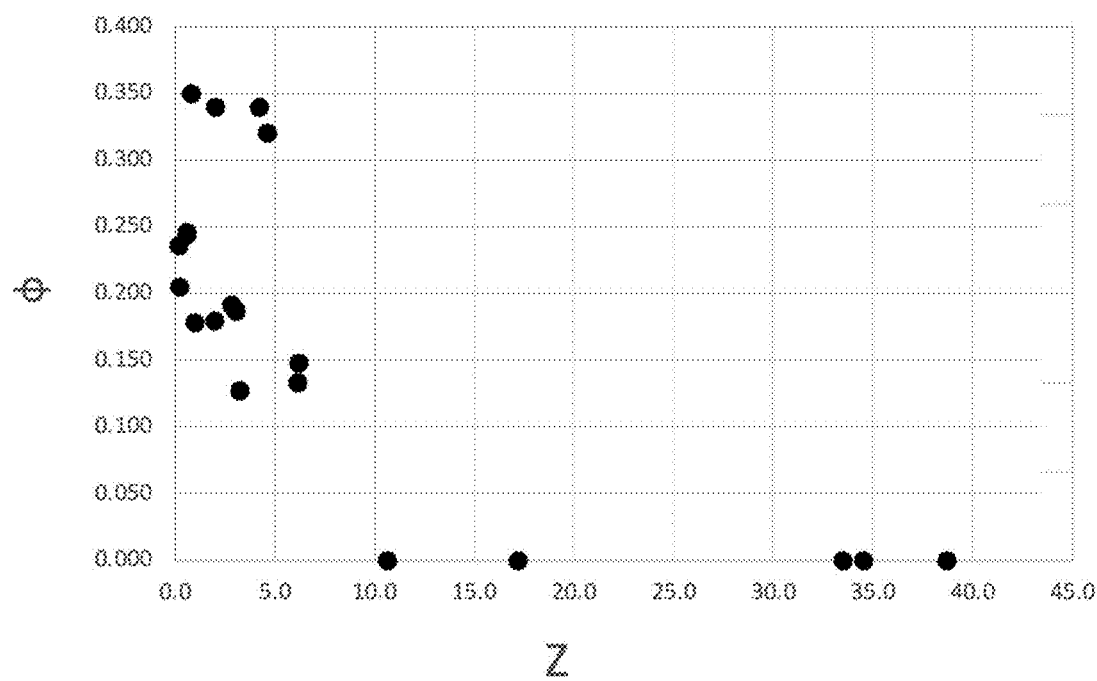

Figure 7. $Y_{CVI}$ vs $X_{Si}$ plot for various silicon-carbon composite materials.
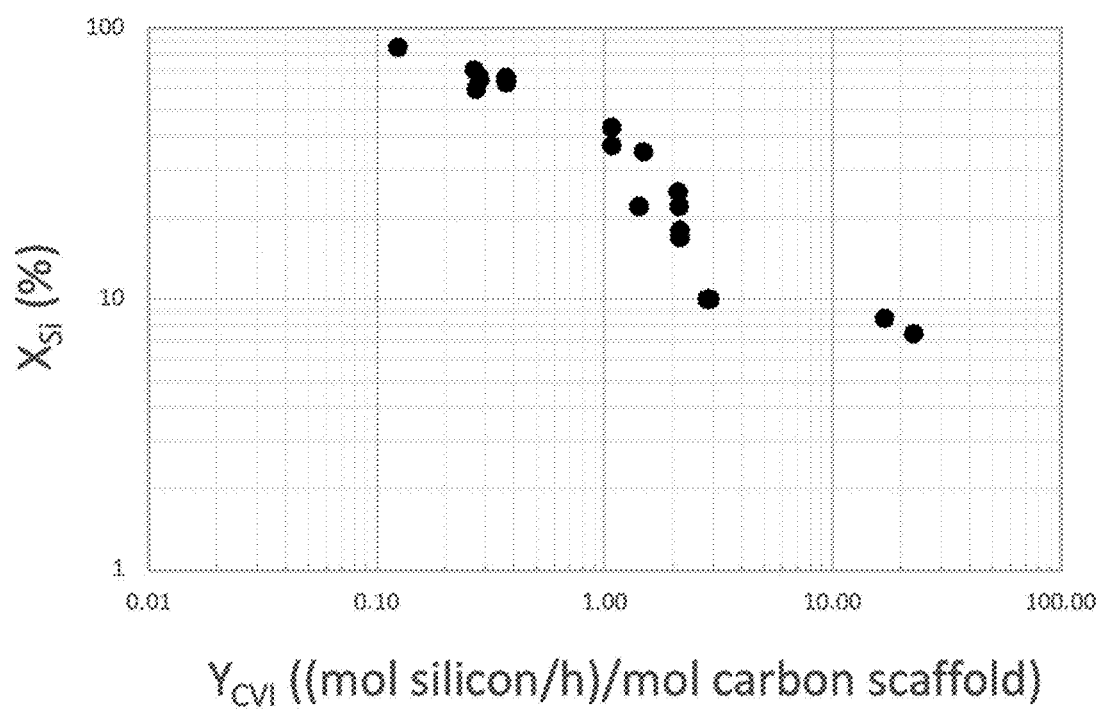

Figure 8. Silane utilization (%) as determined from Fourier-transformed infrared spectroscopy (FTIR) as a function on run time for the preparation of Sample 21.
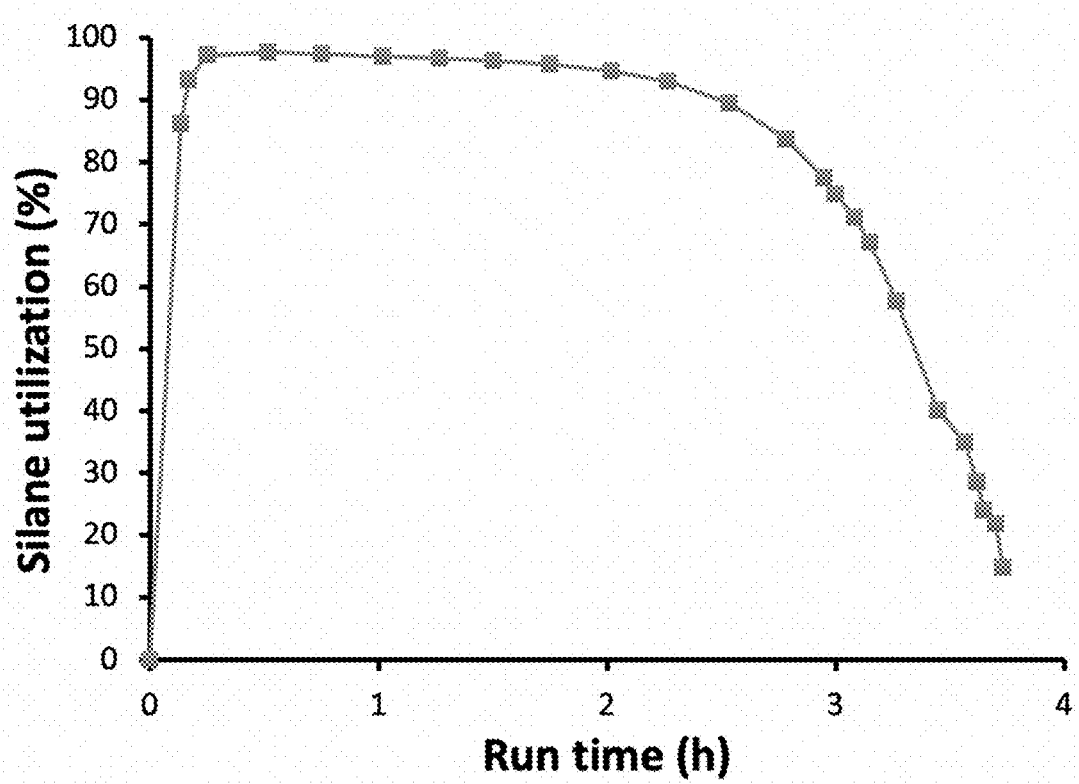

HIGHLY EFFICIENT MANUFACTURING OF SILICON-CARBON COMPOSITES MATERIALS COMPRISING ULTRA LOW Z

BACKGROUND

Technical Field

Embodiments of the present invention generally relate to methods of manufacturing silicon-carbon composite materials with properties that overcome the challenges for providing amorphous nano-sized silicon entrained within porous carbon. Said silicon-carbon composites are produced via chemical infiltration chemical vapor infiltration to impregnate amorphous, nano-sized silicon within the pores of a porous scaffold. Suitable porous scaffolds include, but are not limited to, porous carbon scaffolds, for example carbon having a pore volume comprising micropores (less than 2 nm), mesopores (2 to 50 nm), and/or macropores (greater than 50 nm). Suitable precursors for the carbon scaffold include, but are not limited to, sugars and polyols, organic acids, phenolic compounds, cross-linkers, and amine compounds. Suitable compositing materials include, but are not limited to, silicon materials. Precursors for the silicon include, but are not limited to, silicon containing gases such as silane, high-order silanes (such as di-, tri-, and/or tetrasilane), and/or chlorosilane(s) (such as mono-, di-, tri-, and tetrachlorosilane) and mixtures thereof. Chemical vapor infiltration (CVI) of silicon into the pores of porous scaffold materials is accomplished by exposing said porous scaffold to silicon-containing gas (e.g., silane) at elevated temperatures. The porous carbon scaffold can be a particulate porous carbon.

A key outcome in this regard is to achieve the desired form of silicon in the desired form, namely amorphous nano-sized silicon. Furthermore, another key outcome is to achieve the silicon impregnation within the pores of the porous carbon. Yet another key outcome is to achieve high utilization of the silicon-containing gas, i.e., achieve a high fraction of the the silicon introduced into the CVI reactor that converts into silicon impregnated into to pores of the porous carbon in the form of amorphous nano-sized silicon. Such manufacturing processes and materials produced therefore, for example, silicon-carbon composite materials, have utility as anode materials for energy storage devices, for example lithium ion batteries.

Description of the Related Art

CVI is a process wherein a gaseous substrate reacts within a porous scaffold material. This approach can be employed to produce composite materials, for instance silicon-carbon composites, wherein a silicon-containing gas decomposes at elevated temperature within a porous carbon scaffold. While this approach can be employed to manufacture a variety of composite materials, there is particular interest in silicon-carbon (Si—C) composite materials. Such Si—C composite materials have utility, for example as energy storage materials, for example as an anode material within a lithium ion battery (LIB). LIB s have potential to replace devices currently used in any number of applications. For example, current lead acid automobile batteries are not adequate for next generation all-electric and hybrid electric vehicles due to irreversible, stable sulfate formations during discharge. Lithium ion batteries are a viable alternative to the lead-based systems currently used due to their capacity, and other considerations.

To this end, there is continued strong interest in developing new LIB anode materials, particularly silicon, which has 10-fold higher gravimetric capacity than conventional graphite. However, silicon exhibits large volume change during cycling, in turn leading to electrode deterioration and solid-electrolyte interphase (SEI) instability. The most common amelioration approach is to reduce silicon particle size, for instance $D_{v,50}<150$ nm, for instance $D_{v,50}<100$ nm, for instance $D_{v,50}<50$ nm, for instance $D_{v,50}<20$ nm, for instance $D_{v,50}<10$ nm, for instance $D_{v,50}<5$ nm, for instance $D_{v,50}<2$ nm, either as discrete particles or within a matrix. Thus far, techniques for creating nano-scale silicon involve high-temperature reduction of silicon oxide, extensive particle diminution, multi-step toxic etching, and/or other cost prohibitive processes. Likewise, common matrix approaches involve expensive materials such as graphene or nano-graphite, and/or require complex processing and coating.

It is known from scientific literature that non-graphitizable (hard) carbon is beneficial as a LIB anode material (Liu Y, Xue, J S, Zheng T, Dahn, J R. Carbon 1996, 34:193-200; Wu, Y P, Fang, S B, Jiang, Y Y. 1998, 75:201-206; Buiel E, Dahn JR. Electrochim Acta 1999 45:121-130). The basis for this improved performance stems from the disordered nature of the graphene layers that allows Li-ions to intercalate on either side of the graphene plane allowing for theoretically double the stoichiometric content of Li ions versus crystalline graphite. Furthermore, the disordered structure improves the rate capability of the material by allowing Li ions to intercalate isotropically as opposed to graphite where lithiation can only proceed in parallel to the stacked graphene planes. Despite these desirable electrochemical properties, amorphous carbons have not seen wide-spread deployment in commercial Li-ion batteries, owing primarily to low FCE and low bulk density (<1 g/cc). Instead, amorphous carbon has been used more commonly as a low-mass additive and coating for other active material components of the battery to improve conductivity and reduce surface side reactions.

In recent years, amorphous carbon as a LIB battery material has received considerable attention as a coating for silicon anode materials. Such a silicon-carbon core-shell structure has the potential for not only improving conductivity, but also buffering the expansion of silicon as it lithiates, thus stabilizing its cycle stability and minimizing problems associated with particle pulverization, isolation, and SEI integrity (Jung, Y, Lee K, Oh, S. Electrochim Acta 2007 52:7061-7067; Zuo P, Yin G, Ma Y. Electrochim Acta 2007 52:4878-4883; Ng S H, Wang J, Wexler D, Chew S Y, Liu H K. J Phys Chem C 2007 111:11131-11138). Problems associated with this strategy include the lack of a suitable silicon starting material that is amenable to the coating process, and the inherent lack of engineered void space within the carbon-coated silicon core-shell composite particle to accommodate expansion of the silicon during lithiation. This inevitably leads to cycle stability failure due to destruction of core-shell structure and SEI layer (Beattie S D, Larcher D, Morcrette M, Simon B, Tarascon, J-M. J Electrochem Soc 2008 155:A158-A163).

An alternative to core shell structure is a structure wherein amorphous, nano-sized silicon is homogeously distributed within the porosity of a porous carbon scaffold. The porous carbon allows for desirable properties: (i) carbon porosity provides void volume to accommodate the expansion of silicon during lithiation thus reducing the net composite particle expansion at the electrode level; (ii) the disordered graphene network provides increased electrical conductivity to the silicon thus enabling faster charge/discharge rates, (iii)

nano-pore structure acts as a template for the synthesis of silicon thereby dictating its size, distribution, and morphology.

To this end, the desired inverse hierarchical structure can be achieved by employing CVI wherein a silicon-containing gas can completely permeate nanoporous carbon and decompose therein to nano-sized silicon. The CVI approach confers several advantages in terms of silicon structure. One advantage is that nanoporous carbon provides nucleation sites for growing silicon while dictating maximum particle shape and size. Confining the growth of silicon within a nano-porous structure affords reduced susceptibility to cracking or pulverization and loss of contact caused by expansion. Moreover, this structure promotes nano-sized silicon to remain as amorphous phase. This property provides the opportunity for high charge/discharge rates, particularly in combination with silicon's vicinity within the conductive carbon scaffold. This system provides a high-rate-capable, solid-state lithium diffusion pathway that directly delivers lithium ions to the nano-scale silicon interface. Another benefit of the silicon provide via CVI within the carbon scaffold is the inhibition of formation of undesirable crystalline $Li_{15}Si_4$ phase. Yet another benefit is that the CVI process provides for void space within the particle interior.

In order to quantitate the percentage loading of silicon comprising the silicon-carbon composite, thermogravimetric analysis (TGA) may be employed. For this purpose, the silicon-composite is heated from 25° C. to 1100° C., which, without being bound by theory, provides for burn off of all carbon, and oxidation of all silicon to SiO2. Thus, the % silicon comprising the silicon-carbon composite is calculated as $$\%Si = 100 \times [[M1100 \times (28/(28 + (16 \times 2)))]/M°]$$

wherein M1100 is the mass of the silicon-carbon composite at 1100° C. and M° is the minimum mass of the silicon-carbon composite between 30° C. and 200° C. when the silicon-carbon composite is heated under air from about 25° C. to about 1100° C., as determined by thermogravimetric analysis.

In order to gauge relative amount of silicon impregnated into the porosity of the porous carbon, thermogravimetric analysis TGA may be employed. TGA can be employed to assess the fraction of silicon residing within the porosity of porous carbon relative to the total silicon present, i.e., sum of silicon within the porosity and on the particle surface. As the silicon-carbon composite is heated under air, the sample exhibits a mass increase that initiates at about 300° C. to 500° C. that reflects initial oxidation of silicon to SiO2, and then the sample exhibits a mass loss as the carbon is burned off, and then the sample exhibits mass increase reflecting resumed conversion of silicon into SiO2 which increases towards an asymptotic value as the temperature approaches 1100° C. as silicon oxidizes to completion. For the purposes of this analysis, it is assumed that the minimum mass recorded for the sample as it heated from 800° C. to 1100° C. represents the point at which carbon burnoff is complete. Any further mass increase beyond that point corresponds to the oxidation of silicon to SiO2 and that the total mass at completion of oxidation is SiO2. Thus, the percentage of unoxidized silicon after carbon burnoff as a proportion of the total amount of silicon can be determined using the formula:

$$Z = 1.875 \times [(M1100 - M)/M1100] \times 100$$

where M1100 is the mass of the sample at completion of oxidation at a temperature of 1100° C., and M is the minimum mass recorded for the sample as it is heated from 800° C. to 1100° C.

Without being bound by theory, the temperature at which silicon is oxidized under TGA conditions relates to the length scale of the oxide coating on the silicon due to the diffusion of oxygen atoms through the oxide layer. Thus, silicon residing within the carbon porosity will oxidize at a lower temperature than deposits of silicon on a particle surface due to the necessarily thinner coating existing on these surfaces. In this fashion, calculation of Z is used to quantitatively assess the fraction of silicon not impregnated within the porosity of the porous carbon scaffold.

BRIEF SUMMARY

Silicon-carbon composite materials and related processes are disclosed that overcome the challenges for providing amorphous nano-sized silicon entrained within porous carbon. Compared to other, inferior materials and processes described in the prior art, the materials and processes disclosed herein find superior utility in various applications, including energy storage devices such as lithium ion batteries.

BRIEF DESCRIPTION OF THE DRAWINGS

FIG. 1. Relationship between Z and average Coulombic efficiency for various silicon-carbon composite materials.

FIG. 2. Differential capacity vs voltage plot for Silicon-Carbon Composite 3 from $2^{nd}$ cycle using a half-cell.

FIG. 3. Differential capacity vs voltage plot for Silicon-Carbon Composite 3 from $2^{nd}$ cycle to $5^{th}$ cycle using a half-cell.

FIG. 4. dQ/dV vs V plot for various silicon-carbon composite materials.

FIG. 5. Example of Calculation of $\varphi$ for Silicon-Carbon Composite 3.

FIG. 6. Z vs $\varphi$ plot for various silicon-carbon composite materials.

FIG. 7. $Y_{CVI}$ vs $X_{Si}$ plot for various silicon-carbon composite materials.

FIG. 8. Silane utilization (%) as determined from Fourier-transformed infrared spectroscopy (FTIR) as a function on run time for the preparation of Sample 21.

DETAILED DESCRIPTION

In the following description, certain specific details are set forth in order to provide a thorough understanding of various embodiments. However, one skilled in the art will understand that the invention may be practiced without these details. In other instances, well-known structures have not been shown or described in detail to avoid unnecessarily obscuring descriptions of the embodiments. Unless the context requires otherwise, throughout the specification and claims which follow, the word "comprise" and variations thereof, such as, "comprises" and "comprising" are to be construed in an open, inclusive sense, that is, as "including, but not limited to." Further, headings provided herein are for convenience only and do not interpret the scope or meaning of the claimed invention.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Also, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

A. Porous Scaffold Materials

For the purposes of embodiments of the current invention, a porous scaffold may be used, into which silicon is to be impregnated. In this context, the porous scaffold can comprise various materials. In some embodiments the porous scaffold material primarily comprises carbon, for example hard carbon. Other allotropes of carbon are also envisioned in other embodiments, for example, graphite, amorphous carbon, diamond, C60, carbon nanotubes (e.g., single and/or multi-walled), graphene and/or carbon fibers. The introduction of porosity into the carbon material can be achieved by a variety of means. For instance, the porosity in the carbon material can be achieved by modulation of polymer precursors, and/or processing conditions to create said porous carbon material, and described in detail in the subsequent section.

In other embodiments, the porous scaffold comprises a polymer material. To this end, a wide variety of polymers are envisioned in various embodiments to have utility, including, but not limited to, inorganic polymer, organic polymers, and addition polymers. Examples of inorganic polymers in this context includes, but are not limited to homochain polymers of silicon-silicon such as polysilanes, silicon carbide, polygermanes, and polystannanes. Additional examples of inorganic polymers includes, but are not limited to, heterochain polymers such as polyborazylenes, polysiloxanes like polydimethylsiloxane (PDMS), polymethylhydrosiloxane (PMHS) and polydiphenylsiloxane, polysilazanes like perhydridopolysilazane (PHPS), polyphosphazenes and poly(dichlorophosphazenes), polyphosphates, polythiazyls, and polysulfides. Examples of organic polymers includes, but are not limited to, low density polyethylene (LDPE), high density polyethylene (HDPE), polypropylene (PP), polyvinyl chloride (PVC), polystyrene (PS), nylon, nylon 6, nylon 6,6, teflon (Polytetrafluoroethylene), thermoplastic polyurethanes (TPU), polyureas, poly(lactide), poly(glycolide) and combinations thereof, phenolic resins, polyamides, polyaramids, polyethylene terephthalate, polychloroprene, polyacrylonitrile, polyaniline, polyimide, poly(3,4-ethylenedioxythiophene) polystyrene sulfonate (PDOT:PSS), and others known in the arts. The organic polymer can be synthetic or natural in origin. In some embodiments, the polymer is a polysaccharide, such as starch, cellulose, cellobiose, amylose, amylpectin, gum Arabic, lignin, and the like. In some embodiments, the polysaccharide is derived from the caramelization of mono- or oligomeric sugars, such as fructose, glucose, sucrose, maltose, raffinose, and the like.

In certain embodiments, the porous scaffold polymer material comprises a coordination polymer. Coordination polymers in this context include, but are not limited to, metal organic frameworks (MOFs). Techniques for production of MOFs, as well as exemplary species of MOFs, are known and described in the art ("The Chemistry and Applications of Metal-Organic Frameworks, Hiroyasu Furukawa et al. Science 341, (2013); DOI: 10.1126/science.1230444). Examples of MOFs in the context include, but are not limited to, Basolite™ materials and zeolitic imidazolate frameworks (ZIFs).

Concomitant with the myriad variety of polymers envisioned with the potential to provide a porous substrate, various processing approaches are envisioned in various embodiments to achieve said porosity. In this context, general methods for imparting porosity into various materials are myriad, as known in the art, including, but certainly not limited to, methods involving emulsification, micelle creation, gasification, dissolution followed by solvent removal (for example, lyophilization), axial compaction and sintering, gravity sintering, powder rolling and sintering, isostatic compaction and sintering, metal spraying, metal coating and sintering, metal injection molding and sintering, and the like. Other approaches to create a porous polymeric material, including creation of a porous gel, such as a freeze dried gel, aerogel, and the like are also envisioned.

In certain embodiments, the porous scaffold material comprises a porous ceramic material. In certain embodiments, the porous scaffold material comprises a porous ceramic foam. In this context, general methods for imparting porosity into ceramic materials are varied, as known in the art, including, but certainly not limited to, creation of porous In this context, general methods and materials suitable for comprising the porous ceramic include, but are not limited to, porous aluminum oxide, porous zirconia toughened alumina, porous partially stabilized zirconia, porous alumina, porous sintered silicon carbide, sintered silicon nitride, porous cordierite, porous zirconium oxide, clay-bound silicon carbide, and the like.

In certain embodiments, the porous scaffold comprises porous silica or other silicon material containing oxygen. The creation of silicon gels, including sol gels, and other porous silica materials is known in the art.

In certain embodiments, the porous material comprises a porous metal. Suitable metals in this regard include, but are not limited to porous aluminum, porous steel, porous nickel, porous Inconcel, porous Hasteloy, porous titanium, porous copper, porous brass, porous gold, porous silver, porous germanium, and other metals capable of being formed into porous structures, as known in the art. In some embodiments, the porous scaffold material comprises a porous metal foam. The types of metals and methods to manufacture related to same are known in the art. Such methods include, but are not limited to, casting (including foaming, infiltration, and lost-foam casting), deposition (chemical and physical), gas-eutectic formation, and powder metallurgy techniques (such as powder sintering, compaction in the presence of a foaming agent, and fiber metallurgy techniques).

B. Porous Carbon Scaffold

Methods for preparing porous carbon materials from polymer precursors are known in the art. For example, methods for preparation of carbon materials are described in U.S. Pat. Nos. 7,723,262, 8,293,818, 8,404,384, 8,654,507, 8,916,296, 9,269,502, 10,590,277, and U.S. patent application Ser. No. 16/745,197, the full disclosures of which are hereby incorporated by reference in their entireties for all purposes.

Accordingly, in one embodiment the present disclosure provides a method for preparing any of the carbon materials or polymer gels described above. The carbon materials may be synthesized through pyrolysis of either a single precursor, for example a saccharide material such as sucrose, fructose, glucose, dextrin, maltodextrin, starch, amylopectin, amlyose, lignin, gum Arabic, and other saccharides known in the art, and combinations thereof. Alternatively, the carbon materials may be synthesized through pyrolysis of a complex resin, for instance formed using a sol-gel method using polymer precursors such as phenol, resorcinol, bisphenol A, urea, melamine, and other suitable compounds known in the art, and combinations thereof, in a suitable solvent such as water, ethanol, methanol, and other solvents known in the art, and combinations thereof, with cross-linking agents such as formaldehyde, hexamethylenetetramine, furfural, and other cross-lining agents known in the art, and combinations thereof. The resin may be acid or basic, and may contain a catalyst. The catalyst may be volatile or non-volatile. The pyrolysis temperature and dwell time can vary as known in the art.

In some embodiments, the methods comprise preparation of a polymer gel by a sol gel process, condensation process or crosslinking process involving monomer precursor(s) and a crosslinking agent, two existing polymers and a crosslinking agent or a single polymer and a crosslinking agent, followed by pyrolysis of the polymer gel. The polymer gel may be dried (e.g., freeze dried) prior to pyrolysis; however drying is not necessarily required.

The target carbon properties can be derived from a variety of polymer chemistries provided the polymerization reaction produces a resin/polymer with the necessary carbon backbone. Different polymer families include novolacs, resoles, acrylates, styrenics, ureathanes, rubbers (neoprenes, styrene-butadienes, etc.), nylons, etc. The preparation of any of these polymer resins can occur via a number of different processes including sol gel, emulsion/suspension, solid state, solution state, melt state, etc for either polymerization and crosslinking processes.

In some embodiments an electrochemical modifier is incorporated into the material as polymer. For example, the organic or carbon containing polymer, RF for example, is copolymerized with the polymer, which contains the electrochemical modifier. In one embodiment, the electrochemical modifier-containing polymer contains silicon. In one embodiment the polymer is tetraethylorthosiliane (TEOS). In one embodiment, a TEOS solution is added to the RF solution prior to or during polymerization. In another embodiment the polymer is a polysilane with organic side groups. In some cases these side groups are methyl groups, in other cases these groups are phenyl groups, in other cases the side chains include phenyl, pyrol, acetate, vinyl, siloxane fragments. In some cases the side chain includes a group 14 element (silicon, germanium, tin or lead). In other cases the side chain includes a group 13 element (boron, aluminum, boron, gallium, indium). In other cases the side chain includes a group 15 element (nitrogen, phosphorous, arsenic). In other cases the side chain includes a group 16 element (oxygen, sulfur, selenium).

In another embodiment the electrochemical modifier comprises a silole. In some cases it is a phenol-silole or a silafluorene. In other cases it is a poly-silole or a poly-silafluorene. In some cases the silicon is replaced with germanium (germole or germafluorene), tin (stannole or stannaflourene) nitrogen (carbazole) or phosphorous (phosphole, phosphafluorene). In all cases the heteroatom containing material can be a small molecule, an oligomer or a polymer. Phosphorous atoms may or may not be also bonded to oxygen.

In some embodiments the reactant comprises phosphorous. In certain other embodiments, the phosphorus is in the form of phosphoric acid. In certain other embodiments, the phosphorus can be in the form of a salt, wherein the anion of the salt comprises one or more phosphate, phosphite, phosphide, hydrogen phosphate, dihydrogen phosphate, hexafluorophosphate, hypophosphite, polyphosphate, or pyrophosphate ions, or combinations thereof. In certain other embodiments, the phosphorus can be in the form of a salt, wherein the cation of the salt comprises one or more phosphonium ions. The non-phosphate containing anion or cation pair for any of the above embodiments can be chosen for those known and described in the art. In the context, exemplary cations to pair with phosphate-containing anions include, but are not limited to, ammonium, tetraethylammonium, and tetramethylammonium ions. In the context, exemplary anions to pair with phosphate-containing cations include, but are not limited to, carbonate, dicarbonate, and acetate ions.

In some embodiments, the catalyst comprises a basic volatile catalyst. For example, in one embodiment, the basic volatile catalyst comprises ammonium carbonate, ammonium bicarbonate, ammonium acetate, ammonium hydroxide, or combinations thereof. In a further embodiment, the basic volatile catalyst is ammonium carbonate. In another further embodiment, the basic volatile catalyst is ammonium acetate.

In still other embodiments, the method comprises admixing an acid. In certain embodiments, the acid is a solid at room temperature and pressure. In some embodiments, the acid is a liquid at room temperature and pressure. In some embodiments, the acid is a liquid at room temperature and pressure that does not provide dissolution of one or more of the other polymer precursors.

The acid may be selected from any number of acids suitable for the polymerization process. For example, in some embodiments the acid is acetic acid and in other embodiments the acid is oxalic acid. In further embodiments, the acid is mixed with the first or second solvent in a ratio of acid to solvent of 99:1, 90:10, 75:25, 50:50, 25:75, 20:80, 10:90 or 1:90. In other embodiments, the acid is acetic acid and the first or second solvent is water. In other embodiments, acidity is provided by adding a solid acid.

The total content of acid in the mixture can be varied to alter the properties of the final product. In some embodiments, the acid is present from about 1% to about 50% by weight of mixture. In other embodiments, the acid is present from about 5% to about 25%. In other embodiments, the acid is present from about 10% to about 20%, for example about 10%, about 15% or about 20%.

In certain embodiments, the polymer precursor components are blended together and subsequently held for a time and at a temperature sufficient to achieve polymerization. One or more of the polymer precursor components can have particle size less than about 20 mm in size, for example less than 10 mm, for example less than 7 mm, for example, less than 5 mm, for example less than 2 mm, for example less than 1 mm, for example less than 100 microns, for example less than 10 microns. In some embodiments, the particle size of one or more of the polymer precursor components is reduced during the blending process.

The blending of one or more polymer precursor components in the absence of solvent can be accomplished by methods described in the art, for example ball milling, jet milling, Fritsch milling, planetary mixing, and other mixing methodologies for mixing or blending solid particles while controlling the process conditions (e.g., temperature). The mixing or blending process can be accomplished before, during, and/or after (or combinations thereof) incubation at the reaction temperature.

Reaction parameters include aging the blended mixture at a temperature and for a time sufficient for the one or more polymer precursors to react with each other and form a polymer. In this respect, suitable aging temperature ranges from about room temperature to temperatures at or near the melting point of one or more of the polymer precursors. In some embodiments, suitable aging temperature ranges from about room temperature to temperatures at or near the glass transition temperature of one or more of the polymer precursors. For example, in some embodiments the solvent free mixture is aged at temperatures from about 20° C. to about 600° C., for example about 20° C. to about 500° C., for example about 20° C. to about 400° C., for example about 20° C. to about 300° C., for example about 20° C. to about 200° C. In certain embodiments, the solvent free mixture is aged at temperatures from about 50 to about 250° C.

The reaction duration is generally sufficient to allow the polymer precursors to react and form a polymer, for example the mixture may be aged anywhere from 1 hour to 48 hours, or more or less depending on the desired result. Typical embodiments include aging for a period of time ranging from about 2 hours to about 48 hours, for example in some embodiments aging comprises about 12 hours and in other embodiments aging comprises about 4-8 hours (e.g., about 6 hours).

In certain embodiments, an electrochemical modifier is incorporated during the above described polymerization process. For example, in some embodiments, an electrochemical modifier in the form of metal particles, metal paste, metal salt, metal oxide or molten metal can be dissolved or suspended into the mixture from which the gel resin is produced Exemplary electrochemical modifiers for producing composite materials may fall into one or more than one of the chemical classifications. In some embodiments, the electrochemical modifier is a lithium salt, for example, but not limited to, lithium fluoride, lithium chloride, lithium carbonate, lithium hydroxide, lithium benzoate, lithium bromide, lithium formate, lithium hexafluorophosphate, lithium iodate, lithium iodide, lithium perchlorate, lithium phosphate, lithium sulfate, lithium tetraborate, lithium tetrafluoroborate, and combinations thereof.

In certain embodiments, the electrochemical modifier comprises a metal, and exemplary species includes, but are not limited to aluminum isoproproxide, manganese acetate, nickel acetate, iron acetate, tin chloride, silicon chloride, and combinations thereof. In certain embodiments, the electrochemical modifier is a phosphate compound, including but not limited to phytic acid, phosphoric acid, ammonium dihydrogenphosphate, and combinations thereof. In certain embodiments, the electrochemical modifier comprises silicon, and exemplary species includes, but are not limited to silicon powders, silicon nanotubes, polycrystalline silicon, nanocrystalline silicon, amorphous silicon, porous silicon, nano sized silicon, nano-featured silicon, nano-sized and nano-featured silicon, silicyne, and black silicon, and combinations thereof.

Electrochemical modifiers can be combined with a variety of polymer systems through either physical mixing or chemical reactions with latent (or secondary) polymer functionality. Examples of latent polymer functionality include, but are not limited to, epoxide groups, unsaturation (double and triple bonds), acid groups, alcohol groups, amine groups, basic groups. Crosslinking with latent functionality can occur via heteroatoms (e.g. vulcanization with sulfur, acid/base/ring opening reactions with phosphoric acid), reactions with organic acids or bases (described above), coordination to transition metals (including but not limited to Ti, Cr, Mn, Fe, Co, Ni, Cu, Zn, Zr, Nb, Mo, Ag, Au), ring opening or ring closing reactions (rotaxanes, spiro compounds, etc).

Electrochemical modifiers can also be added to the polymer system through physical blending. Physical blending can include but is not limited to melt blending of polymers and/or co-polymers, the inclusion of discrete particles, chemical vapor deposition of the electrochemical modifier and coprecipitation of the electrochemical modifier and the main polymer material.

In some instances the electrochemical modifier can be added via a metal salt solid, solution, or suspension. The metal salt solid, solution or suspension may comprise acids and/or alcohols to improve solubility of the metal salt. In yet another variation, the polymer gel (either before or after an optional drying step) is contacted with a paste comprising the electrochemical modifier. In yet another variation, the polymer gel (either before or after an optional drying step) is contacted with a metal or metal oxide sol comprising the desired electrochemical modifier.

In addition to the above exemplified electrochemical modifiers, the composite materials may comprise one or more additional forms (i.e., allotropes) of carbon. In this regard, it has been found that inclusion of different allotropes of carbon such as graphite, amorphous carbon, conductive carbon, carbon black, diamond, C60, carbon nanotubes (e.g., single and/or multi-walled), graphene and/or carbon fibers into the composite materials is effective to optimize the electrochemical properties of the composite materials. The various allotropes of carbon can be incorporated into the carbon materials during any stage of the preparation process described herein. For example, during the solution phase, during the gelation phase, during the curing phase, during the pyrolysis phase, during the milling phase, or after milling. In some embodiments, the second carbon form is incorporated into the composite material by adding the second carbon form before or during polymerization of the polymer gel as described in more detail herein. The polymerized polymer gel containing the second carbon form is then processed according to the general techniques described herein to obtain a carbon material containing a second allotrope of carbon.

In a preferred embodiment, the carbon is produced from precursors with little of no solvent required for processing (solven free). The structure of the polymer precursors suitable for use in a low solvent or essentially solvent free reaction mixture is not particularly limited, provided that the polymer precursor is capable of reacting with another polymer precursor or with a second polymer precursor to form a polymer. Polymer precursors include amine-containing compounds, alcohol-containing compounds and carbonyl-containing compounds, for example in some embodiments the polymer precursors are selected from an alcohol, a phenol, a polyalcohol, a sugar, an alkyl amine, an aromatic amine, an aldehyde, a ketone, a carboxylic acid, an ester, a urea, an acid halide and an isocyanate.

In one embodiment employing a low or essentially solvent free reaction mixture, the method comprises use of a first and second polymer precursor, and in some embodiments the first or second polymer precursor is a carbonyl containing compound and the other of the first or second polymer precursor is an alcohol containing compound. In some embodiments, a first polymer precursor is a phenolic compound and a second polymer precursor is an aldehyde compound (e.g., formaldehyde). In one embodiment, of the method the phenolic compound is phenol, resorcinol, catechol, hydroquinone, phloroglucinol, or a combination thereof; and the aldehyde compound is formaldehyde, acetaldehyde, propionaldehyde, butyraldehyde, benzaldehyde, cinnamaldehyde, or a combination thereof. In a further embodiment, the phenolic compound is resorcinol, phenol or a combination thereof, and the aldehyde compound is formaldehyde. In yet further embodiments, the phenolic compound is resorcinol and the aldehyde compound is formaldehyde. In some embodiments, the polymer precursors are alcohols and carbonyl compounds (e.g., resorcinol and aldehyde) and they are present in a ratio of about 0.5:1.0, respectively.

The polymer precursor materials suitable for low or essentially solvent free reaction mixture as disclosed herein include (a) alcohols, phenolic compounds, and other mono- or polyhydroxy compounds and (b) aldehydes, ketones, and combinations thereof. Representative alcohols in this context include straight chain and branched, saturated and unsaturated alcohols. Suitable phenolic compounds include polyhydroxy benzene, such as a dihydroxy or trihydroxy benzene. Representative polyhydroxy benzenes include resorcinol (i.e., 1,3-dihydroxy benzene), catechol, hydroquinone, and phloroglucinol. Other suitable compounds in this regard are bisphenols, for instance, bisphenol A. Mixtures of two or more polyhydroxy benzenes can also be used. Phenol (monohydroxy benzene) can also be used. Representative polyhydroxy compounds include sugars, such as glucose, sucrose, fructose, chitin and other polyols, such as mannitol. Aldehydes in this context include: straight chain saturated aldeydes such as methanal (formaldehyde), ethanal (acetaldehyde), propanal (propionaldehyde), butanal (butyraldehyde), and the like; straight chain unsaturated aldehydes such as ethenone and other ketenes, 2-propenal (acrylaldehyde), 2-butenal (crotonaldehyde), 3 butenal, and the like; branched saturated and unsaturated aldehydes; and aromatic-type aldehydes such as benzaldehyde, salicylaldehyde, hydrocinnamaldehyde, and the like. Suitable ketones include: straight chain saturated ketones such as propanone and 2 butanone, and the like; straight chain unsaturated ketones such as propenone, 2 butenone, and 3 butenone (methyl vinyl ketone) and the like; branched saturated and unsaturated ketones; and aromatic-type ketones such as methyl benzyl ketone (phenylacetone), ethyl benzyl ketone, and the like. The polymer precursor materials can also be combinations of the precursors described above.

In some embodiments, one polymer precursor in the low or essentially solvent free reaction mixture is an alcohol-containing species and another polymer precursor is a carbonyl-containing species. The relative amounts of alcohol-containing species (e.g., alcohols, phenolic compounds and mono- or poly-hydroxy compounds or combinations thereof) reacted with the carbonyl containing species (e.g. aldehydes, ketones or combinations thereof) can vary substantially. In some embodiments, the ratio of alcohol-containing species to aldehyde species is selected so that the total moles of reactive alcohol groups in the alcohol-containing species is approximately the same as the total moles of reactive carbonyl groups in the aldehyde species. Similarly, the ratio of alcohol-containing species to ketone species may be selected so that the total moles of reactive alcohol groups in the alcohol containing species is approximately the same as the total moles of reactive carbonyl groups in the ketone species. The same general 1:1 molar ratio holds true when the carbonyl-containing species comprises a combination of an aldehyde species and a ketone species.

In other embodiments, the polymer precursor in the low or essentially solvent free reaction mixture is a urea or an amine containing compound. For example, in some embodiments the polymer precursor is urea, melamine, hexamethylenetetramine (HMT) or combination thereof. Other embodiments include polymer precursors selected from isocyanates or other activated carbonyl compounds such as acid halides and the like.

Some embodiments of the disclosed methods include preparation of low or solvent-free polymer gels (and carbon materials) comprising electrochemical modifiers. Such electrochemical modifiers include, but are not limited to nitrogen, silicon, and sulfur. In other embodiments, the electrochemical modifier comprises fluorine, iron, tin, silicon, nickel, aluminum, zinc, or manganese. The electrochemical modifier can be included in the preparation procedure at any step. For example, in some the electrochemical modifier is admixed with the mixture, the polymer phase or the continuous phase.

The blending of one or more polymer precursor components in the absence of solvent can be accomplished by methods described in the art, for example ball milling, jet milling, Fritsch milling, planetary mixing, and other mixing methodologies for mixing or blending solid particles while controlling the process conditions (e.g., temperature). The mixing or blending process can be accomplished before, during, and/or after (or combinations thereof) incubation at the reaction temperature.

Reaction parameters include aging the blended mixture at a temperature and for a time sufficient for the one or more polymer precursors to react with each other and form a polymer. In this respect, suitable aging temperature ranges from about room temperature to temperatures at or near the melting point of one or more of the polymer precursors. In some embodiments, suitable aging temperature ranges from about room temperature to temperatures at or near the glass transition temperature of one or more of the polymer precursors. For example, in some embodiments the solvent free mixture is aged at temperatures from about 20° C. to about 600° C., for example about 20° C. to about 500° C., for example about 20° C. to about 400° C., for example about 20° C. to about 300° C., for example about 20° C. to about 200° C. In certain embodiments, the solvent free mixture is aged at temperatures from about 50 to about 250° C.

The porous carbon material can be achieved via pyrolysis of a polymer produced from precursors materials as described above. In some embodiments, the porous carbon material comprises an amorphous activated carbon that is produced by pyrolysis, physical or chemical activation, or combination thereof in either a single process step or sequential process steps.

The temperature and dwell time of pyrolysis can be varied, for example the dwell time van vary from 1 min to 10 min, from 10 min to 30 min, from 30 min to 1 hour, for 1 hour to 2 hours, from 2 hours to 4 hours, from 4 hours to 24 h. The temperature can be varied, for example, the pyrolysis temperature can vary from 200 to 300 C, from 250 to 350 C, from 350 C to 450 C, from 450 C to 550 C, from 540 C to 650 C, from 650 C to 750 C, from 750 C to 850 C, from 850 C to 950 C, from 950 C to 1050 C, from 1050 C to 1150 C, from 1150 C to 1250 C The pyrolysis can be accomplished in an inert gas, for example nitrogen, or argon.

In some embodiments, an alternate gas is used to further accomplish carbon activation. In certain embodiments, pyrolysis and activation are combined. Suitable gases for accomplishing carbon activation include, but are not limited to, carbon dioxide, carbon monoxide, water (steam), air, oxygen, and further combinations thereof. The temperature and dwell time of activation can be varied, for example the dwell time van vary from 1 min to 10 min, from 10 min to 30 min, from 30 min to 1 hour, for 1 hour to 2 hours, from 2 hours to 4 hours, from 4 hours to 24 h. The temperature can be varied, for example, the pyrolysis temperature can vary from 200 to 300 C, from 250 to 350 C, from 350 C to 450 C, from 450 C to 550 C, from 540 C to 650 C, from 650 C to 750 C, from 750 C to 850 C, from 850 C to 950 C, from 950 C to 1050 C, from 1050 C to 1150 C, from 1150 C to 1250 C.

Either prior to the pyrolysis, and/or after pyrolysis, and/or after activation, the carbon may be subjected to a particle size reduction. The particle size reduction can be accomplished by a variety of techniques known in the art, for example by jet milling in the presence of various gases including air, nitrogen, argon, helium, supercritical steam, and other gases known in the art. Other particle size reduction methods, such as grinding, ball milling, jet milling, water jet milling, and other approaches known in the art are also envisioned.

The porous carbon scaffold may be in the form of particles. The particle size and particle size distribution can be measured by a variety of techniques known in the art, and can be described based on fractional volume. In this regard, the $D_{v,50}$ of the carbon scaffold may be between 10 nm and 10 mm, for example between 100 nm and 1 mm, for example between 1 um and 100 um, for example between 2 um and 50 um, example between 3 um and 30 um, example between 4 um and 20 um, example between 5 um and 10 um. In certain embodiments, the $D_{v,50}$ is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the $D_{v,100}$ is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the $D_{v,99}$ is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the $D_{v,90}$ is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the $D_{v,0}$ is greater than 10 nm, for example greater than 100 nm, for example greater than 500 nm, for example greater than 1 um, for example greater than 2 um, for example greater than 5 um, for example greater than 10 um. In certain embodiments, the $D_{v,1}$ is greater than 10 nm, for example greater than 100 nm, for example greater than 500 nm, for example greater than 1 um, for example greater than 2 um, for example greater than 5 um, for example greater than 10 um. In certain embodiments, the $D_{v,10}$ is greater than 10 nm, for example greater than 100 nm, for example greater than 500 nm, for example greater than 1 um, for example greater than 2 um, for example greater than 5 um, for example greater than 10 um.

In some embodiments, the surface area of the porous carbon scaffold can comprise a surface area greater than 400 m2/g, for example greater than 500 m2/g, for example greater than 750 m2/g, for example greater than 1000 m2/g, for example greater than 1250 m2/g, for example greater than 1500 m2/g, for example greater than 1750 m2/g, for example greater than 2000 m2/g, for example greater than 2500 m2/g, for example greater than 3000 m2/g. In other embodiments, the surface area of the porous carbon scaffold can be less than 500 m2/g. In some embodiments, the surface area of the porous carbon scaffold is between 200 and 500 m2/g. In some embodiments, the surface area of the porous carbon scaffold is between 100 and 200 m2/g. In some embodiments, the surface area of the porous carbon scaffold is between 50 and 100 m2/g. In some embodiments, the surface area of the porous carbon scaffold is between 10 and 50 m2/g. In some embodiments, the surface area of the porous carbon scaffold can be less than 10 m2/g.

In some embodiments, the pore volume of the porous carbon scaffold is greater than 0.4 cm3/g, for example greater than 0.5 cm3/g, for example greater than 0.6 cm3/g, for example greater than 0.7 cm3/g, for example greater than 0.8 cm3/g, for example greater than 0.9 cm3/g, for example greater than 1.0 cm3/g, for example greater than 1.1 cm3/g, for example greater than 1.2 cm3/g, for example greater than 1.4 cm3/g, for example greater than 1.6 cm3/g, for example greater than 1.8 cm3/g, for example greater than 2.0 cm3/g. In other embodiments, the pore volume of the porous silicon scaffold is less than 0.5 cm3, for example between 0.1 cm3/g and 0.5 cm3/g. In certain other embodiments, the pore volume of the porous silicon scaffold is between 0.01 cm3/g and 0.1 cm3/g.

In some other embodiments, the porous carbon scaffold is an amorphous activated carbon with a pore volume between 0.2 and 2.0 cm3/g. In certain embodiments, the carbon is an amorphous activated carbon with a pore volume between 0.4 and 1.5 cm3/g. In certain embodiments, the carbon is an amorphous activated carbon with a pore volume between 0.5 and 1.2 cm3/g. In certain embodiments, the carbon is an amorphous activated carbon with a pore volume between 0.6 and 1.0 cm3/g.

In some other embodiments, the porous carbon scaffold comprises a tap density of less than 1.0 g/cm3, for example less than 0.8 g/cm3, for example less than 0.6 g/cm3, for example less than 0.5 g/cm3, for example less than 0.4 g/cm3, for example less than 0.3 g/cm3, for example less than 0.2 g/cm3, for example less than 0.1 g/cm3.

The surface functionality of the porous carbon scaffold can vary. One property which can be predictive of surface functionality is the pH of the porous carbon scaffold. The presently disclosed porous carbon scaffolds comprise pH values ranging from less than 1 to about 14, for example less than 5, from 5 to 8 or greater than 8. In some embodiments, the pH of the porous carbon is less than 4, less than 3, less than 2 or even less than 1. In other embodiments, the pH of the porous carbon is between about 5 and 6, between about 6 and 7, between about 7 and 8 or between 8 and 9 or between 9 and 10. In still other embodiments, the pH is high and the pH of the porous carbon ranges is greater than 8, greater than 9, greater than 10, greater than 11, greater than 12, or even greater than 13.

The pore volume distribution of the porous carbon scaffold can vary. For example, the % micropores can comprise less than 30%, for example less than 20%, for example less than 10%, for example less than 5%, for example less than 4%, for example less than 3%, for example less than 2%, for example less than 1%, for example less than 0.5%, for example less than 0.2%, for example, less than 0.1%. In certain embodiments, there is no detectable micropore volume in the porous carbon scaffold.

The mesopores comprising the porous carbon scaffold can vary. For example, the % mesopores can comprise less than 30%, for example less than 20%, for example less than 10%, for example less than 5%, for example less than 4%, for example less than 3%, for example less than 2%, for example less than 1%, for example less than 0.5%, for example less than 0.2%, for example, less than 0.1%. In certain embodiments, there is no detectable mesopore volume in the porous carbon scaffold.

In some embodiments, the pore volume distribution of the porous carbon scaffold scaffold comprises more than 50% macropores, for example more than 60% macropores, for example more than 70% macropores, for example more than 80% macropores, for example more than 90% macropores, for example more than 95% macropores, for example more than 98% macropores, for example more than 99% macropores, for example more than 99.5% macropores, for example more than 99.9% macropores.

In certain preferred embodiments, the pore volume of the porous carbon scaffold comprises a blend of micropores, mesopores, and macropores. Accordingly, in certain embodiments, the porous carbon scaffold comprises 0-20% micropores, 30-70% mesopores, and less than 10% macropores. In certain other embodiments, the porous carbon scaffold comprises 0-20% micropores, 0-20% mesopores, and 70-95% macropores. In certain other embodiments, the porous carbon scaffold comprises 20-50% micropores, 50-80% mesopores, and 0-10% macropores. In certain other embodiments, the porous carbon scaffold comprises 40-60% micropores, 40-60% mesopores, and 0-10% macropores. In certain other embodiments, the porous carbon scaffold comprises 80-95% micropores, 0-10% mesopores, and 0-10% macropores. In certain other embodiments, the porous carbon scaffold comprises 0-10% micropores, 30-50% mesopores, and 50-70% macropores. In certain other embodiments, the porous carbon scaffold comprises 0-10% micropores, 70-80% mesopores, and 0-20% macropores. In certain other embodiments, the porous carbon scaffold comprises 0-20% micropores, 70-95% mesopores, and 0-10% macropores. In certain other embodiments, the porous carbon scaffold comprises 0-10% micropores, 70-95% mesopores, and 0-20% macropores.

In certain embodiments, the % of pore volume in the porous carbon scaffold representing pores between 100 and 1000 A (10 and 100 nm) comprises greater than 30% of the total pore volume, for example greater than 40% of the total pore volume, for example greater than 50% of the total pore volume, for example greater than 60% of the total pore volume, for example greater than 70% of the total pore volume, for example greater than 80% of the total pore volume, for example greater than 90% of the total pore volume, for example greater than 95% of the total pore volume, for example greater than 98% of the total pore volume, for example greater than 99% of the total pore volume, for example greater than 99.5% of the total pore volume, for example greater than 99.9% of the total pore volume.

In certain embodiments, the pycnometry density of the porous carbon scaffold ranges from about 1 g/cc to about 3 g/cc, for example from about 1.5 g/cc to about 2.3 g/cc. In other embodiments, the skeletal density ranges from about 1.5 cc/g to about 1.6 cc/g, from about 1.6 cc/g to about 1.7 cc/g, from about 1.7 cc/g to about 1.8 cc/g, from about 1.8 cc/g to about 1.9 cc/g, from about 1.9 cc/g to about 2.0 cc/g, from about 2.0 cc/g to about 2.1 cc/g, from about 2.1 cc/g to about 2.2 cc/g or from about 2.2 cc/g to about 2.3 cc/g, from about 2.3 cc to about 2.4 cc/g, for example from about 2.4 cc/g to about 2.5 cc/g.

C. Silicon Production Via Chemical Vapor Infiltration (CVI)

Chemical vapor deposition (CVD) is a process wherein a substrate provides a solid surface comprising the first component of the composite, and the gas thermally decomposes on this solid surface to provide the second component of composite. Such a CVD approach can be employed, for instance, to create Si—C composite materials wherein the silicon is coating on the outside surface of silicon particles. Alternatively, chemical vapor infiltration (CVI) is a process wherein a substrate provides a porous scaffold comprising the first component of the composite, and the gas thermally decomposes on into the porosity (into the pores) of the porous scaffold material to provide the second component of composite.

In an embodiment, silicon is created within the pores of the porous carbon scaffold by subjecting the porous carbon particles to a silicon containing precursor gas at elevated temperature and the presence of a silicon-containing gas, preferably silane, in order to decompose said gas into silicon. In some embodiments, the silicon containing gas may comprise a higher-order silane (such as di-, tri-, and/or tetrasilane), chlorosilane(s) (such as mono-,di-, tri-, and tetrachlorosilane) or mixtures thereof.

The silicon containing precursor gas can be mixed with other inert gas(es), for example, nitrogen gas, or hydrogen gas, or argon gas, or helium gas, or combinations thereof. The temperature and time of processing can be varied, for example the temperature can be between 200 and 900 C, for example between 200 and 250 C, for example between 250 and 300 C, for example between 300 and 350 C, for example between 300 and 400 C, for example 300 and 500 C, for example between 350 and 450 C, for example between 350 and 400 C, for example 350 and 500 C, for example 350 to 550 C, for example between 400 and 500 C, for example between 500 and 600 C, for example between 600 and 700 C, for example between 700 and 800 C, for example between 800 and 900 C, for example between 600 and 1100 C.

The mixture of gas can comprise between 0.1 and 1% silane and remainder inert gas. Alternatively, the mixture of gas can comprise between 1% and 10% silane and remainder inert gas. Alternatively, the mixture of gas can comprise between 10% and 20% silane and remainder inert gas. Alternatively, the mixture of gas can comprise between 20% and 50% silane and remainder inert gas. Alternatively, the mixture of gas can comprise above 50% silane and remainder inert gas. Alternatively, the gas can essentially be 100% silane gas. Suitable inert gases include, but are not limited to, hydrogen, nitrogen, argon, and combinations thereof.

The pressure for the CVI process can be varied. In some embodiments, the pressure is atmospheric pressure. In some embodiments, the pressure is below atmospheric pressure. In some embodiments, the pressure is above atmospheric pressure.

C. Physico- and Electrochemical Properties of Silicon-Carbon Composite

While not wishing to be bound by theory, it is believed that the nano sized silicon achieved as a result of filling in certain, desired pore volume structure of the porous carbon scaffold (for instance, silicon filling pores in the range of 5 to 1000 nm, or other range as disclosed elsewhere herein), along with the advantageous properties of the other components of the composite, including low surface area, low pycnometry density, yield composite materials having different and advantageous properties, for instance electrochemical performance when the composite comprises an anode of a lithium ion energy storage device.

In certain embodiments, the embedded silicon particles embedded within the composite comprise nano-sized features. The nano-sized features can have a characteristic length scale of preferably less than 1 um, preferably less than 300 nm, preferably less than 150 nm, preferably less than 100 um, preferably less than 50 nm, preferably less than 30 nm, preferably less than 15 nm, preferably less than 10 nm, preferably less than 5 nm.

In certain embodiments, the silicon embedded within the composite is spherical in shape. In certain other embodiments, the porous silicon particles are non-spherical, for example rod-like, or fibrous in structure. In some embodiments, the silicon exists as a layer coating the inside of pores within the porous carbon scaffold. The depth of this silicon layer can vary, for example the depth can between 5 nm and 10 nm, for example between 5 nm and 20 nm, for example between 5 nm and 30 nm, for example between 5 nm and 33 nm, for example between 10 nm and 30 nm, for example between 10 nm and 50 nm, for example between 10 nm and 100 nm, for example between 10 and 150 nm, for example between 50 nm and 150 nm, for example between 100 and 300 nm, for example between 300 and 1000 nm.

In some embodiments, the silicon embedded within the composite is nano sized, and resides within pores of the porous carbon scaffold. For example, the embedded silicon can be impregnated, deposited by CVI, or other appropriate process into pores within the porous carbon particle comprising pore sizes between 5 and 1000 nm, for example between 10 and 500 nm, for example between 10 and 200 nm, for example between 10 and 100 nm, for example between 33 and 150 nm, for example between and 20 and 100 nm. Other ranges of carbon pores sizes with regards to fractional pore volume, whether micropores, mesopores, or macropores, are also envisioned.

In some embodiments, the carbon scaffold pore volume distribution can be described as the number or volume distribution of pores as determined as known in the art based on gas sorption analysis, for example nitrogen gas sorption analysis. In some embodiments the pore size distribution can be expressed in terms of the pore size at which a certain fraction of the total pore volume resides at or below. For example, the pore size at which 10% of the pores reside at or below can be expressed at DPv10.

The DPv10 for the porous carbon scaffold can vary, for example DPv10 can be between 0.01 nm and 100 nm, for example between 0.1 nm and 100 nm, for example between 1 nm and 100 nm, for example between 1 nm and 50 nm, for example between 1 nm and 40 nm, for example between 1 nm and 30 nm, for example between 1 nm and 10 nm, for example between 1 nm and 5 nm.

The DPv50 for the porous carbon scaffold can vary, for example DPv50 can be between 0.01 nm and 100 nm, for example between 0.1 nm and 100 nm, for example between 1 nm and 100 nm, for example between 1 nm and 50 nm, for example between 1 nm and 40 nm, for example between 1 nm and 30 nm, for example between 1 nm and 10 nm, for example between 1 nm and 5 nm. In other embodiments, the DPv50 is between 2 and 100, for example between 2 and 50, for example between 2 and 30, for example between 2 and 20, for example between 2 and 15, for example between 2 and 10.

The DPv90 for the porous carbon scaffold can vary, for example DPv90 can be between 0.01 nm and 100 nm, for example between 0.1 nm and 100 nm, for example between 1 nm and 100 nm, for example between 1 nm and 50 nm, for example between 1 nm and 50 nm, for example between 1 nm and 40 nm, for example between 1 nm and 30 nm, for example between 1 nm and 10 nm, for example between 1 nm and 5 nm. In other embodiments, the DPv50 is between 2 nm and 100 nm, for example between 2 nm and 50 nm, for example between 2 nm and 30 nm, for example between 2 nm and 20 nm, for example between 2 nm and 15 nm, for example between 2 nm and 10 nm.

In some embodiments, the DPv90 is less than 100 nm, for example less than 50 nm, for example less than 40 nm, for example less than 30 nm, for example less than 20 nm, for example less than 15 nm, for example less than 10 nm. In some embodiments, the carbon scaffold comprises a pore volume with greater than 70% micropores (and DPv90 less than 100 nm, for example DPv90 less than 50 nm, for example DPv90 less than 40 nm, for example DPv90 less than 30 nm, for example DPv90 less than 20 nm, for example DPv90 less than 15 nm, for example DPv90 less than 10 nm, for example DPv90 less than 5 nm, for example DPv90 less than 4 nm, for example DPv90 less than 3 nm. In other embodiments, the carbon scaffold comprises a pore volume with greater than 80% micropores and DPv90 less than 100 nm, for example DPv90 less than 50 nm, for example DPv90 less than 40 nm, for example DPv90 less than 30 nm, for example DPv90 less than 20 nm, for example DPv90 less than 15 nm, for example DPv90 less than 10 nm, for example DPv90 less than 5 nm, for example DPv90 less than 4 nm, for example DPv90 less than 3 nm.

The DPv99 for the porous carbon scaffold can vary, for example DPv99 can be between 0.01 nm and 1000 nm, for example between 0.1 nm and 1000 nm, for example between 1 nm and 500 nm, for example between 1 nm and 200 nm, for example between 1 nm and 150 nm, for example between 1 nm and 100 nm, for example between 1 nm and 50 nm, for example between 1 nm and 20 nm. In other embodiments, the DPv99 is between 2 nm and 500 nm, for example between 2 nm and 200 nm, for example between 2 nm and 150 nm, for example between 2 nm and 100 nm, for example between 2 nm and 50 nm, for example between 2 nm and 20 nm, for example between 2 nm and 15 nm, for example between 2 nm and 10 nm.

Embodiments of the composite with extremely durable intercalation of lithium disclosed herein improves the properties of any number of electrical energy storage devices, for example lithium ion batteries. In some embodiments, the silicon-carbon composite disclosed herein exhibits a Z less than 10, for example a Z less than 5, for example a Z less than 4, for example a Z less than 3, for example a Z less than 2, for example a Z less than 1, for example a Z less than 0.1, for example a Z less than 0.01, for example a Z less than 0.001. In certain embodiments, the Z is zero.

In certain preferred embodiment, the silicon-carbon composite comprises desirably low Z in combination with another desired physicochemical and/or electrochemical property or in combination with more than one other desired physicochemical and/or electrochemical properties. Table 1 provides a description of certain embodiments for combination of properties for the silicon-carbon composite.

TABLE 1

Embodiments for silicon-carbon composite with embodied properties.

In some embodiments the silicon-carbon composite comprises . . .

| | |
|---|---|
| Z | <10, <5, <4, <3, <2, <1, <0.1, <0.01, <0.01, 0 |
| Surface Area | <100 m2/g, <50 m2/g, <30 m2/g, <20 m2/g, <10 m2/g, <5 m2/g, <4 m2/g, <3 m2/g, <2 m2/g, <1 m2/g; |
| First Cycle Efficiency | >75%, >80%, >85%, >90%, >91%, >92%, >93%, >94%, >95%, >96%, >97%, >98%, >99%; |
| Reversible Capacity | >1300 mAh/g, >1600 mAh/g, >1700 mAh/g, >1800 mAh/g, >1900 mAh/g, >2000 mAh/g, >2100 mAh/g, >2200 mAh/g, >2300 mAh/g, >2400 mAh/g, >2500 mAh/g, >2600 mAh/g, >2700 mAh/g, >2800 mAh/g, >2900 mAh/g, >3000 mAh/g; and/or |
| Silicon Content by weight | 10%-90%, 15-85%, 20%-80%, 30%-70%, 40%-60%. |

According to Table 1, the silicon-carbon composite may comprise combinations of various properties. For example, the silicon-carbon composite may comprise a Z less than 10, surface area less than 100 m2/g, a first cycle efficiency greater than 80%, and a reversible capacity of at least 1300 mAh/g. For example, the silicon-carbon composite may comprise a Z less than 10, surface area less than 100 m2/g, a first cycle efficiency greater than 80%, and a reversible capacity of at least 1600 mAh/g. For example, the silicon-carbon composite may comprise a Z less than 10, surface area less than 20 m2/g, a first cycle efficiency greater than 85%, and a reversible capacity of at least 1600 mAh/g. For example, the silicon-carbon composite may comprise a Z less than 10, surface area less than 10 m2/g, a first cycle efficiency greater than 85%, and a reversible capacity of at least 1600 mAh/g. For example, the silicon-carbon composite may comprise a Z less than 10, surface area less than 10 m2/g, a first cycle efficiency greater than 90%, and a reversible capacity of at least 1600 mAh/g. For example, the silicon-carbon composite may comprise a Z less than 10, surface area less than 10 m2/g, a first cycle efficiency greater than 90%, and a reversible capacity of at least 1800 mAh/g.

The silicon-carbon composite can comprise a combination of the aforementioned properties, in addition to also comprising a carbon scaffold comprising properties also described within this proposal. Accordingly, Table 2 provides a description of certain embodiments for combination of properties for the silicon-carbon composite.

TABLE 2

Embodiments for silicon-carbon composite with embodied properties.

In some embodiments the silicon-carbon composite comprises . . .

| | |
|---|---|
| Z | <10, <5, <4, <3, <2, <1, <0.1, <0.01, <0.01, 0 |
| Surface Area | <100 m2/g, <50 m2/g, <30 m2/g, <20 m2/g, <10 m2/g, <5 m2/g, <4 m2/g, <3 m2/g, <2 m2/g, <1 m2/g; |
| First Cycle Efficiency | >75%, >80%, >85%, >90%, >91%, >92%, >93%, >94%, >95%, >96%, >97%, >98%, >99%; |

TABLE 2-continued

Embodiments for silicon-carbon composite with embodied properties.

In some embodiments the silicon-carbon composite comprises . . .

| | |
|---|---|
| Reversible Capacity | >1300 mAh/g, >1600 mAh/g, >1700 mAh/g, >1800 mAh/g, >1900 mAh/g, >2000 mAh/g, >2100 mAh/g, >2200 mAh/g, >2300 mAh/g, >2400 mAh/g, >2500 mAh/g, >2600 mAh/g, >2700 mAh/g, >2800 mAh/g, >2900 mAh/g, >3000 mAh/g; |
| Silicon Content by weight | 10%-90%, 15-85%, 20%-80%, 30%-70%, 40%-60%; |
| Carbon Scaffold pore volume | 0.1-1.5 cm3/g, 0.2-1.2 cm3/g, 0.3-1.1 cm3/g, 0.4-1.0 cm3/g, 0.4-1.0 cm3/g, 0.5-1.0 cm3/g, 0.6-1.0 cm3/g, 0.5-0.9 cm3/g, 0.4-1.0 cm3/g, >0.1 cm3/g, >0.2 cm3/g, >0.4 cm3/g, >0.6 cm3/g, >0.8 cm3/g; |
| % silicon content | 15%-25%, 25%-35%, 20%-40%, 25%-50%, 30%-70%, 30%-60%, 60%-80%, 80%-100%; |
| Scaffold pore size range | <1 nm, 1-5 nm, 5-1000 nm, 10-500 nm, 10-200 nm, 10-100 nm, 33-150 nm, 20-100 nm; and/or |
| Percentage of micro-porosity/ meso-porosity/ macro-porosity expressed as percentage of total pore volume | >20%/>30%/>30%, <10/>30/>30, <5/>30/>30, <5/>40/>40, <1/>40/>40, <10/>70/>20, <10/>20/>70, >10/>10/>80, <10/>80/>10, <5/>70/>20, <5/>20/>70,<5/>5/>80, <5/>80/>10, >80%/<20%/<20%, >70/<30/<10, >70/<30/<5, >70/<20/<10, >70/<10/<10, >70/<10/<5, >70/<5/<5, >80/<20/<10, >80/<20/<5, >80/<20/<1, >80/<10/<10, >80/<10/<5, >80/<10/<1, >90/< 10/<10, >90/<10/<5, >90/<10/<1, >90/<5/<1, >95/<5/<5, >90/<5/<1 |

As used in herein, the percentage "microporosity," "mesoporosity" and "macroporosity" refers to the percent of micropores, mesopores and macropores, respectively, as a percent of total pore volume. For example, a carbon scaffold having 90% microporosity is a carbon scaffold where 90% of the total pore volume of the carbon scaffold is formed by micropores.

According to Table 2, the silicon-carbon composite may comprise combinations of various properties. For example, the silicon-carbon composite may comprise a Z less than 10, surface area less than 100 m2/g, a first cycle efficiency greater than 80%, a reversible capacity of at least 1600 mAh/g, a silicon content of 15%-85%, a carbon scaffold total pore volume of 0.2-1.2 cm3/g wherein the scaffold pore volume comprises >80% micropores, <20% mesopores, and <10% macropores. For example, the silicon-carbon composite may comprise a Z less than 10, surface area less than 20 m2/g, a first cycle efficiency greater than 85%, and a reversible capacity of at least 1600 mAh/g, a silicon content of 15%-85%, a carbon scaffold total pore volume of 0.2-1.2 cm3/g wherein the scaffold pore volume comprises >80% micropores, <20% mesopores, and <10% macropores. For example, the silicon-carbon composite may comprise a Z less than 10, surface area less than 10 m2/g, a first cycle efficiency greater than 85%, and a reversible capacity of at least 1600 mAh/g, a silicon content of 15%-85%, a carbon scaffold total pore volume of 0.2-1.2 cm3/g wherein the scaffold pore volume comprises >80% micropores, <20% mesopores, and <10% macropores. For example, the silicon-carbon composite may comprise a Z less than 10, surface area less than 10 m2/g, a first cycle efficiency greater than 90%, and a reversible capacity of at least 1600 mAh/g, a silicon content of 15%-85%, a carbon scaffold total pore volume of 0.2-1.2 cm3/g wherein the scaffold pore volume comprises >80% micropores, <20% mesopores, and <10% macropores. For example, the silicon-carbon composite may comprise a Z less than 10, surface area less than 10 m2/g, a first cycle efficiency greater than 90%, and a reversible capacity of at least 1800 mAh/g, a silicon content of 15%-85%, a carbon scaffold total pore volume of 0.2-1.2 cm3/g wherein the scaffold pore volume comprises >80% micropores, <20% mesopores, and <10% macropores.

Without being bound by theory, the filling of silicon within the pores of the porous carbon traps porosity within the porous carbon scaffold particle, resulting in inaccessible volume, for example volume that is inaccessible to nitrogen gas. Accordingly, the silicon-carbon composite material may exhibit a pycnometry density of less than 2.1 g/cm3, for example less than 2.0 g/cm3, for example less than 1.9 g/cm3, for example less than 1.8 g/cm3, for example less than 1.7 g/cm3, for example less than 1.6 g/cm3, for example less than 1.4 g/cm3, for example less than 1.2 g/cm3, for example less than 1.0 g/cm3.

In some embodiments, the silicon-carbon composite material may exhibit a pycnometry density between 1.7 g·cm3 and 2.1 g/cm3, for example between 1.7 g·cm3 and 1.8 g/cm3, between 1.8 g·cm3 and 1.9 g/cm3, for example between 1.9 g·cm3 and 2.0 g/cm3, for example between 2.0 g·cm3 and 2.1 g/cm3. In some embodiments, the silicon-carbon composite material may exhibit a pycnometry density between 1.8 g·cm3 and 2.1 g/cm3. In some embodiments, the silicon-carbon composite material may exhibit a pycnometry density between 1.8 g·cm3 and 2.0 g/cm3. In some embodiments, the silicon-carbon composite material may exhibit a pycnometry density between 1.9 g·cm3 and 2.1 g/cm3.

The pore volume of the composite material exhibiting extremely durable intercalation of lithium can range between 0.01 cm3/g and 0.2 cm3/g. In certain embodiments, the pore volume of the composite material can range between 0.01 cm3/g and 0.15 cm3/g, for example between 0.01 cm3/g and 0.1 cm3/g, for example between 0.01 cm3/g and 0.05 cm2/g.

The particle size distribution of the composite material exhibiting extremely durable intercalation of lithium is important to both determine power performance as well as volumetric capacity. As the packing improves, the volumetric capacity may increase. In one embodiment the distributions are either Gaussian with a single peak in shape, bimodal, or polymodal (>2 distinct peaks, for example trimodal). The properties of particle size of the composite can be described by the D0 (smallest particle in the distribution), Dv50 (average particle size) and Dv100 (maximum size of the largest particle). The optimal combined of particle packing and performance will be some combination of the size ranges below. The particle size reduction in the such embodiments can be carried out as known in the art, for example by jet milling in the presence of various gases including air, nitrogen, argon, helium, supercritical steam, and other gases known in the art.

In one embodiment the Dv0 of the composite material can range from 1 nm to 5 microns. In another embodiment the Dv0 of the composite ranges from 5 nm to 1 micron, for example 5-500 nm, for example 5-100 nm, for example 10-50 nm. In another embodiment the Dv0 of the composite ranges from 500 nm to 2 microns, or 750 nm to 1 um, or 1-2 um. microns to 2 microns. In other embodiments, the Dv0 of the composite ranges from 2-5 um, or >5 um.

In some embodiments the Dv50 of the composite material ranges from 5 nm to 20 um. In other embodiments the Dv50 of the composite ranges from 5 nm to 1 um, for example 5-500 nm, for example 5-100 nm, for example 10-50 nm. In another embodiment the Dv50 of the composite ranges from 500 nm to 2 um, 750 nm to 1 um, 1-2 um. In still another embodiments, the Dv50 of the composite ranges from 1 to 1000 um, for example from 1-100 um, for example from 1-10 um, for example 2-20 um, for example 3-15 um, for example 4-8 um. In certain embodiments, the Dv50 is >20 um, for example >50 um, for example >100 um.

The span (Dv50)/(Dv90-Dv10), wherein Dv10, Dv50 and Dv90 represent the particle size at 10%, 50%, and 90% of the volume distribution, can be varied from example from 100 to 10, from 10 to 5, from 5 to 2, from 2 to 1; in some embodiments the span can be less than 1. In certain embodiments, the composite comprising carbon and porous silicon material particle size distribution can be multimodal, for example, bimodal, or trimodal.

The surface functionality of the presently disclosed the composite material exhibiting extremely durable intercalation of lithium may be altered to obtain the desired electrochemical properties. One property which can be predictive of surface functionality is the pH of the composite materials. The presently disclosed composite materials comprise pH values ranging from less than 1 to about 14, for example less than 5, from 5 to 8 or greater than 8. In some embodiments, the pH of the composite materials is less than 4, less than 3, less than 2 or even less than 1. In other embodiments, the pH of the composite materials is between about 5 and 6, between about 6 and 7, between about 7 and 8 or between 8 and 9 or between 9 and 10. In still other embodiments, the pH is high and the pH of the composite materials ranges is greater than 8, greater than 9, greater than 10, greater than 11, greater than 12, or even greater than 13.

The silicon-carbon composite material may comprise varying amounts of carbon, oxygen, hydrogen and nitrogen as measured by gas chromatography CHNO analysis. In one embodiment, the carbon content of the composite is greater than 98 wt. % or even greater than 99.9 wt % as measured by CHNO analysis. In another embodiment, the carbon content of the silicon-carbon composite ranges from about 10-90%, for example 20-80%, for example 30-70%, for example 40-60%.

In some embodiments, silicon-carbon composite material comprises a nitrogen content ranging from 0-90%, example 0.1-1%, for example 1-3%, for example 1-5%, for example 1-10%, for example 10-20%, for example 20-30%, for example 30-90%.

In some embodiments, the oxygen content ranges from 0-90%, example 0.1-1%, for example 1-3%, for example 1-5%, for example 1-10%, for example 10-20%, for example 20-30%, for example 30-90%.

The silicon-carbon composite material may also incorporate an electrochemical modifier selected to optimize the electrochemical performance of the non-modified composite. The electrochemical modifier may be incorporated within the pore structure and/or on the surface of the porous carbon scaffold, within the embedded silicon, or within the final layer of carbon, or conductive polymer, coating, or incorporated in any number of other ways. For example, in some embodiments, the composite materials comprise a coating of the electrochemical modifier (e.g., silicon or $Al_2O_3$) on the surface of the carbon materials. In some embodiments, the composite materials comprise greater than about 100 ppm of an electrochemical modifier. In certain embodiments, the electrochemical modifier is selected from iron, tin, silicon, nickel, aluminum and manganese.

In certain embodiments the electrochemical modifier comprises an element with the ability to lithiate from 3 to 0 V versus lithium metal (e.g. silicon, tin, sulfur). In other embodiments, the electrochemical modifier comprises metal oxides with the ability to lithiate from 3 to 0 V versus lithium metal (e.g. iron oxide, molybdenum oxide, titanium oxide). In still other embodiments, the electrochemical modifier comprises elements which do not lithiate from 3 to 0 V versus lithium metal (e.g. aluminum, manganese, nickel, metal-phosphates). In yet other embodiments, the electrochemical modifier comprises a non-metal element (e.g. fluorine, nitrogen, hydrogen). In still other embodiments, the electrochemical modifier comprises any of the foregoing electrochemical modifiers or any combination thereof (e.g. tin-silicon, nickel-titanium oxide).

The electrochemical modifier may be provided in any number of forms. For example, in some embodiments the electrochemical modifier comprises a salt. In other embodiments, the electrochemical modifier comprises one or more elements in elemental form, for example elemental iron, tin, silicon, nickel or manganese. In other embodiments, the electrochemical modifier comprises one or more elements in oxidized form, for example iron oxides, tin oxides, silicon oxides, nickel oxides, aluminum oxides or manganese oxides.

The electrochemical properties of the composite material can be modified, at least in part, by the amount of the electrochemical modifier in the material, wherein the electrochemical modifier is an alloying material such as silicon, tin, indium, aluminum, germanium, gallium. Accordingly, in some embodiments, the composite material comprises at least 0.10%, at least 0.25%, at least 0.50%, at least 1.0%, at least 5.0%, at least 10%, at least 25%, at least 50%, at least 75%, at least 90%, at least 95%, at least 99% or at least 99.5% of the electrochemical modifier.

The particle size of the composite material may expand upon lithiation as compared to the non-litigated state. For example, the expansion factor, defined as ratio of the average particle size of particles of composite material comprising a porous silicon material upon lithiation divided by the average particle size under non-litigated conditions. As described in the art, this expansion factor can be relatively large for previously known, non-optimal silicon-containing materials, for example about 4× (corresponding to a 400% volume expansion upon lithiation). The current inventors have discovered composite materials comprising a porous silicon material that can exhibit a lower extent of expansion, for example, the expansion factor can vary from 3.5 to 4, from 3.0 to 3.5, from 2.5 to 3.0, from 2.0 to 2.5, from 1.5 to 2.0, from 1.0 to 1.5.

It is envisioned that composite materials in certain embodiments will comprise a fraction of trapped pore volume, namely, void volume non-accessible to nitrogen gas as probed by nitrogen gas sorption measurement. Without being bound by theory, this trapped pore volume is important in that it provides volume into which silicon can expand upon lithiation.

In certain embodiments, the ratio of trapped void volume to the silicon volume comprising the composite particle is between 0.1:1 and 10:1. For example, the ratio of trapped void volume to the silicon volume comprising the composite particle is between 1:1 and 5:1, or 5:1 to 10:1. In embodiments, the ratio of ratio trapped void volume to the silicon volume comprising the composite particle is between 2:1 and 5:1, or about 3:1, in order to efficiently accommodate the maximum extent of expansion of silicon upon lithiation.

In certain embodiments, the electrochemical performance of the composite disclosed herein is tested in a half-cell; alternatively the performance of the composite with extremely durable intercalation of lithium disclosed herein is tested in a full cell, for example a full cell coin cell, a full cell pouch cell, a prismatic cell, or other battery configurations known in the art. The anode composition comprising the composite with extremely durable intercalation of lithium disclosed herein can further comprise various species, as known in the art. Additional formulation components include, but are not limited to, conductive additives, such as conductive carbons such as Super C45, Super P, Ketjenblack carbons, and the like, conductive polymers and the like, binders such as styrene-butadiene rubber sodium carboxymethylcellulose (SBR-Na-CMC), polyvinylidene difluoride (PVDF), polyimide (PI), polyacrylic acid (PAA) and the like, and combinations thereof. In certain embodiments, the binder can comprise a lithium ion as counter ion.

Other species comprising the electrode are known in the art. The % of active material in the electrode by weight can vary, for example between 1 and 5%, for example between 5 and 15%, for example between 15 and 25%, for example between 25 and 35%, for example between 35 and 45%, for example between 45 and 55%, for example between 55 and 65%, for example between 65 and 75%, for example between 75 and 85%, for example between 85 and 95%. In some embodiments, the active material comprises between 80 and 95% of the electrode. In certain embodiment, the amount of conductive additive in the electrode can vary, for example between 1 and 5%, between 5 and 15%, for example between 15 and 25%, for example between 25 and 35%. In some embodiments, the amount of conductive additive in the electrode is between 5 and 25%. In certain embodiments, the amount of binder can vary, for example between 1 and 5%, between 5 and 15%, for example between 15 and 25%, for example between 25 and 35%. In certain embodiments, the amount of conductive additive in the electrode is between 5 and 25%.

The silicon-carbon composite material may be prelithiated, as known in the art. In certain embodiments, the prelithiation is achieved electrochemically, for example in a half cell, prior to assembling the lithiated anode comprising the porous silicon material into a full cell lithium ion battery. In certain embodiments, prelithiation is accomplished by doping the cathode with a lithium-containing compound, for example a lithium containing salt. Examples of suitable lithium salts in this context include, but are not limited to, dilithium tetrabromonickelate(II), dilithium tetrachlorocuprate(II), lithium azide, lithium benzoate, lithium bromide, lithium carbonate, lithium chloride, lithium cyclohexanebutyrate, lithium fluoride, lithium formate, lithium hexafluoroarsenate(V), lithium hexafluorophosphate, lithium hydroxide, lithium iodate, lithium iodide, lithium metaborate, lithium perchlorate, lithium phosphate, lithium sulfate, lithium tetraborate, lithium tetrachloroaluminate, lithium tetrafluoroborate, lithium thiocyanate, lithium trifluoromethanesulfonate, lithium trifluoromethanesulfonate, and combinations thereof.

The anode comprising the silicon-carbon composite material can be paired with various cathode materials to result in a full cell lithium ion battery. Examples of suitable cathode materials are known in the art. Examples of such cathode materials include, but are not limited to LiCoO$_2$ (LCO), LiNi$_{0.8}$Co$_{0.15}$Al$_{0.05}$O$_2$ (NCA), LiNi$_{1/3}$Co$_{1/3}$Mn$_{1/3}$O$_2$ (NMC), LiMn$_2$O$_4$ and variants (LMO), and LiFePO$_4$ (LFP).

For the full cell lithium ion battery comprising an anode further comprising the silicon-carbon composite material, pairing of cathode to anode can be varied. For example, the ratio of cathode-to-anode capacity can vary from 0.7 to 1.3. In certain embodiments, the ratio of cathode-to-anode capacity can vary from 0.7 to 1.0, for example from 0.8 to 1.0, for example from 0.85 to 1.0, for example from 0.9 to 1.0, for example from 0.95 to 1.0. In other embodiments, the ratio of cathode-to-anode capacity can vary from 1.0 to 1.3, for example from 1.0 to 1.2, for example from 1.0 to 1.15, for example from 1.0 to 1.1, for example from 1.0 to 1.05. In yet other embodiments, the ratio of cathode-to-anode capacity can vary from 0.8 to 1.2, for example from 0.9 to 1.1, for example from 0.95 to 1.05.

For the full cell lithium ion battery comprising an anode further comprising the silicon-carbon composite material, the voltage window for charging and discharging can be varied. In this regard, the voltage window can be varied as known in the art, depending on various properties of the lithium ion battery. For instance, the choice of cathode plays a role in the voltage window chosen, as known in the art. Examples of voltage windows vary, for example, in terms of potential versus Li/Li+, from 2.0 V to 5.0 V, for example from 2.5 V to 4.5V, for example from 2.5V to 4.2V.

For the full cell lithium ion battery comprising an anode further comprising the silicon-carbon composite material, the strategy for conditioning the cell can be varied as known in the art. For example, the conditioning can be accomplished by one or more charge and discharge cycles at various rate(s), for example at rates slower than the desired cycling rate. As known in the art, the conditioning process may also include a step to unseal the lithium ion battery, evacuate any gases generated within during the conditioning process, followed by resealing the lithium ion battery.

For the full cell lithium ion battery comprising an anode further comprising the silicon-carbon composite material, the cycling rate can be varied as known in the art, for example, the rate can between C/20 and 20 C, for example between C10 to 10 C, for example between C/5 and 5 C. In certain embodiments, the cycling rate is C/10. In certain embodiments, the cycling rate is C/5. In certain embodiments, the cycling rate is C/2. In certain embodiments, the cycling rate is 1 C. In certain embodiments, the cycling rate is 1 C, with periodic reductions in the rate to a slower rate, for example cycling at 1 C with a C/10 rate employed every $20^{th}$ cycle. In certain embodiments, the cycling rate is 2 C. In certain embodiments, the cycling rate is 4 C. In certain embodiments, the cycling rate is 5 C. In certain embodiments, the cycling rate is 10 C. In certain embodiments, the cycling rate is 20 C.

The first cycle efficiency of the composite with extremely durable intercalation of lithium disclosed herein be determined by comparing the lithium inserted into the anode during the first cycle to the lithium extracted from the anode on the first cycle, prior prelithiation modification. When the insertion and extraction are equal, the efficiency is 100%. As known in the art, the anode material can be tested in a half-cell, where the counter electrode is lithium metal, the electrolyte is a 1M $LiPF_6$ 1:1 ethylene carbonate:diethylcarbonate (EC:DEC), using a commercial polypropylene separator. In certain embodiments, the electrolyte can comprise various additives known to provide improved performance, such as fluoroethylene carbonate (FEC) or other related fluorinated carbonate compounds, or ester co-solvents such as methyl butyrate, vinylene carbonate, and other electrolyte additives known to improve electrochemical performance of silicon-comprising anode materials.

Coulombic efficiency can be averaged, for example averaged over cycles 7 to cycle 25 when tested in a half cell. Coulombic efficiency can be averaged, for example averaged over cycles 7 to cycle 20 when tested in a half cell. In certain embodiments, the average efficiency of the composite with extremely durable intercalation of lithium is greater than 0.9, or 90%. In certain embodiments, the average efficiency is greater than 0.95, or 95%. In certain other embodiments, the average efficiency is 0.99 or greater, for example 0.991 or greater, for example 0.992 or greater, for example 0.993 or greater, for example 0.994 or greater, for example 0.995 or greater, for example 0.996 or greater, for example 0.997 or greater, for example 0.998 or greater, for example 0.999 or greater, for example 0.9991 or greater, for example 0.9992 or greater, for example 0.9993 or greater, for example 0.9994 or greater, for example 0.9995 or greater, for example 0.9996 or greater, for example 0.9997 or greater, for example 0.9998 or greater, for example 0.9999 or greater.

In still other embodiments the present disclosure provides a composite material exhibiting extremely durable intercalation of lithium, wherein when the composite material is incorporated into an electrode of a lithium-based energy storage device the composite material has a volumetric capacity at least 10% greater than when the lithium based energy storage device comprises a graphite electrode. In some embodiments, the lithium based energy storage device is a lithium ion battery. In other embodiments, the composite material has a volumetric capacity in a lithium-based energy storage device that is at least 5% greater, at least 10% greater, at least 15% greater than the volumetric capacity of the same electrical energy storage device having a graphite electrode. In still other embodiments, the composite material has a volumetric capacity in a lithium based energy storage device that is at least 20% greater, at least 30% greater, at least 40% greater, at least 50% greater, at least 200% greater, at least 100% greater, at least 150% greater, or at least 200% greater than the volumetric capacity of the same electrical energy storage device having a graphite electrode.

The composite material may be prelithiated, as known in the art. These lithium atoms may or may not be able to be separated from the carbon. The number of lithium atoms to 6 carbon atoms can be calculated by techniques known to those familiar with the art:

$$\#Li = Q \times 3.6 \times MM/(C\% \times F)$$

wherein Q is the lithium extraction capacity measured in mAh/g between the voltages of 5 mV and 2.0 V versus lithium metal, MM is 72 or the molecular mass of 6 carbons, F is Faraday's constant of 96500, C % is the mass percent carbon present in the structure as measured by CHNO or XPS.

The composite material can be characterized by the ratio of lithium atoms to carbon atoms (Li:C) which may vary between about 0:6 and 2:6. In some embodiments the Li:C ratio is between about 0.05:6 and about 1.9:6. In other embodiments the maximum Li:C ratio wherein the lithium is in ionic and not metallic form is 2.2:6. In certain other embodiments, the Li:C ratio ranges from about 1.2:6 to about 2:6, from about 1.3:6 to about 1.9:6, from about 1.4:6 to about 1.9:6, from about 1.6:6 to about 1.8:6 or from about 1.7:6 to about 1.8:6. In other embodiments, the Li:C ratio is greater than 1:6, greater than 1.2:6, greater than 1.4:6, greater than 1.6:6 or even greater than 1.8:6. In even other embodiments, the Li:C ratio is about 1.4:6, about 1.5:6, about 1.6:6, about 1.6:6, about 1.7:6, about 1.8:6 or about 2:6. In a specific embodiment the Li:C ratio is about 1.78:6.

In certain other embodiments, the composite material comprises an Li:C ratio ranging from about 1:6 to about 2.5:6, from about 1.4:6 to about 2.2:6 or from about 1.4:6 to about 2:6. In still other embodiments, the composite materials may not necessarily include lithium, but instead have a lithium uptake capacity (i.e., the capability to uptake a certain quantity of lithium, for example upon cycling the material between two voltage conditions (in the case of a lithium ion half cell, an exemplary voltage window lies between 0 and 3 V, for example between 0.005 and 2.7 V, for example between 0.005 and 1 V, for example between 0.005 and 0.8 V). While not wishing to be bound by theory, it is believed the lithium uptake capacity of the composite materials contributes to their superior performance in lithium based energy storage devices. The lithium uptake capacity is expressed as a ratio of the atoms of lithium taken up by the composite. In certain other embodiments, the composite material exhibiting extremely durable intercalation of lithium comprise a lithium uptake capacity ranging from about 1:6 to about 2.5:6, from about 1.4:6 to about 2.2:6 or from about 1.4:6 to about 2:6.

In certain other embodiments, the lithium uptake capacity ranges from about 1.2:6 to about 2:6, from about 1.3:6 to about 1.9:6, from about 1.4:6 to about 1.9:6, from about 1.6:6 to about 1.8:6 or from about 1.7:6 to about 1.8:6. In other embodiments, the lithium uptake capacity is greater than 1:6, greater than 1.2:6, greater than 1.4:6, greater than 1.6:6 or even greater than 1.8:6. In even other embodiments, the Li:C ratio is about 1.4:6, about 1.5:6, about 1.6:6, about 1.6:6, about 1.7:6, about 1.8:6 or about 2:6. In a specific embodiment the Li:C ratio is about 1.78:6.

EXAMPLES

Example 1. Production of silicon-carbon composite material by CVI. The properties of the carbon scaffold (Carbon Scaffold 1) employed for producing the silicon-carbon composite is presented in Table 3. Employing Carbon Scaffold 1, the silicon-carbon composite (Silicon-Carbon Composite 1) was produced by CVI as follows. A mass of 0.2 grams of amorphous porous carbon was placed into a 2 in.×2 in. ceramic crucible then positioned in the center of a horizontal tube furnace. The furnace was sealed and continuously purged with nitrogen gas at 500 cubic centimeters per minute (ccm). The furnace temperature was increased at 20° C./min to 450° C. peak temperature where it was allowed to equilibrate for 30 minutes. At this point, the nitrogen gas is shutoff and then silane and hydrogen gas are introduced at flow rates of 50 ccm and 450 ccm, respectively for a total dwell time of 30 minutes. After the dwell period, silane and hydrogen were shutoff and nitrogen was again introduced to the furnace to purge the internal atmosphere. Simultaneously the furnace heat is shutoff and allowed to cool to ambient temperature. The completed Si—C material is subsequently removed from the furnace.

TABLE 3

Description of carbon scaffold employed for Example 1.

| Carbon Scaffold # | Surface Area (m2/g) | Pore Volume (cm3/g) | % Micropores | % Mesopores | % Macropores |
|---|---|---|---|---|---|
| 1 | 1710 | 0.762 | 93.1 | 6.8 | 0.1 |

Example 2. Analysis of various silicon-composite materials. A variety of carbon scaffold materials were employed, and the carbon scaffold materials were characterized by nitrogen sorption gas analysis to determine specific surface area, total pore volume, and fraction of pore volume comprising micropores, mesopores, and macropores. The characterization data for the carbon scaffold materials is presented in Table 4, namely the data for carbon scaffold surface area, pore volume, and pore volume distribution (% micropores, % mesopores, and % macropores), all as determined by nitrogen sorption analysis.

TABLE 4

Properites of various carbon scaffold materials.

| Carbon Scaffold # | Surface Area (m2/g) | Pore Volume (cm3/g) | % Micropores | % Mesopores | % Macropores |
|---|---|---|---|---|---|
| 1 | 1710 | 0.762 | 93.1 | 6.8 | 0.1 |
| 2 | 1744 | 0.72 | 97.2 | 2.7 | 0.1 |
| 3 | 1581 | 0.832 | 69.1 | 30.9 | 0.1 |
| 4 | 1710 | 0.817 | 80.1 | 19.9 | 0 |
| 5 | 1835 | 0.9 | 82.2 | 17.8 | 0 |
| 6 | 1475 | 1.06 | 52.4 | 47.6 | 0 |
| 7 | 453 | 0.5 | 3.9 | 91.1 | 5.1 |
| 8 | 787 | 2.284 | 0 | 59.1 | 40.9 |
| 9 | 1713 | 0.76 | 91 | 9 | 0 |
| 10 | 1690 | 0.741 | 92.6 | 7.3 | 0.1 |
| 11 | 1918 | 0.858 | 89.9 | 10.1 | 0 |

The carbons scaffold sample as described in Table 4 were employed to produce a variety of silicon-carbon composite materials employing the CVI methodology in a static bed configuration as generally described in Example 1. These silicon-carbon samples were produced employing a range of process conditions: silane concentration 1.25% to 100%, diluent gas nitrogen or hydrogen, carbon scaffold starting mass 0.2 g to 700 g.

The surface area for the silicon-carbon composites was determined. The silicon-carbon composites were also analyzed by TGA to determine silicon content and the Z. Silicon-carbon composite materials were also tested in half-cell coin cells. The anode for the half-cell coin cell can comprise 60-90% silicon-carbon composite, 5-20% Na-CMC (as binder) and 5-20% Super C45 (as conductivity enhancer), and the electrolyte can comprise 2:1 ethylene carbonate:diethylene carbonate, 1 M LiPF6 and 10% fluoroethylene carbonate. The half-cell coin cells can be cycled at 25° C. at a rate of C/5 for 5 cycles and then cycled thereafter at C/10 rate. The voltage can be cycled between 0 V and 0.8 V, alternatively, the voltage can be cycled between 0 V and 1.5 V. From the half-cell coin cell data, the maximum capacity can be measured, as well as the average Coulombic efficiency (CE) over the range of cycles from cycle 7 to cycle 20. Physicochemical and electrochemical properties for various silicon-carbon composite materials are presented in Table 5.

TABLE 5

Properites of various silicon-carbon materials.

| Silicon-Carbon Composite # | Carbon Scaffold # | Surface Area (m2/g) | Si content (%) | Z | Max Capacity (mAh/g) | Average CE (7-20) |
|---|---|---|---|---|---|---|
| 1 | 1 | 7 | 45.0 | 0.2 | 1433 | 0.9981 |
| 2 | 1 | 7 | 45.4 | 0.6 | 1545 | 0.9980 |
| 3 | 1 | 6 | 45.8 | 0.6 | 1510 | 0.9975 |
| 4 | 2 | 3.06 | 50.1 | 1.0 | 1665 | 0.9969 |
| 5 | 2 | 1.96 | 51.3 | 2.0 | 1662 | 0.9974 |
| 6 | 3 | 140 | 43.1 | 3.2 | 832 | 0.9941 |
| 7 | 2 | 1.61 | 48.7 | 2.8 | 1574 | 0.9977 |
| 8 | 2 | 2 | 48.5 | 3.0 | 1543 | 0.9972 |
| 9 | 1 | 8 | 46.3 | 0.2 | 1373 | 0.9976 |
| 10 | 4 | 44 | 51.2 | 6.2 | 1614 | 0.9975 |
| 11 | 5 | 94 | 48.9 | 6.2 | 1455 | 0.9969 |
| 12 | 6 | 61 | 52.1 | 10.6 | 2011 | 0.9869 |
| 13 | 7 | 68.5 | 34.6 | 17.2 | 1006 | 0.9909 |

TABLE 5-continued

Properites of various silicon-carbon materials.

| Silicon-Carbon Composite # | Carbon Scaffold # | Surface Area (m2/g) | Si content (%) | Z | Max Capacity (mAh/g) | Average CE (7-20) |
|---|---|---|---|---|---|---|
| 14 | 8 | 20 | 74 | 33.5 | 2463 | 0.9717 |
| 15 | 8 | 149 | 57.7 | 34.5 | 1892 | 0.9766 |
| 16 | 8 | 61.7 | 68.9 | 38.7 | 2213 | 0.9757 |
| 17 | 9 | 11 | 46.1 | 0.8 | 1675 | 0.9990 |
| 18 | 9 | 11 | 46.7 | 2.0 | 1739 | 0.9985 |
| 19 | 9 | 15.1 | 46.8 | 1.7 | 1503 | 0.9980 |
| 20 | 9 | 4.1 | 47.9 | 4.2 | 1790 | 0.9953 |
| 21 | 9 | 5 | 48.1 | 4.6 | 1861 | 0.9962 |
| 22 | 10 | 5.1 | 44.5 | 0 | ND | ND |
| 23 | 10 | 8.4 | 43.6 | 0 | ND | ND |
| 24 | 11 | 13.6 | 45.0 | 0.92 | 1848 | Pending |

ND = not determined

A plot of the average Coulombic efficiency as a function of the Z is presented in FIG. 1. As can seen there was dramatic increase in the average Coulombic efficiency for silicon-carbon samples with low Z. In particular, all silicon-carbon samples with Z below 10.0 exhibited average Coulombic efficiency ≥0.9941, and all silicon-carbon samples with Z above 10 (Silicon-Carbon Composite Sample 12 through Silicon-Carbon Composite Sample 16) were observed to have average Coulombic efficiency ≤0.9909. Without being bound by theory, higher Coulombic efficiency for the silicon-carbon samples with Z<10 provides for superior cycling stability in full cell lithium ion batteries. Further inspection of Table reveals the surprising and unexpected finding that the combination of silicon-carbon composite samples with Z<10 and also comprising carbon scaffold comprising >69.1 microporosity provides for average Coulombic efficiency ≥0.9969.

Therefore, in a preferred embodiment, the silicon-carbon composite material comprises a Z less than 10, for example less Z less than 5, for example less Z less than 3, for example less Z less than 2, for example less Z less than 1, for example less Z less than 0.5, for example less Z less than 0.1, or Z of zero.

In certain preferred embodiments, the silicon-carbon composite material comprises a Z less than 10 and a carbon scaffold with >70% microporosity, for example Z less than 10 and >80% microporosity, for example Z less than 10 and >90% microporosity, for example Z less than 10 and >95% microporosity, for example Z less than 5 and >70% microporosity, for example Z less than 5 and >80% microporosity, for example Z less than 5 and >90% microporosity, for example Z less than 5 and >95% microporosity, for example Z less than 3 and >70% microporosity, for example Z less than 3 and >80% microporosity, for example Z less than 3 and >90% microporosity, for example Z less than 3 and >95% microporosity, for example Z less than 2 and >70% microporosity, for example Z less than 2 and >80% microporosity, for example Z less than 2 and >90% microporosity, for example Z less than 2 and >95% microporosity, for example Z less than 1 and >70% microporosity, for example Z less than 1 and >80% microporosity, for example Z less than 1 and >90% microporosity, for example Z less than 1 and >95% microporosity, for example Z less than 0.5 and >70% microporosity, for example Z less than 0.5 and >80% microporosity, for example Z less than 0.5 and >90% microporosity, for example Z less than 0.5 and >95% microporosity, for example Z less than 0.1 and >70% microporosity, for example Z less than 0.1 and >80% microporosity, for example Z less than 0.1 and >90% microporosity, for example Z less than 0.1 and >95% microporosity, for example Z of zero and >70% microporosity, for example Z of zero and >80% microporosity, for example Z of zero and >90% microporosity, for example Z of zero and >95% microporosity.

In certain preferred embodiments, the silicon-carbon composite material comprises a Z less than 10 and a carbon scaffold with >70% microporosity, and wherein the silicon-carbon composite also comprises 15%-85% silicon, and surface area less than 100 m2/g, for example Z less than 10 and >70% microporosity, and wherein the silicon-carbon composite also comprises 15%-85% silicon, and surface area less than 50 m2/g, for example Z less than 10 and >70% microporosity, and wherein the silicon-carbon composite also comprises 15%-85% silicon, and surface area less than 30 m2/g, for example Z less than 10 and >70% microporosity, and wherein the silicon-carbon composite also comprises 15%-85% silicon, and surface area less than 10 m2/g, for example Z less than 10 and >70% microporosity, and wherein the silicon-carbon composite also comprises 15%-85% silicon, and surface area less than 5 m2/g, for example Z less than 10 and >80% microporosity, and wherein the silicon-carbon composite also comprises 15%-85% silicon, and surface area less than 50 m2/g, for example Z less than 10 and >80% microporosity, and wherein the silicon-carbon composite also comprises 15%-85% silicon, and surface area less than 30 m2/g, for example Z less than 10 and >80% microporosity, and wherein the silicon-carbon composite also comprises 15%-85% silicon, and surface area less than 10 m2/g, for example Z less than 10 and >80% microporosity, and wherein the silicon-carbon composite also comprises 15%-85% silicon, and surface area less than 5 m2/g, for example Z less than 10 and >90% microporosity, and wherein the silicon-carbon composite also comprises 15%-85% silicon, and surface area less than 50 m2/g, for example Z less than 10 and >90% microporosity, and wherein the silicon-carbon composite also comprises 15%-85% silicon, and surface area less than 30 m2/g, for example Z less than 10 and >90% microporosity, and wherein the silicon-carbon composite also comprises 15%-85% silicon, and surface area less than 10 m2/g, for example Z less than 10 and >90% microporosity, and wherein the silicon-carbon composite also comprises 15%-85% silicon, and surface area less than 5 m2/g, for example Z less than 10 and >95% microporosity, and wherein the silicon-carbon composite also comprises 15%-85% silicon, and surface area less than 50 m2/g, for example Z less than 10 and >95% microporosity, and wherein the silicon-carbon composite also comprises 15%-85% silicon, and surface area less than 30 m2/g, for example Z less than 10 and >95% microporosity, and wherein the silicon-carbon composite also comprises 15%-85% silicon, and surface area less than 10 m2/g, for example Z less than 10 and >95% microporosity, and wherein the silicon-carbon composite also comprises 15%-85% silicon, and surface area less than 5 m2/g.

In certain preferred embodiments, the silicon-carbon composite material comprises a Z less than 10 and a carbon scaffold with >70% microporosity, and wherein the silicon-carbon composite also comprises 30%-60% silicon, and surface area less than 100 m2/g, for example Z less than 10 and >70% microporosity, and wherein the silicon-carbon composite also comprises 30%-60% silicon, and surface area less than 50 m2/g, for example Z less than 10 and >70% microporosity, and wherein the silicon-carbon composite also comprises 30%-60% silicon, and surface area less than 30 m2/g, for example Z less than 10 and >70% microporosity, and wherein the silicon-carbon composite also comprises 30%-60% silicon, and surface area less than 10 m2/g, for example Z less than 10 and >70% microporosity, and wherein the silicon-carbon composite also comprises 30%-60% silicon, and surface area less than 5 m2/g, for example Z less than 10 and >80% microporosity, and wherein the silicon-carbon composite also comprises 30%-60% silicon, and surface area less than 50 m2/g, for example Z less than 10 and >80% microporosity, and wherein the silicon-carbon composite also comprises 30%-60% silicon, and surface area less than 30 m2/g, for example Z less than 10 and >80% microporosity, and wherein the silicon-carbon composite also comprises 30%-60% silicon, and surface area less than 10 m2/g, for example Z less than 10 and >80% microporosity, and wherein the silicon-carbon composite also comprises 30%-60% silicon, and surface area less than 5 m2/g, for example Z less than 10 and >90% microporosity, and wherein the silicon-carbon composite also comprises 30%-60% silicon, and surface area less than 50 m2/g, for example Z less than 10 and >90% microporosity, and wherein the silicon-carbon composite also comprises 30%-60% silicon, and surface area less than 30 m2/g, for example Z less than 10 and >90% microporosity, and wherein the silicon-carbon composite also comprises 30%-60% silicon, and surface area less than 10 m2/g, for example Z less than 10 and >90% microporosity, and wherein the silicon-carbon composite also comprises 30%-60% silicon, and surface area less than 5 m2/g, for example Z less than 10 and >95% microporosity, and wherein the silicon-carbon composite also comprises 30%-60% silicon, and surface area less than 50 m2/g, for example Z less than 10 and >95% microporosity, and wherein the silicon-carbon composite also comprises 30%-60% silicon, and surface area less than 30 m2/g, for example Z less than 10 and >95% microporosity, and wherein the silicon-carbon composite also comprises 30%-60% silicon, and surface area less than 10 m2/g, for example Z less than 10 and >95% microporosity, and wherein the silicon-carbon composite also comprises 30%-60% silicon, and surface area less than 5 m2/g.

Example 3. dV/dQ for various silicon-composite materials. Differential capacity curve (dQ/dV vs Voltage) is often used as a non-destructive tool to understand the phase transition as a function of voltage in lithium battery electrodes (M. N. Obrovac et al. Structural Changes in Silicon Anodes during Lithium Insertion/Extraction, Electrochemical and Solid-State Letters, 7 (5) A93-A96 (2004); Ogata, K. et al. Revealing lithium-silicide phase transformations in nano-structured silicon-based lithium ion batteries via in situ NMR spectroscopy. Nat. Commun. 5:3217). Differential capacity plots presented here is calculated from the data obtained using galvanostatic cycling at 0.1 C rate between 5 mV to 0.8V in a half-cell coin cell at 25° C. Typical differential capacity curve for a silicon-based material in a half-cell vs lithium can be found in many literature references (Loveridge, M. J. et al. Towards High Capacity Li-Ion Batteries Based on Silicon-Graphene Composite Anodes and Sub-micron V-doped LiFePO4 Cathodes. Sci. Rep. 6, 37787; doi: 10.1038/srep37787 (2016); M. N. Obrovac et al. Li15Si4Formation in Silicon Thin Film Negative Electrodes, Journal of The Electrochemical Society,163 (2) A255-A261 (2016); Q. Pan et al. Improved electrochemical performance of micro-sized SiO-based composite anode by prelithiation of stabilized lithium metal powder, Journal of Power Sources 347 (2017) 170-177). First cycle lithiation behavior is dependent on the crystallinity of the silicon and oxygen content among other factors.

After first cycle, previous amorphous silicon materials in the art exhibit two specific phase transition peaks in the dQ/dV vs V plot for lithiation, and correspondingly two specific phase transition peaks in the dQ/dV vs V plot for delithiation. For lithiation, one peak corresponding to lithium-poor Li-Si alloy phase occurs between 0.2-0.4 V and another peak corresponding to a lithium-rich Li-Si alloy phase occurs below 0.15 V. For delithiation, one delithiation peak corresponding to the extraction of lithium occurs below 0.4 V and another peak occurs between 0.4 V and 0.55 V. If the Li15Si4 phase is formed during lithiation, it is delithiated at ~0.45V and appears as a very narrow sharp peak.

FIG. 2 depicts the dQ/dV vs Voltage curve for cycle 2 for the silicon-carbon composite material corresponding to Silicon-Carbon Composite 3 from Example 1. Silicon-Carbon Composite 3 comprises a Z of 0.6. For ease of identification, the plot is divided into regimes I, II, II, IV, V, and VI. Regimes I (0.8 V to 0.4 V), II (0.4 V to 0.15 V), III (0.15 V to 0 V) comprise the lithiation potentials and Regimes IV (0 V to 0.4 V), V (0.4 V to 0.55 V), VI (0.55 V to 0.8 V) comprise the delithiation potential. As described above, previous amorphous silicon-based materials in the art exhibit phase-transition peaks for two regimes (Regime II and Regime III) in the lithiation potential and two regimes (Regime IV and Regime V) in the dethiation potentials.

As can be seen in FIG. 2, the dQ/dV vs Voltage curve reveals surprising and unexpected result that Silicon-Carbon Composite 3, which comprises a Z of 0.6, comprises two additional peaks in the dQ/dV vs Voltage curve, namely Regime I in the lithiation potential and Regime VI in the delithiation potential. All 6 peaks are are reversible and observed in the subsequent cycles as well, as shown in FIG. 3.

Without being bound by theory, such trimodal behavior for the dQ/dV vs V curve is novel, and likewise reflects a novel form of silicon.

Notably, the novel peaks observed in Regime I and Regime VI are more pronounced in certain scaffold matrixes and completely absent in others samples illustrating the prior art (silicon-carbon composite samples with Z>10, see explanation and table below).

FIG. 4 presents the dQ/dV vs V curve for Silicon-Carbon Composite 3, wherein the novel peaks in Regime I and Regime VI are evident, in comparison to Silicon-Carbon Composite 15, Silicon-Carbon Composite 16, and Silicon-Carbon Composite 14, all three of which comprise Z>10 and whose dQ/dV vs V curves are devoid of the any peaks in Regime I and Regime VI.

Without being bound by theory, these novel peaks observed in Regime I and Regime VI relate to the properties of the silicon impregnated into the porous carbon scaffold, i.e., related to the interactions between and among the properties of the porous carbon scaffold, the silicon impregnated into the porous carbon scaffold via CVI, and lithium. In order to provide a quantitative analysis, we herein define the parameter φ, which is calculated as the normalized peak I with respect to peak III as:

$$\varphi = (\text{Max peak height } dQ/dV \text{ in Regime I}) / (\text{Max peak height } dQ/dV \text{ in Regime III})$$

where dQ/dV is measured in a half-cell coin cell, and regime I is 0.8V-0.4V and Regime III is 0.15V-0V; the half-cell coin cell is produced as known in the art. If the Si—C sample shows peaks associated with graphite in regime III of the differential curve, it is omitted in favor of Li—Si related phase transition peaks for the calculation of D factor. For this example, the half-cell coin cell comprises an anode comprising 60-90% silicon-carbon composite, 5-20% SBR-Na-CMC, and 5-20% Super C45. An example for φ calculation is shown in FIG. 5 for Silicon-Carbon Composite 3. In this instance, the maximum peak height in the regime I is −2.39 and is found at voltage 0.53V. Similarly, maximum peak height in regime III is −9.71 at 0.04V. In this instance, φ can be calculated using the above formula, yielding φ=−2.39/−9.71=0.25. The value of φ was determined from the half-cell coin cell data for the various silicon-carbon composites presented in Example 2. These data are summarized in Table 6.

TABLE 6

Properites of various silicon-carbon materials.

| Silicon-Carbon Composite # | Surface Area (m2/g) | Si content (%) | Z | Average CE (7-20) | φ | First Cycle Efficiency |
|---|---|---|---|---|---|---|
| 1 | 7 | 45.0 | 0.2 | 0.9981 | 0.24 | 76.3 |
| 2 | 7 | 45.4 | 0.6 | 0.9980 | 0.24 | 76.8 |
| 3 | 6 | 45.8 | 0.6 | 0.9975 | 0.25 | 75.5 |
| 4 | 3.06 | 50.1 | 1.0 | 0.9969 | 0.18 | 80.9 |
| 5 | 1.96 | 51.3 | 2.0 | 0.9974 | 0.18 | 80.3 |
| 6 | 140 | 43.1 | 3.2 | 0.9941 | 0.13 | 52.3 |
| 7 | 1.61 | 48.7 | 2.8 | 0.9977 | 0.19 | 79.2 |
| 8 | 2 | 48.5 | 3.0 | 0.9972 | 0.19 | 78.3 |
| 9 | 8 | 46.3 | 0.2 | 0.9976 | 0.20 | 73.3 |
| 10 | 44 | 51.2 | 6.2 | 0.9975 | 0.13 | 78.1 |
| 11 | 94 | 48.9 | 6.2 | 0.9969 | 0.15 | 72.7 |
| 12 | 61 | 52.1 | 10.6 | 0.9869 | 0 | 80.2 |
| 13 | 68.5 | 34.6 | 17.2 | 0.9909 | 0 | 64 |
| 14 | 20 | 74 | 33.5 | 0.9717 | 0 | 85 |
| 15 | 149 | 57.7 | 34.5 | 0.9766 | 0 | 69 |
| 16 | 61.7 | 68.9 | 38.7 | 0.9757 | 0 | 79.3 |
| 17 | 11 | 46.1 | 0.8 | 0.9990 | 0.35 | 82.2 |
| 18 | 11 | 46.7 | 2.0 | 0.9985 | 0.34 | 82.5 (92.1*) |
| 19 | 15.1 | 46.8 | 1.7 | 0.9980 | 0.34 | 79.9 (90.3*) |
| 20 | 4.1 | 47.9 | 4.2 | 0.9953 | 0.34 | 83.3 (92.6*) |
| 21 | 5 | 48.1 | 4.6 | 0.9962 | 0.32 | 82.9 (92.2*) |
| 22 | 5.1 | 44.5 | 0 | ND | ND | ND |
| 23 | 8.4 | 43.6 | 0 | ND | ND | ND |
| 24 | 13.6 | 46.0 | 0.92 | Pending | 0.30 | 81.9 (91.2*) |

ND = not determined;
*These data for first cycle effiency in parenthesis were measured for voltage window of 5 mV to 1.5 V.

The data in Table 6 reveal an unexpected relationship between decreasing Z and increasing φ. All silicon-carbon composites with Z<10 had φ≥0.13, and all silicon-carbon composites with Z>10 had φ<0.13, indeed, all silicon-carbon composites with where Z>10 had φ=0. This relationship is also evidenced in FIG. 6. Without being bound by theory, silicon materials comprising φ≥0.10, for example φ≥0.13, correspond to a novel form of silicon. Alternatively, silicon materials comprising φ>0 correspond to a novel form of silicon. Without being bound by theory, silicon materials comprising φ>0 are characteristic to silicon material wherein the silicon is amorphous, nano-sized silicon confined within pores, for example pores of a porous carbon scaffold. The silicon-carbon composite material comprising silicon comprising φ≥0.10, for example φ≥0.13, corresponds to a novel silicon-carbon composite material. Alternatively, silicon-carbon composite materials comprising φ>0 corresponds to a novel silicon-carbon composite material.

In certain embodiments, the silicon-carbon composite comprises a φ≥0.1, φ≥0.11, φ≥0.12, φ≥0.13, φ≥0.14, φ≥0.15, φ≥0.16, φ≥0.17, φ≥0.18, φ≥0.19, φ≥0.20, φ≥0.24, φ≥0.24, φ≥0.25, φ≥0.30 or φ≥0.35. In come embodiment, φ>0. In some embodiments, φ≥0.001, φ≥0.01, φ≥0.02, φ≥0.05, φ≥0.1, φ≥0.11, or φ≥0.12.

In certain embodiments, the silicon-carbon composite material comprises a Z less than 10 and a carbon scaffold with >70% microporosity, and wherein the silicon-carbon composite also comprises 30%-60% silicon, and surface area less than 100 m2/g, and φ≥0.1, for example Z less than 10 and >70% microporosity, and wherein the silicon-carbon composite also comprises 30%-60% silicon, and surface area less than 50 m2/g, and φ≥0.1, for example Z less than 10 and >70% microporosity, and wherein the silicon-carbon composite also comprises 30%-60% silicon, and surface area less than 30 m2/g, and φ≥0.1, for example Z less than 10 and >70% microporosity, and wherein the silicon-carbon composite also comprises 30%-60% silicon, and surface area less than 10 m2/g, and φ≥0.1, for example Z less than 10 and >70% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >70% microporosity, and wherein the silicon-carbon composite also comprises 40%-60% silicon, and surface area less than 100 m2/g, and φ≥0.1, for example Z less than 10 and >70% microporosity, and wherein the silicon-carbon composite also comprises 40%-60% silicon, and surface area less than 50 m2/g, and φ≥0.1, for example Z less than 10 and >70% microporosity, and wherein the silicon-carbon composite also comprises 40%-60% silicon, and surface area less than 30 m2/g, and φ≥0.1, for example Z less than 10 and >70% microporosity, and wherein the silicon-carbon composite also comprises 40%-60% silicon, and surface area less than 10 m2/g, and φ≥0.1, for example Z less than 10 and >70% microporosity, and wherein the silicon-carbon composite also comprises 40%-60% silicon, and surface area less than 5 m2/g, and φ≥0.1.

In certain embodiments, the silicon-carbon composite material comprises a Z less than 10 and a carbon scaffold with >70% microporosity, and wherein the silicon-carbon composite also comprises 30%-60% silicon, and surface area less than 100 m2/g, and φ>0, for example Z less than 10 and >70% microporosity, and wherein the silicon-carbon composite also comprises 30%-60% silicon, and surface area less than 50 m2/g, and φ>0, for example Z less than 10 and >70% microporosity, and wherein the silicon-carbon composite also comprises 30%-60% silicon, and surface area less than 30 m2/g, and φ>0, for example Z less than 10 and >70% microporosity, and wherein the silicon-carbon composite also comprises 30%-60% silicon, and surface area less than 10 m2/g, and φ>0, for example Z less than 10 and >70% microporosity, and wherein the silicon-carbon composite also comprises 30%-60% silicon, and surface area less than 5 m2/g, and φ>0.

In certain embodiments, the silicon-carbon composite material comprises a Z less than 10 and a carbon scaffold with >70% microporosity, and wherein the silicon-carbon composite also comprises 40%-60% silicon, and surface area less than 100 m2/g, and φ>0, for example Z less than 10 and >70% microporosity, and wherein the silicon-carbon composite also comprises 40%-60% silicon, and surface area less than 50 m2/g, and φ>0, for example Z less than 10 and >70% microporosity, and wherein the silicon-carbon composite also comprises 40%-60% silicon, and surface area less than 30 m2/g, and φ>0, for example Z less than 10 and >70% microporosity, and wherein the silicon-carbon composite also comprises 40%-60% silicon, and surface area less than 10 m2/g, and φ>0, for example Z less than 10 and >70% microporosity, and wherein the silicon-carbon composite also comprises 40%-60% silicon, and surface area less than 5 m2/g, and φ>0.

In certain embodiments, the silicon-carbon composite material comprises a Z less than 10 and a carbon scaffold with >80% microporosity, and wherein the silicon-carbon composite also comprises 30%-60% silicon, and surface area less than 100 m2/g, and φ≥0.1, for example Z less than 10 and >80% microporosity, and wherein the silicon-carbon composite also comprises 30%-60% silicon, and surface area less than 50 m2/g, and φ≥0.1, for example Z less than 10 and >80% microporosity, and wherein the silicon-carbon composite also comprises 30%-60% silicon, and surface area less than 30 m2/g, and φ≥0.1, for example Z less than 10 and >80% microporosity, and wherein the silicon-carbon composite also comprises 30%-60% silicon, and surface area less than 10 m2/g, and φ≥0.1, for example Z less than 10 and >80% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >80% microporosity, and wherein the silicon-carbon composite also comprises 40%-60% silicon, and surface area less than 100 m2/g, and φ≥0.1, for example Z less than 10 and >80% microporosity, and wherein the silicon-carbon composite also comprises 40%-60% silicon, and surface area less than 50 m2/g, and φ≥0.1, for example Z less than 10 and >80% microporosity, and wherein the silicon-carbon composite also comprises 40%-60% silicon, and surface area less than 30 m2/g, and φ≥0.1, for example Z less than 10 and >80% microporosity, and wherein the silicon-carbon composite also comprises 40%-60% silicon, and surface area less than 10 m2/g, and φ≥0.1, for example Z less than 10 and >80% microporosity, and wherein the silicon-carbon composite also comprises 40%-60% silicon, and surface area less than 5 m2/g, and φ≥0.1.

In certain embodiments, the silicon-carbon composite material comprises a Z less than 10 and a carbon scaffold with >80% microporosity, and wherein the silicon-carbon composite also comprises 30%-60% silicon, and surface area less than 100 m2/g, and φ>0, for example Z less than 10 and >80% microporosity, and wherein the silicon-carbon composite also comprises 30%-60% silicon, and surface area less than 50 m2/g, and φ>0, for example Z less than 10 and >80% microporosity, and wherein the silicon-carbon composite also comprises 30%-60% silicon, and surface area less than 30 m2/g, and φ>0, for example Z less than 10 and >80% microporosity, and wherein the silicon-carbon composite also comprises 30%-60% silicon, and surface area less than 10 m2/g, and φ>0, for example Z less than 10 and >80% microporosity, and wherein the silicon-carbon composite also comprises 30%-60% silicon, and surface area less than 5 m2/g, and φ>0.

In certain embodiments, the silicon-carbon composite material comprises a Z less than 10 and a carbon scaffold with >80% microporosity, and wherein the silicon-carbon composite also comprises 40%-60% silicon, and surface area less than 100 m2/g, and φ>0, for example Z less than 10 and >80% microporosity, and wherein the silicon-carbon composite also comprises 40%-60% silicon, and surface area less than 50 m2/g, and φ>0, for example Z less than 10 and >80% microporosity, and wherein the silicon-carbon composite also comprises 40%-60% silicon, and surface area less than 30 m2/g, and φ>0, for example Z less than 10 and >80% microporosity, and wherein the silicon-carbon composite also comprises 40%-60% silicon, and surface area less than 10 m2/g, and φ>0, for example Z less than 10 and >80% microporosity, and wherein the silicon-carbon composite also comprises 40%-60% silicon, and surface area less than 5 m2/g, and φ>0.

In certain embodiments, the silicon-carbon composite material comprises a Z less than 10 and a carbon scaffold with >90% microporosity, and wherein the silicon-carbon composite also comprises 30%-60% silicon, and surface area less than 100 m2/g, and φ≥0.1, for example Z less than 10 and >90% microporosity, and wherein the silicon-carbon composite also comprises 30%-60% silicon, and surface area less than 50 m2/g, and φ≥0.1, for example Z less than 10 and >90% microporosity, and wherein the silicon-carbon composite also comprises 30%-60% silicon, and surface area less than 30 m2/g, and φ≥0.1, for example Z less than 10 and >90% microporosity, and wherein the silicon-carbon composite also comprises 30%-60% silicon, and surface area less than 10 m2/g, and φ≥0.1, for example Z less than 10 and >90% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >90% microporosity, and wherein the silicon-carbon composite also comprises 40%-60% silicon, and surface area less than 100 m2/g, and φ≥0.1, for example Z less than 10 and >90% microporosity, and wherein the silicon-carbon composite also comprises 40%-60% silicon, and surface area less than 50 m2/g, and φ≥0.1, for example Z less than 10 and >90% microporosity, and wherein the silicon-carbon composite also comprises 40%-60% silicon, and surface area less than 30 m2/g, and φ≥0.1, for example Z less than 10 and >90% microporosity, and wherein the silicon-carbon composite also comprises 40%-60% silicon, and surface area less than 10 m2/g, and φ≥0.1, for example Z less than 10 and >90% microporosity, and wherein the silicon-carbon composite also comprises 40%-60% silicon, and surface area less than 5 m2/g, and φ≥0.1.

In certain embodiments, the silicon-carbon composite material comprises a Z less than 10 and a carbon scaffold with >90% microporosity, and wherein the silicon-carbon composite also comprises 30%-60% silicon, and surface area less than 100 m2/g, and φ>0, for example Z less than 10 and >90% microporosity, and wherein the silicon-carbon composite also comprises 30%-60% silicon, and surface area less than 50 m2/g, and φ>0, for example Z less than 10 and >90% microporosity, and wherein the silicon-carbon composite also comprises 30%-60% silicon, and surface area less than 30 m2/g, and φ>0, for example Z less than 10 and >90% microporosity, and wherein the silicon-carbon composite also comprises 30%-60% silicon, and surface area less than 10 m2/g, and φ>0, for example Z less than 10 and >90% microporosity, and wherein the silicon-carbon composite also comprises 30%-60% silicon, and surface area less than 5 m2/g, and φ>0.

In certain embodiments, the silicon-carbon composite material comprises a Z less than 10 and a carbon scaffold with >90% microporosity, and wherein the silicon-carbon composite also comprises 40%-60% silicon, and surface area less than 100 m2/g, and φ>0, for example Z less than 10 and >90% microporosity, and wherein the silicon-carbon composite also comprises 40%-60% silicon, and surface area less than 50 m2/g, and φ>0, for example Z less than 10 and >90% microporosity, and wherein the silicon-carbon composite also comprises 40%-60% silicon, and surface area less than 30 m2/g, and φ>0, for example Z less than 10 and >90% microporosity, and wherein the silicon-carbon composite also comprises 40%-60% silicon, and surface area less than 10 m2/g, and φ>0, for example Z less than 10 and >90% microporosity, and wherein the silicon-carbon composite also comprises 40%-60% silicon, and surface area less than 5 m2/g, and φ>0.

In certain embodiments, the silicon-carbon composite material comprises a Z less than 10 and a carbon scaffold with >95% microporosity, and wherein the silicon-carbon composite also comprises 30%-60% silicon, and surface area less than 100 m2/g, and φ≥0.1, for example Z less than 10 and >95% microporosity, and wherein the silicon-carbon composite also comprises 30%-60% silicon, and surface area less than 50 m2/g, and φ≥0.1, for example Z less than 5 and >95% microporosity, and wherein the silicon-carbon composite also comprises 30%-60% silicon, and surface area less than 30 m2/g, and φ≥0.1, for example Z less than 10 and >95% microporosity, and wherein the silicon-carbon composite also comprises 30%-60% silicon, and surface area less than 10 m2/g, and φ≥0.1, for example Z less than 10 and >95% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >95% microporosity, and wherein the silicon-carbon composite also comprises 40%-60% silicon, and surface area less than 100 m2/g, and φ≥0.1, for example Z less than 10 and >95% microporosity, and wherein the silicon-carbon composite also comprises 40%-60% silicon, and surface area less than 50 m2/g, and φ≥0.1, for example Z less than 10 and >95% microporosity, and wherein the silicon-carbon composite also comprises 40%-60% silicon, and surface area less than 30 m2/g, and φ≥0.1, for example Z less than 10 and >95% microporosity, and wherein the silicon-carbon composite also comprises 40%-60% silicon, and surface area less than 10 m2/g, and φ≥0.1, for example Z less than 10 and >95% microporosity, and wherein the silicon-carbon composite also comprises 40%-60% silicon, and surface area less than 5 m2/g, and φ≥0.1.

In certain embodiments, the silicon-carbon composite material comprises a Z less than 10 and a carbon scaffold with >95% microporosity, and wherein the silicon-carbon composite also comprises 30%-60% silicon, and surface area less than 100 m2/g, and φ≥0.1, for example Z less than 10 and >95% microporosity, and wherein the silicon-carbon composite also comprises 30%-60% silicon, and surface area less than 50 m2/g, and φ≥0.1, for example Z less than 10 and >95% microporosity, and wherein the silicon-carbon composite also comprises 30%-60% silicon, and surface area less than 30 m2/g, and φ≥0.1, for example Z less than 10 and >95% microporosity, and wherein the silicon-carbon composite also comprises 30%-60% silicon, and surface area less than 10 m2/g, and φ≥0.1, for example Z less than 10 and >95% microporosity, and wherein the silicon-carbon composite also comprises 30%-60% silicon, and surface area less than 5 m2/g, and φ≥0.1.

In certain embodiments, the silicon-carbon composite material comprises a Z less than 10 and a carbon scaffold with >95% microporosity, and wherein the silicon-carbon composite also comprises 40%-60% silicon, and surface area less than 100 m2/g, and φ>0, for example Z less than 10 and >95% microporosity, and wherein the silicon-carbon composite also comprises 40%-60% silicon, and surface area less than 50 m2/g, and φ>0, for example Z less than 10 and >95% microporosity, and wherein the silicon-carbon composite also comprises 40%-60% silicon, and surface area less than 30 m2/g, and φ>0, for example Z less than 10 and >95% microporosity, and wherein the silicon-carbon composite also comprises 40%-60% silicon, and surface area less than 10 m2/g, and φ>0, for example Z less than 10 and >95% microporosity, and wherein the silicon-carbon composite also comprises 40%-60% silicon, and surface area less than 5 m2/g, and φ>0.

Example 4. Particle size distribution for various carbon scaffold materials. The particle size distribution for the various carbon scaffold materials was determined by using a laser diffraction particle size analyzer as known in the art. Table 7 presented the data, specifically the Dv,1, Dv10, Dv50, and Dv,90, and Dv,100.

TABLE 7

Properites of various carbon scaffold materials.

| Carbon Scaffold # | Particle Size Characteristics |
|---|---|
| 1 | Dv, 1 = 1.2 um, Dv, 10 = 2.5 um, Dv, 50 = 6.9 um, Dv90 = 11.5 um, Dv100 = 20.1 um |
| 2 | Dv, 1 = 1.09, Dv10 = 3.4 um, Dv50 = 7.67 um, Dv, 90 = 13.3 um, Dv100 = 17.8 |
| 4 | Dv, 1 = 0.81, Dv10 = 1.9 um, Dv50 = 6.4 um, Dv, 90 = 16.6 um, Dv100 = 26.5 |
| 5 | Dv, 1 = 0.62, Dv10 = 1.1 um, Dv50 = 4.2 um, Dv, 90 = 15.8 um, Dv100 = 29.8 |
| 8 | Dv, 1 = 1.3, Dv10 = 3.7 um, Dv50 = 16 um, Dv, 90 = 35.2 um, Dv100 = 50.7 |
| 9 | Dv, 1 = 1.2 um, Dv, 10 = 2.7 um, Dv, 50 = 7.6 um, Dv, 90 = 12.3 um, Dv100 = 20.7 um |
| 10 | Dv, 1 = 1.09 um, Dv, 10 = 2 um, Dv, 50 = 6.8 um, Dv, 90 = 12.6 um, Dv100 = 19.8 um |
| 11 | Dv, 1 = 1.3 um, Dv, 10 = 2.7 um, Dv, 50 = 7.7 um, Dv, 90 = 12.9 um, Dv100 = 22.7 um |

Example 5. Effect of CVI process variables on fractional conversion of silicon-containing gas into elemental silicon for production for various silicon-composite materials. Table 8 presents several key CVI process parameters employed for producing the various silicon-carbon materials. For these examples, two reactor types were employed, static bed (SB) type, wherein the bed of porous carfon scaffold is fixed and resides within the heated zone of the reactor, and a horizontally moving bed (HMB), wherein the bed of porous carbon is horizontally traversed through the hot zone. Silicon-Carbon Composite Sample 4, Silicon-Carbon Composite Sample 5, Silicon-Carbon Composite Sample 7, and Silicon-Carbon Composite Sample 8 were produced employing the HMB configuration, and all other Silicon-Carbon Composite Samples listed in Table 8 were produced employing the SB configuration. Other reactor types are envisioned. In other embodiments, the CVI reactor type can be varied, for example the CVI reactor can be a vibro-thermal assisted CVI (VTA-CVI) reactor. In other embodiments, the CVI reactor type can be a convection-thermal assisted CVI (CTA-CVI) reactor. In other embodiments, the CVI reactor type can be a rotating CVI kiln. In other embodiments, the CVI reactor type can be a fluidized bed CVI (FB-CVI) reactor. In the current Example, the CVI process was carried out as a batch process with a of between 1 and 6 hours. In other embodiments, the CVI process can be run as a semi-batch process. In certain other embodiments, the CVI process can be run as a continuous process.

TABLE 8

CVI Process data for producing various silicon-carbon materials.

| Silicon-Carbon Composite # | CVI Temp (° C.) | Conc. Silane (%) | Diluent Gas | Carbon Scaffold Bed Loading (g/cm2) | $Y_{CVI}$ ((mol silicon/h)/ mol carbon scafold) | $X_{Si}$ (%) |
|---|---|---|---|---|---|---|
| 1 | 450 | 10 | H2 | 0.0081 | 2.90 | 10 |
| 2 | 450 | 30 | H2 | 0.0156 | 16.83 | 8.5 |
| 3 | 450 | 40 | H2 | 0.0158 | 22.74 | 7.5 |
| 4 | 525 | 1.25 | N2 | 0.0078 | 0.37 | 64 |
| 5 | 525 | 1.25 | N2 | 0.0078 | 0.37 | 63 |
| 6 | 450 | 1.25 | N2 | 0.0077 | 1.07 | 43 |
| 7 | 525 | 1.25 | N2 | 0.0078 | 0.37 | 66 |
| 8 | 525 | 1.25 | N2 | 0.0078 | 0.37 | 65 |
| 9 | 450 | 10 | N2 | 0.0079 | 2.83 | 10 |
| 10 | 450 | 1.25 | N2 | 0.0039 | 2.11 | 25 |
| 11 | 450 | 1.25 | N2 | 0.0056 | 1.48 | 35 |
| 12 | 450 | 1.25 | N2 | 0.0039 | 2.11 | 22 |
| 13 | 450 | 1.25 | N2 | 0.0078 | 1.07 | 37 |
| 14 | 450 | 1.25 | N2 | 0.0039 | 2.14 | 17 |
| 15 | 450 | 1.25 | N2 | 0.0059 | 1.41 | 22 |
| 16 | 450 | 1.25 | N2 | 0.0039 | 2.14 | 18 |
| 17 | 430 | 40 | H2 | 0.1684 | 0.28 | 64.7 |
| 18 | 430 | 40 | H2 | 0.1688 | 0.28 | 66.4 |
| 19 | 430 | 40 | H2 | 0.1769 | 0.27 | 69.9 |
| 20 | 400 | 100 | None | 0.5434 | 0.27 | 59.8 |
| 21 | 420 | 100 | None | 0.3026 | 0.12 | 85.2 |
| 22 | 420 | 100 | None | 0.168 | 0.28 | 88.9 |
| 23 | 420 | 100 | None | 0.164 | 0.28 | 91.4 |
| 24 | 375 | Varied* | N2 | 0.375 | 0.11 | 73.7 |

*For this sample, the silane flow rate was varied, therefore, in this case $Y_{CVI}$ is calculated as the overall mol silane per hour, i.e., calculated as the total mol of silane delivered to the CVI reactor divided by the total CVI reaction time.

As presented in Table 8, for samples produced per this example, the CVI temperature was varied from 400° C. to 525° C. Other temperature ranges can be employed for the CVI process, for example from 350° C. to 550° C., for example from 350° C. to 500° C., for example from 350° C. to 450° C., for example from 375° C. to 450° C., for example from 380° C. to 450° C., for example from 385° C. to 450° C., for example from 390° C. to 450° C.

Also presented in Table 8, for samples produced per this example, the silicon-containing precursor gas was silane, and the concentration of silane as the mass fraction of the total gas composition was varied from 1.25% to 100%. For samples where the silane gas was mixed with a diluent gas, the diluent gas was varied, either hydrogen (H2) or nitrogen (N2). Other diluent gases are envisioned, for example argon.

The CVI process may be carried out where in the gas introduced into the CVI reactor comprises 100% silane. Alternatively, gas introduced into the CVI reactor comprises less than 100% silane, and also comprises a diluent gas comprising hydrogen, nitrogen, argon, or combinations thereof.

Also presented in Table 8, for samples produced per this example, the areal loading of the starting carbon scaffold material within the bed was varied, from 0.0039 g/cm2 to 0.5434 g/cm2. In other envisioned embodiments, the areal loading of the carbon scaffold material within the bed can be varied, for example from 0.001 g/cm2 to 10 g/cm2. In other embodiments, the areal loading of the carbon scaffold material within the bed can be varied, for example from 1 g/cm2 to 5 g/cm2. In other envisioned embodiments, the areal loading of the carbon scaffold material within the bed can be varied, for example from 5 g/cm2 to 10 g/cm2. In other envisioned embodiments, the areal loading of the carbon scaffold material within the bed can be greater 10 g/cm2.

Alternatively, the areal loading of the starting carbon scaffold material within the bed can vary from 0.0001 to 1 g/cm2. For example, the areal loading of the starting carbon scaffold material within the bed can vary from 0.001 to g/cm2 to 1 g/cm2, or from 0.002 to g/cm2 to 1 g/cm2, or from 0.003 to g/cm2 to 1 g/cm2, or from 0.004 to g/cm2 to 1 g/cm2, or from 0.005 to g/cm2 to 1 g/cm2. In some embodiments, the areal loading of the starting carbon scaffold material within the bed can vary from 0.001 g/cm2 to 1 g/cm2.

Also presented in Table 8, for samples produced per this example, the silane flow rate into the CVI reactor can be normalized to the carbon scaffold. Thusly, the carbon scaffold normalized silane flow rate can vary. Since one mol of silane gas comprise one mol of silicon, it can also be described that the carbon scaffold normalized silicon flow rate can be varied. This process parameter can be expressed as:

$$Y_{CVI} = \frac{\text{mol silicon introduced into the } CVI \text{ reactor per hour}}{\text{mol carbon scaffold in the } CVI \text{ reactor}}$$

In the current example, since the silicon containing gas employed for the CVI process is silane, and each mol of silane comprises one mol of silicon, the above equation can be alternatively expressed as:

$$Y_{CVI} = \frac{\text{mol silane per hour}}{\text{mol carbon scaffold in the } CVI \text{ reactor}}$$

A surprising and unexpected result relates to the utilization of the the silane gas during CVI processing to prepare the silicon-carbon composite. This utilization as a percentage can be defined as:

$$X_{Si} = 100 \times \frac{\text{mol silicon in the silicon} - \text{carbon composite}}{\text{mol silicon feedstock}}$$

Wherein the mol silicon in the silicon-carbon composite is determined after CVI processing is completed and from the % silicon in the silicon-carbon composite as determined by TGA. Also for this determination, the mole silicon feedstock is the total mol of silicon introduced into the CVI reactor in for form of silicon containing gas for the duration of CVI processing to convert the porous carbon scaffold and the silicon containing gas into the silicon-carbon composite. For the embodiment wherein the silicon containing gas is silane, there is 1 mol silicon per mol silane thus:

$$X_{Si} = 100 \times \frac{\text{mol silicon in the silicon} - \text{carbon composite}}{\text{mol silane feedstock}}$$

In certain embodiments, the silane flow rate is kept constant for the duration of the CVI reaction. In this case, the mol silane per hour used to calculate $Y_{CVI}$ is the molar silane flow rate in the units of mol/h. In some embodiments, silane flow is varied, for example in a stepwise fashion, and/or as a ramp. In some embodiments, the silane flow rate at the beginning and end of the CVI reaction duration are lower. In a case where the flow rate has been varied, $Y_{CVI}$ is calculated as the overall mol silane per hour, for instance is calculated as the total mol of silane delivered to the CVI reactor divided by the total CVI reaction time.

The data for $X_{Si}$ are included in Table 8. As can be seen, $X_{Si}$ increases dramatically as $Y_{CVI}$ decreases (see FIG. 7). In some embodiments for employing CVI to produce the silicon-carbon composite, $Y_{CVI}$<1 and $X_{Si}$>50%. In a preferred embodiment for employing CVI to produce the silicon-carbon composite, $Y_{CVI}$<0.5 and $X_{Si}$>50%. In a further preferred embodiment for employing CVI to produce the silicon-carbon composite, $Y_{CVI}$<0.4 and $X_{Si}$>60%. In a further preferred embodiment for employing CVI to produce the silicon carbon composite, $Y_{CVI}$<0.3 and $X_{Si}$>70%. In a further preferred embodiment for employing CVI to produce the silicon carbon composite, $Y_{CVI}$<0.2 and $X_{Si}$>70%. In a further preferred embodiment for employing CVI to produce the silicon carbon composite, $Y_{CVI}$<0.3 and $X_{Si}$>80%. In a further preferred embodiment for employing CVI to produce the silicon carbon composite, $Y_{CVI}$<0.2 and $X_{Si}$>80%. In a further preferred embodiment for employing CVI to produce the silicon carbon composite, $Y_{CVI}$<0.3 and $X_{Si}$>85%. In a further preferred embodiment for employing CVI to produce the silicon carbon composite, $Y_{CVI}$<0.2 and $X_{Si}$>85%. In a further preferred embodiment for employing CVI to produce the silicon carbon composite, $Y_{CVI}$<0.3 and $X_{Si}$>90%. In a further preferred embodiment for employing CVI to produce the silicon carbon composite, $Y_{CVI}$<0.2 and $X_{Si}$>90%. In a further preferred embodiment for employing CVI to produce the silicon carbon composite, $Y_{CVI}$<0.3 and $X_{Si}$>95%. In a further preferred embodiment for employing CVI to produce the silicon carbon composite, $Y_{CVI}$<0.2 and $X_{Si}$>95%. In a further preferred embodiment for employing CVI to produce the silicon carbon composite, $Y_{CVI}$<0.2 and $X_{Si}$>99%. In a further preferred embodiment for employing CVI to produce the silicon carbon composite, $Y_{CVI}$<0.1 and $X_{Si}$>90%. In a further preferred embodiment for employing CVI to produce the silicon carbon composite, $Y_{CVI}$<0.1 and $X_{Si}$>95%. In a further preferred embodiment for employing CVI to produce the silicon carbon composite, $Y_{CVI}$<0.1 and $X_{Si}$>99%. In a further preferred embodiment for employing CVI to produce the silicon carbon composite, $Y_{CVI}$<0.05 and $X_{Si}$>90%. In a further preferred embodiment for employing CVI to produce the silicon carbon composite, $Y_{CVI}$<0.05 and $X_{Si}$>95%. In a further preferred embodiment for employing CVI to produce the silicon carbon composite, $Y_{CVI}$<0.05 and $X_{Si}$>99%. In a further preferred embodiment for employing CVI to produce the silicon carbon composite, $Y_{CVI}$<0.01 and $X_{Si}$>90%. In a further preferred embodiment for employing CVI to produce the silicon carbon composite, $Y_{CVI}$<0.01 and $X_{Si}$>95%. In a further preferred embodiment for employing CVI to produce the silicon carbon composite, $Y_{CVI}$<0.01 and $X_{Si}$>99%.

Example 6. In-line process monitoring of silane utilization during CVI processing as determined from Fourier-transformed infrared (FTIR) spectroscopy. Fourier-transformed infrared (FTIR) spectroscopy is a suitable method for quantitation of concentration of gas in the gas phase for silane gas. To this end, for the preparation of Silicon-Carbon Composite 21, the gas exiting the reactor was routed into a gas tight FTIR cell within the FTIR spectrophotometer. The % silane concentration exiting the reactor, i.e., concentration of silane exiting the reactor as a percentage of the silane concentration entering the reactor, was quantitated by determining the peak height at 979 cm−1 in the FTIR spectrum for the gas exiting the reactor, and dividing that value by the peak height at 979 cm−1 in the FTIR spectrum for the control, namely unreacted silane gas, and multiplying said value by 100 to convert into percentage. The % silane utilization was then calculated as 100 minus the % silane concentration exiting the reactor. FIG. 8 depicts the in-line process data for % silane utilization as a function of time for preparation of Sample 21. As can be seen, the peak utilization is 98%. Without being bound by theory, based on the analysis from the previous example, the silane flow rate during the initial and final CVI reaction phases can be modulated, i.e., reduced, in order to increase the silane utilization during these phases. In this fashion, $X_{Si}$ can be further increased, for example $X_{Si}$ greater than 85%, or $X_{Si}$ greater than 90%, or $X_{Si}$ greater than 95%, or $X_{Si}$ greater than or equal to 98%. Without being bound by theory, these data also demonstrate the feasibility of conducting the CVI processing in a continuous reactor wherein it is possible to achieve $X_{Si}$ greater than or equal to 98%.

Example 7. CVI Processes Comprising Recycle or Recycle with Purge Stream. The process to create the silicon-carbon composite particles may comprise a recycle stream. Accordingly, the gas exiting the CVI reactor may contain unreacted silane gas, hydrogen gas (created as a result of consumed silane), and diluent gas (if employed) and this gas stream may be re-introduced as one or more feed streams back into the CVI reactor. In certain embodiments, the CVI reactor comprises multiple zones, and the silane recycle stream can be fed as one or more feed streams into one or more zones of the CVI reactor. In certain embodiments, the recycle stream comprises a purge stream. Accordingly, any hydrogen or diluent gas present in the recycle stream can be separated from the silane present in the recycle stream, for example, by gas separation techniques such as distillation or membrane gas separation. Employing such a recycle stream or recycle stream with puring can further increase net silane tilization, resulting in $X_{Si}$ greater than 50%, for example greater than 60%, for example greater than 70%, for example greater than 85%, for example greater than 90%, for example greater than 95%, for example greater than 98%, for example greater than 99%,

EXPRESSED EMBODIMENTS

Embodiment 1

A process for preparing silicon-carbon composite particles comprising:
  a. providing a carbon scaffold comprising a pore volume, wherein the pore volume comprises greater than 70% microporosity;
  b. heating the porous carbon scaffold to a temperature between 350° C. and 550° C.;
  c. providing silane gas corresponding to $Y_{CVI}$ less than 0.5 wherein $Y_{CVI}$=(mole of silane per hour)/(mol of carbon scaffold); and
  d. wherein $X_{Si}$ of the process is greater than 50%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 2

A process for preparing silicon-carbon composite particles comprising:
  a. providing a carbon scaffold comprising a pore volume, wherein the pore volume comprises greater than 70% microporosity;
  b. heating the porous carbon scaffold to a temperature between 350° C. and 550° C.;
  c. providing silane gas corresponding to $Y_{CVI}$ less than 0.5 wherein $Y_{CVI}$=(mole of silane per hour)/(mol of carbon scaffold);
  d. wherein $X_{Si}$ of the process is greater than 50%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
  e. wherein the silicon-carbon composite comprises:
    i. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 3

A process for preparing silicon-carbon composite particles comprising:
  a. providing a carbon scaffold comprising a pore volume, wherein the pore volume comprises greater than 70% microporosity;
  b. heating the porous carbon scaffold to a temperature between 350° C. and 550° C.;
  c. providing silane gas corresponding to $Y_{CVI}$ less than 0.5 wherein $Y_{CVI}$=(mole of silane per hour)/(mol of carbon scaffold);
  d. wherein $X_{Si}$ of the process is greater than 50%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
  e. wherein the silicon-carbon composite comprises:
    i. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 4

A process for preparing silicon-carbon composite particles comprising:
  a. providing a carbon scaffold comprising a pore volume, wherein the pore volume comprises greater than 70% microporosity;
  b. heating the porous carbon scaffold to a temperature between 350° C. and 550° C.;
  c. providing silane gas corresponding to $Y_{CVI}$ less than 0.5 wherein $Y_{CVI}$=(mole of silane per hour)/(mol of carbon scaffold);
  d. wherein $X_{Si}$ of the process is greater than 50%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
  e. wherein the silicon-carbon composite comprises:
    i. a silicon content of 30% to 60% by weight;
    ii. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis;
    iii. a surface area less than 30 m²/g; and
    iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 5

A process for preparing silicon-carbon composite particles comprising:
  a. providing a carbon scaffold comprising a pore volume, wherein the pore volume comprises greater than 70% microporosity;
  b. heating the porous carbon scaffold to a temperature between 350° C. and 550° C.;
  c. providing silane gas corresponding to $Y_{CVI}$ less than 0.4 wherein $Y_{CVI}$=(mole of silane per hour)/(mol of carbon scaffold); and
  d. wherein $X_{Si}$ of the process is greater than 60%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 6

A process for preparing silicon-carbon composite particles comprising:
  a. providing a carbon scaffold comprising a pore volume, wherein the pore volume comprises greater than 70% microporosity;
  b. heating the porous carbon scaffold to a temperature between 350° C. and 550° C.;
  c. providing silane gas corresponding to $Y_{CVI}$ less than 0.4 wherein $Y_{CVI}$=(mole of silane per hour)/(mol of carbon scaffold);
  d. wherein $X_{Si}$ of the process is greater than 60%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
  e. wherein the silicon-carbon composite comprises:
    i. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 7

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.4 wherein $Y_{CVI}$=(mole of silane per hour)/(mol of carbon scaffold);
d. wherein $X_{Si}$ of the process is greater than 60%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
e. wherein the silicon-carbon composite comprises:
  i. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 8

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.4 wherein $Y_{CVI}$=(mole of silane per hour)/(mol of carbon scaffold);
d. wherein $X_{Si}$ of the process is greater than 60%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
e. wherein the silicon-carbon composite comprises:
  i. a silicon content of 30% to 60% by weight;
  ii. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis;
  iii. a surface area less than 30 m²/g; and
  iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 9

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.2 wherein $Y_{CVI}$=(mole of silane per hour)/(mol of carbon scaffold); and
d. wherein $X_{Si}$ of the process is greater than 70%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 10

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.2 wherein $Y_{CVI}$=(mole of silane per hour)/(mol of carbon scaffold);
d. wherein $X_{Si}$ of the process is greater than 70%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
e. wherein the silicon-carbon composite comprises:
  i. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 11

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.2 wherein $Y_{CVI}$=(mole of silane per hour)/(mol of carbon scaffold);
d. wherein $X_{Si}$ of the process is greater than 70%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
e. wherein the silicon-carbon composite comprises:
  i. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 12

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.2 wherein $Y_{CVI}$=(mole of silane per hour)/(mol of carbon scaffold);
d. wherein $X_{Si}$ of the process is greater than 70%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
e. wherein the silicon-carbon composite comprises:
  i. a silicon content of 30% to 60% by weight;
  ii. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis;
  iii. a surface area less than 30 m²/g; and
  iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 13

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.2 wherein $Y_{CVI}$=(mole of silane per hour)/(mol of carbon scaffold); and
d. wherein $X_{Si}$ of the process is greater than 85%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 14

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.2 wherein $Y_{CVI}$=(mole of silane per hour)/(mol of carbon scaffold);
d. wherein $X_{Si}$ of the process is greater than 85%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
e. wherein the silicon-carbon composite comprises:
  i. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 15

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.2 wherein $Y_{CVI}$=(mole of silane per hour)/(mol of carbon scaffold);
d. wherein $X_{Si}$ of the process is greater than 85%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
e. wherein the silicon-carbon composite comprises:
  i. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 16

A process for preparing silicon-carbon composite particles comprising:
a. providing a carbon scaffold comprising a pore volume, wherein the pore volume comprises greater than 70% microporosity;
b. heating the porous carbon scaffold to a temperature between 350° C. and 550° C.;
c. providing silane gas corresponding to $Y_{CVI}$ less than 0.2 wherein $Y_{CVI}$=(mole of silane per hour)/(mol of carbon scaffold);
d. wherein $X_{Si}$ of the process is greater than 85%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
e. wherein the silicon-carbon composite comprises:
  i. a silicon content of 30% to 60% by weight;
  ii. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis;

iii. a surface area less than 30 m²/g; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 17

A process for preparing silicon-carbon composite particles comprising:

a. providing a carbon scaffold comprising a pore volume, wherein the pore volume comprises greater than 70% microporosity;

b. heating the porous carbon scaffold to a temperature between 350° C. and 550° C.;

c. providing silane gas corresponding to $Y_{CVI}$ less than 0.2 wherein $Y_{CVI}$=(mole of silane per hour)/(mol of carbon scaffold); and d. wherein $X_{Si}$ of the process is greater than 90%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 18

A process for preparing silicon-carbon composite particles comprising:

a. providing a carbon scaffold comprising a pore volume, wherein the pore volume comprises greater than 70% microporosity;

b. heating the porous carbon scaffold to a temperature between 350° C. and 550° C.;

c. providing silane gas corresponding to $Y_{CVI}$ less than 0.2 wherein $Y_{CVI}$=(mole of silane per hour)/(mol of carbon scaffold);

d. wherein $X_{Si}$ of the process is greater than 90%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and e. wherein the silicon-carbon composite comprises:

i. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 19

A process for preparing silicon-carbon composite particles comprising:

a. providing a carbon scaffold comprising a pore volume, wherein the pore volume comprises greater than 70% microporosity;

b. heating the porous carbon scaffold to a temperature between 350° C. and 550° C.;

c. providing silane gas corresponding to $Y_{CVI}$ less than 0.2 wherein $Y_{CVI}$=(mole of silane per hour)/(mol of carbon scaffold);

d. wherein $X_{Si}$ of the process is greater than 90%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and e. wherein the silicon-carbon composite comprises:

i. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 20

A process for preparing silicon-carbon composite particles comprising:

a. providing a carbon scaffold comprising a pore volume, wherein the pore volume comprises greater than 70% microporosity;

b. heating the porous carbon scaffold to a temperature between 350° C. and 550° C.;

c. providing silane gas corresponding to $Y_{CVI}$ less than 0.2 wherein $Y_{CVI}$=(mole of silane per hour)/(mol of carbon scaffold);

d. wherein $X_{Si}$ of the process is greater than 90%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and e. wherein the silicon-carbon composite comprises:

i. a silicon content of 30% to 60% by weight;

ii. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis;

iii. a surface area less than 30 m²/g; and iv. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 21

The process for preparing silicon-carbon composite particles of any of Embodiments 1 through Embodiment 20 wherein the pore volume comprises greater than 80% microporosity.

Embodiment 22

The process for preparing silicon-carbon composite particles of any of Embodiments 1 through Embodiment 21 wherein the pore volume comprises greater than 90% microporosity.

Embodiment 23

The process for preparing silicon-carbon composite particles of any of Embodiments 1 through Embodiment 22 wherein the pore volume comprises greater than 95% microporosity.

Embodiment 24

The process for preparing silicon-carbon composite particles of any of Embodiments 1 through Embodiment 23 wherein the temperature is between 400° C. and 525° C.

Embodiment 25

The process for preparing silicon-carbon composite particles of any of Embodiments 1 through Embodiment 24 wherein the silicon-carbon composite comprises a silicon content of 40-60%.

Embodiment 26

The process for preparing silicon-carbon composite particles of any of Embodiments 1 through Embodiment 25 wherein the silicon-carbon composite comprises a Z less than 5.

Embodiment 27

The process for preparing silicon-carbon composite particles of any of Embodiments 1 through Embodiment 26 wherein the silicon-carbon composite comprises a surface area less than 10 $m^2/g$.

Embodiment 28

The process for preparing silicon-carbon composite particles of any of Embodiments 1 through Embodiment 27 wherein the silicon-carbon composite comprises a φ of greater than or equal to 0.2, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 29

The process for preparing silicon-carbon composite particles of any of Embodiments 1 through Embodiment 28 wherein the silicon-carbon composite comprises a φ of greater than or equal to 0.3, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 30

The process for preparing silicon-carbon composite particles of any of the embodiments from Embodiment 1 through Embodiment 29 wherein the silicon-carbon composite comprises a Dv50 between 5 nm and 20 microns.

Embodiment 31

The process for preparing silicon-carbon composite particles of any of the embodiments from Embodiment 1 through Embodiment 30 wherein the silicon-carbon composite comprises a capacity of greater than 900 mA/g.

Embodiment 32

The process for preparing silicon-carbon composite particles of any of the embodiments from Embodiment 1 through Embodiment 31 wherein the silicon-carbon composite comprises a capacity of greater than 1300 mA/g.

Embodiment 33

The process for preparing silicon-carbon composite particles of any of the embodiments from Embodiment 1 through Embodiment 32 wherein the silicon-carbon composite comprises a capacity of greater than 1600 mA/g.

Embodiment 34

The process for preparing silicon-carbon composite particles of any of the embodiments from Embodiment 1 through Embodiment 33 wherein the process is a batch process.

Embodiment 35

The process for preparing silicon-carbon composite particles of any of the embodiments from Embodiment 1 through Embodiment 34 wherein the process is a continuous process.

Embodiment 36

The process for preparing silicon-carbon composite particles of any of the embodiments from Embodiment 1 through Embodiment 35 wherein the reactor type is a static bed reactor, a horizontally moving bed reactor, a vibro-thermal assisted reactor, a convection-thermal assisted reactor, or a fluidized bed reactor.

Embodiment 37

The process for preparing silicon-carbon composite particles of any of the embodiments from Embodiment 1 through Embodiment 36 wherein the concentration of silane as the mass fraction of the total gas composition is 1.25% to 100%.

Embodiment 38

The process for preparing silicon-carbon composite particles of any of the embodiments from Embodiment 1 through Embodiment 36 wherein the gas comprises silane and an inert gas selected from nitrogen, hydrogen, argon, or helium, or combinations thereof.

Embodiment 39

The process for preparing silicon-carbon composite particles of any of the embodiments from Embodiment 1 through Embodiment 38 wherein the areal loading of carbon scaffold is 0.001 g/cm2 to 10 g/cm2.

Embodiment 40

An energy storage device comprising a silicon-carbon composite prepared as described by any of Embodiments 1 to Embodiment 39.

Embodiment 41

A lithium ion battery comprising a silicon-carbon composite prepared by any of the embodiments from Embodiment 1 to Embodiment 39.

Embodiment 42

A process for preparing silicon-carbon composite particles comprising:
a. providing a carbon scaffold comprising a pore volume, wherein the pore volume comprises one or more micropores and one or more mesopores;
b. heating the porous carbon scaffold in the presence of silane gas to a temperature between 350° C. and 550° C.; and
c. wherein $X_{Si}$ of the process is greater than 50%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 43

A process for preparing silicon-carbon composite particles comprising:
a. providing a carbon scaffold comprising a pore volume, wherein the pore volume comprises one or more micropores and one or more mesopores;
b. heating the porous carbon scaffold in the presence of silane gas to a temperature between 350° C. and 550° C.;
c. wherein $X_{Si}$ of the process is greater than 50%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
d. wherein the silicon-carbon composite comprises:
  ii. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis.

Embodiment 44

A process for preparing silicon-carbon composite particles comprising:
a. providing a carbon scaffold comprising a pore volume, wherein the pore volume comprises one or more micropores and one or more mesopores;
b. heating the porous carbon scaffold in the presence of silane gas to a temperature between 350° C. and 550° C.;
c. wherein $X_{Si}$ of the process is greater than 50%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
d. wherein the silicon-carbon composite comprises:
  ii. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 45

A process for preparing silicon-carbon composite particles comprising:
a. providing a carbon scaffold comprising a pore volume, wherein the pore volume comprises one or more micropores and one or more mesopores;
b. heating the porous carbon scaffold in the present of silane gas to a temperature between 350° C. and 550° C.;
c. wherein $X_{Si}$ of the process is greater than 50%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis; and
d. wherein the silicon-carbon composite comprises:
  v. a silicon content of 30% to 70% by weight;
  vi. a Z of less than 10, wherein Z=1.875×[(M1100−M)/M1100]×100%, wherein M1100 is a mass of the silicon-carbon composite at 1100° C. and M is the minimum mass of the silicon-carbon composite between 800° C. and 1100° C. when the silicon-carbon composite is heated under air from about 25° C. to about 1100° C., as determined by thermogravimetric analysis;
  vii. a surface area less than 30 m²/g; and
  viii. a φ of greater than or equal to 0.1, wherein φ=(Max peak height dQ/dV in Regime I)/(Max peak height dQ/dV in Regime III), wherein dQ/dV is measured in a half-cell coin cell, and Regime I is 0.8V-0.4V and Regime III is 0.15V-0V.

Embodiment 46

The process for preparing silicon-carbon composite particles of Embodiment 42 wherein the $X_{Si}$ is greater than 60%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 47

The process for preparing silicon-carbon composite particles of Embodiment 43 wherein the $X_{Si}$ is greater than 60%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 48

The process for preparing silicon-carbon composite particles of Embodiment 44 wherein the $X_{Si}$ is greater than 60%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 49

The process for preparing silicon-carbon composite particles of Embodiment 45 wherein the $X_{Si}$ is greater than 60%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 50

The process for preparing silicon-carbon composite particles of Embodiment 42 wherein the $X_{Si}$ is greater than 70%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 51

The process for preparing silicon-carbon composite particles of Embodiment 43 wherein the $X_{Si}$ is greater than 70%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 52

The process for preparing silicon-carbon composite particles of Embodiment 44 wherein the $X_{Si}$ is greater than 70%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 53

The process for preparing silicon-carbon composite particles of Embodiment 45 wherein the $X_{Si}$ is greater than 70%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 54

The process for preparing silicon-carbon composite particles of Embodiment 42 wherein the $X_{Si}$ is greater than 85%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 55

The process for preparing silicon-carbon composite particles of Embodiment 43 wherein the $X_{Si}$ is greater than 85%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 56

The process for preparing silicon-carbon composite particles of Embodiment 44 wherein the $X_{Si}$ is greater than 85%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 57

The process for preparing silicon-carbon composite particles of Embodiment 45 wherein the $X_{Si}$ is greater than 85%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 58

The process for preparing silicon-carbon composite particles of Embodiment 42 wherein the $X_{Si}$ is greater than 90%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 59

The process for preparing silicon-carbon composite particles of Embodiment 43 wherein $X_{Si}$ is greater than 90%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 60

The process for preparing silicon-carbon composite particles of Embodiment 44 wherein the $X_{Si}$ is greater than 90%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 61

The process for preparing silicon-carbon composite particles of Embodiment 45 wherein the $X_{Si}$ is greater than 90%, wherein $X_{Si}$=100×(mol of silicon in the silicon-carbon composite)/(mol silane feedstock), wherein the mol silicon in the silicon-carbon composite is determined from the silicon content in the silicon-carbon composite by thermogravimetric analysis.

Embodiment 62

The process for preparing silicon-carbon composite particles of any of the embodiments from Embodiment 1 through Embodiment 61 wherein the silane gas comprises a recycle stream.

Embodiment 63

The process for preparing silicon-carbon composite particles of any of the embodiments from Embodiment 1 through Embodiment 61 wherein the silane gas comprises a recycle stream comprising a purge stream.

Embodiment 64

The process for preparing silicon-carbon composite particles of any of the embodiments from Embodiment 1 through Embodiment 64 where the silicon-carbon composite particles comprise a first cycle efficiency of >75% when measured in a half cell for voltage window of 5 mV to 0.8 V.

Embodiment 65

The process for preparing silicon-carbon composite particles of any of the embodiments from Embodiment 1 through Embodiment 64 where the silicon-carbon composite particles comprise a first cycle efficiency of >80% when measured in a half cell for voltage window of 5 mV to 0.8 V.

Embodiment 66

The process for preparing silicon-carbon composite particles of any of the embodiments from Embodiment 1 through Embodiment 64 where the silicon-carbon composite particles comprise a first cycle efficiency of >85% when measured in a half cell for voltage window of 5 mV to 1.5 V.

Embodiment 67

The process for preparing silicon-carbon composite particles of any of the embodiments from Embodiment 1 through Embodiment 64 where the silicon-carbon composite particles comprise a first cycle efficiency of >90% when measured in a half cell for voltage window of 5 mV to 1.5 V.

Embodiment 68

The process for preparing silicon-carbon composite particles of any of the embodiments from Embodiment 1 through Embodiment 64 where the silicon-carbon composite particles comprise a first cycle efficiency of >91% when measured in a half cell for voltage window of 5 mV to 1.5 V.

Embodiment 69

The process for preparing silicon-carbon composite particles of any of the embodiments from Embodiment 1 through Embodiment 64 where the silicon-carbon composite particles comprise a first cycle efficiency of >92% when measured in a half cell for voltage window of 5 mV to 1.5 V.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A process for preparing silicon-carbon composite particles comprising:
    a. providing a carbon scaffold comprising a pore volume, wherein the pore volume comprises greater than 70% microporosity;
    b. heating the porous carbon scaffold to a temperature from 300° C. to 500° C.;
    c. contacting the carbon scaffold with a silane feedstock gas corresponding to a $Y_{CVI}$ less than 0.5 wherein $Y_{CVI}$=(mol of silane feedstock gas per hour)/(mol of carbon scaffold); and
    d. wherein $X_{Si}$ of the process is greater than 50%, wherein $X_{Si}$=100×(mol of silicon in the silicon-carbon composite)/(mol silane feedstock gas), wherein the mol silicon in the silicon-carbon composite is determined from the silicon content in the silicon-carbon composite by thermogravimetric analysis.

2. The process for preparing silicon-carbon composite particles of claim 1, wherein the pore volume comprises greater than 90% microporosity.

3. The process for preparing silicon-carbon composite particles of claim 1, wherein the silicon-carbon composite particles comprise a surface area less than 10 $m^2/g$.

4. The process for preparing silicon-carbon composite particles of claim 1, wherein the silicon-carbon composite particles comprise a Dv50 ranging from 5 nm to 20 microns.

5. The process for preparing silicon-carbon composite particles of claim 1, wherein the feedstock gas comprises silane and an inert gas selected from nitrogen, hydrogen, argon, and helium, and combinations thereof.

6. The process for preparing silicon-carbon composite particles of claim 1, wherein the concentration of silane as the mass fraction of the total feedstock gas composition is 1.25% to 100%.

7. The process for preparing silicon-carbon composite particles of claim 1, wherein the process is a batch process.

8. The process for preparing silicon-carbon composite particles of claim 1, wherein the process is a continuous process.

9. The process for preparing silicon-carbon composite particles of claim 1, wherein the process is conducted in a fluidized bed reactor.

10. The process for preparing silicon-carbon composite particles of claim 1, wherein the porous carbon scaffold comprises a span (Dv50)/(Dv90-Dv10) from 100 to less than 1.

11. The process for preparing silicon-carbon composite particles of claim 1, wherein the silane gas comprises a recycle stream.

12. The process for preparing silicon-carbon composite particles of claim 11, wherein the recycle stream comprises a purge stream.

13. The process for preparing silicon-carbon composite particles of claim 1, wherein the flow rate of the silane feedstock gas is varied and $Y_{CVI}$ is less than 0.5 wherein $Y_{CVI}$=(overall mol of silane feedstock gas per hour)/(mol of carbon scaffold).

14. A process for preparing silicon-carbon composite particles comprising:
   a. providing a carbon scaffold comprising a pore volume, wherein the pore volume comprises greater than 70% microporosity;
   b. heating the porous carbon scaffold to a temperature from 350° C. to 550° C.;
   c. contacting the carbon scaffold with a silane feedstock gas corresponding to a $Y_{CVI}$ less than 0.5 wherein $Y_{CVI}$=(mole of silane feedstock gas per hour)/(mol of carbon scaffold);
   d. wherein $X_{Si}$ of the process is greater than 60%, wherein $X_{Si}$=100×(mol of silicon in the silicon-carbon composite)/(mol silane feedstock gas), wherein the mol silicon in the silicon-carbon composite is determined from the silicon content in the silicon-carbon composite by thermogravimetric analysis; and
   e. wherein the silane gas comprises a recycle stream.

15. The process for preparing silicon-carbon composite particles of claim 14, wherein the pore volume comprises greater than 90% microporosity.

16. The process for preparing silicon-carbon composite particles of claim 14, wherein the silicon-carbon composite particles comprise a surface area less than 10 m²/g.

17. The process for preparing silicon-carbon composite particles of claim 14, wherein the silicon-carbon composite particles comprise a Dv50 ranging from 5 nm to 20 microns.

18. The process for preparing silicon-carbon composite particles of claim 14, wherein the feedstock gas comprises silane and an inert gas selected from nitrogen, hydrogen, argon, and helium, and combinations thereof.

19. The process for preparing silicon-carbon composite particles of claim 14, wherein the concentration of silane as a mass fraction of the total feedstock gas composition is 1.25% to 100%.

20. The process for preparing silicon-carbon composite particles of claim 14, wherein the process is performed in a fluidized bed reactor.

21. The process for preparing silicon-carbon composite particles of claim 14, wherein the porous carbon scaffold comprises a span (Dv50)/(Dv90-Dv10) from 100 to less than 1.

22. The process for preparing silicon-carbon composite particles of claim 14, wherein the recycle stream comprises a purge stream.

23. The process for preparing silicon-carbon composite particles of claim 14, wherein the flow rate of the silane feedstock gas is varied and $Y_{CVI}$ is less than 0.5 wherein $Y_{CVI}$=(overall mol of silane feedstock gas per hour)/(mol of carbon scaffold).

24. A process for preparing silicon-carbon composite particles comprising:
   a. providing a carbon scaffold comprising a pore volume, wherein the pore volume comprises greater than 70% microporosity;
   b. heating the porous carbon scaffold to a temperature from 350° C. to 550° C.;
   c. contacting the carbon scaffold with a silane feedstock gas corresponding to a $Y_{CVI}$ less than 0.3 wherein $Y_{CVI}$=(mole of silane feedstock gas per hour)/(mol of carbon scaffold);
   d. wherein $X_{Si}$ of the process is greater than 70%, wherein $X_{Si}$=100×(mol of silicon in the silicon-carbon composite)/(mol silane feedstock gas), wherein the mol silicon in the silicon-carbon composite is determined from the silicon content in the silicon-carbon composite by thermogravimetric analysis; and
   e. wherein the silane gas comprises a recycle stream.

25. The process for preparing silicon-carbon composite particles of claim 24, wherein the pore volume comprises greater than 90% microporosity.

26. The process for preparing silicon-carbon composite particles of claim 24, wherein the silicon-carbon composite particles comprise a surface area less than 10 m²/g.

27. The process for preparing silicon-carbon composite particles of claim 24, wherein the silicon-carbon composite particles comprise a Dv50 ranging from 5 nm to 20 microns.

28. The process for preparing silicon-carbon composite particles of claim 24, wherein the feedstock gas comprises silane and an inert gas selected from nitrogen, hydrogen, argon, and helium, and combinations thereof.

29. The process for preparing silicon-carbon composite particles of claim 24, wherein the concentration of silane as a mass fraction of the total feedstock gas composition is 1.25% to 100%.

30. The process for preparing silicon-carbon composite particles of claim 24, wherein the process is performed in a fluidized bed reactor.

31. The process for preparing silicon-carbon composite particles of claim 24, wherein the porous carbon scaffold comprises a span (Dv50)/(Dv90-Dv10) from 100 to less than 1.

32. The process for preparing silicon-carbon composite particles of claim 24, wherein the recycle stream comprises a purge stream.

33. The process for preparing silicon-carbon composite particles of claim 24, wherein the flow rate of the silane feedstock gas is varied and $Y_{CVI}$ is less than 0.5 wherein $Y_{CVI}$=(overall mol of silane feedstock gas per hour)/(mol of carbon scaffold).

* * * * *